(12) United States Patent
Chaves et al.

(10) Patent No.: US 8,075,147 B2
(45) Date of Patent: Dec. 13, 2011

(54) OPTICAL DEVICE FOR LED-BASED LAMP

(75) Inventors: Julio Cesar Chaves, Madrid (ES); Juan Carlos Minano, Madrid (ES); Pablo Benitez, Madrid (ES); William A. Parkyn, Jr., Lomita, CA (US); Waqidi Falicoff, Newport Beach, CA (US); Fernando Munoz, Madrid (ES); Yupin Sun, Yorba Linda, CA (US); Oliver Dross, Madrid (ES); Roberto Alvarez, Glendale, CA (US)

(73) Assignee: Light Prescriptions Innovators, LLC, Altadena, CA (US)

( * ) Notice: Subject to any disclaimer, the term of this patent is extended or adjusted under 35 U.S.C. 154(b) by 284 days.

(21) Appl. No.: 12/210,096

(22) Filed: Sep. 12, 2008

(65) Prior Publication Data

US 2009/0067179 A1 Mar. 12, 2009

Related U.S. Application Data

(60) Continuation-in-part of application No. 11/970,462, filed on Jan. 7, 2008, now Pat. No. 7,753,561, which is a division of application No. 10/816,228, filed on Mar. 31, 2004, now Pat. No. 7,329,029, which is a continuation-in-part of application No. 10/814,598, filed on Mar. 30, 2004, now abandoned, said application No. 10/816,228 is a continuation-in-part of application No. 10/461,557, filed on Jun. 12, 2003, now Pat. No. 7,021,797, application No. 12/210,096, which is a continuation-in-part of application No. 11/890,601, filed on Aug. 6, 2007, now Pat. No. 7,755,838, which is a division of application No. 11/115,055, filed on Apr. 25, 2005, now Pat. No. 7,286,296.

(60) Provisional application No. 60/470,691, filed on May 13, 2003, provisional application No. 60/520,951, filed on Nov. 17, 2003, provisional application No. 60/658,713, filed on Mar. 3, 2005, provisional application No. 60/614,565, filed on Sep. 29, 2004, provisional application No. 60/612,558, filed on Sep. 22, 2004, provisional application No. 60/564,847, filed on Apr. 23, 2004, provisional application No. 61/066,528, filed on Feb. 21, 2008, provisional application No. 61/125,844, filed on Apr. 29, 2008.

(51) Int. Cl.
*F21V 9/16* (2006.01)
*F21V 7/04* (2006.01)

(52) U.S. Cl. ........... 362/84; 362/235; 362/293; 362/308

(58) Field of Classification Search .................... 362/84, 362/230, 231, 235, 249.01, 249.02, 268, 362/293, 346, 297, 551, 555, 307, 311.02, 362/355, 249.05, 308; 359/722
See application file for complete search history.

(56) References Cited

U.S. PATENT DOCUMENTS 1,399,973 A 12/1921 Limpert
(Continued)

FOREIGN PATENT DOCUMENTS

EP 0450560 A2 10/1991
(Continued)

OTHER PUBLICATIONS

Winston, Roland et al., "Nonlmaging Optics", Elsevier Academic Press, Burlington, MA, USA, Copyright 2005, 249 pages (part 1).

(Continued)

*Primary Examiner* — Thomas Sember
(74) *Attorney, Agent, or Firm* — Drinker Biddle & Reath LLP

(57) ABSTRACT

An optical device for coupling the luminous output of a light-emitting diode (LED) to a predominantly spherical pattern comprises a transfer section that receives the LED's light within it and an ejector positioned adjacent the transfer section to receive light from the transfer section and spread the light generally spherically. A base of the transfer section is optically aligned and/or coupled to the LED so that the LED's light enters the transfer section. The transfer section can comprises a compound elliptic concentrator operating via total internal reflection. The ejector section can have a variety of shapes, and can have diffusive features on its surface as well, including a phosphor coating. The transfer section can in some implementations be polygonal, V-grooved, faceted and other configurations.

20 Claims, 38 Drawing Sheets

U.S. PATENT DOCUMENTS

| | | | |
|---|---|---|---|
| 1,977,689 A | 10/1934 | Muller | |
| 2,254,961 A | 9/1941 | Harris | |
| 2,362,176 A | 11/1944 | Swanson | |
| 2,908,197 A | 10/1959 | Wells et al. | |
| 3,760,237 A | 9/1973 | Jaffe | |
| 3,774,021 A | 11/1973 | Johnson | |
| 3,938,177 A | 2/1976 | Hansen et al. | |
| 4,188,111 A | 2/1980 | Marvin | |
| 4,192,994 A | 3/1980 | Kastner | |
| 4,211,955 A | 7/1980 | Ray | |
| 4,337,759 A | 7/1982 | Popovich et al. | |
| 4,342,908 A | 8/1982 | Henningsen et al. | |
| 4,384,769 A | 5/1983 | Brei et al. | |
| 4,388,673 A | 6/1983 | Maglica | |
| 4,464,707 A | 8/1984 | Forrest | |
| 4,638,343 A | 1/1987 | Althaus et al. | |
| 4,675,725 A | 6/1987 | Parkyn | |
| 4,698,730 A | 10/1987 | Sakai et al. | |
| 4,709,312 A | 11/1987 | Heinisch et al. | |
| 4,727,289 A | 2/1988 | Uchida | |
| 4,727,457 A | 2/1988 | Thillays | |
| 4,839,781 A | 6/1989 | Barnes et al. | |
| 4,920,404 A | 4/1990 | Shrimali et al. | |
| 5,055,892 A | 10/1991 | Gardner et al. | |
| 5,140,220 A | 8/1992 | Hasegawa | |
| 5,302,778 A | 4/1994 | Maurinus | |
| 5,335,157 A | 8/1994 | Lyons | |
| 5,343,330 A | 8/1994 | Hoffman et al. | |
| 5,404,282 A | 4/1995 | Klinke et al. | |
| 5,404,869 A | 4/1995 | Parkyn, Jr. et al. | |
| 5,438,453 A | 8/1995 | Kuga | |
| 5,438,485 A | 8/1995 | Li et al. | 362/32 |
| 5,444,606 A * | 8/1995 | Barnes et al. | 362/340 |
| 5,452,190 A | 9/1995 | Priesemuth | |
| 5,453,877 A | 9/1995 | Gerbe et al. | |
| 5,471,371 A | 11/1995 | Koppolu et al. | |
| 5,481,445 A | 1/1996 | Sitzema et al. | |
| 5,528,474 A | 6/1996 | Roney et al. | |
| 5,557,471 A | 9/1996 | Fernandez | |
| 5,577,492 A | 11/1996 | Parkyn et al. | |
| 5,580,142 A | 12/1996 | Kurematsu et al. | |
| 5,600,487 A | 2/1997 | Kiyomoto et al. | |
| 5,608,290 A | 3/1997 | Hutchisson et al. | |
| 5,613,769 A | 3/1997 | Parkyn et al. | |
| 5,655,830 A | 8/1997 | Ruskouski | |
| 5,655,832 A | 8/1997 | Pelka et al. | |
| 5,676,453 A | 10/1997 | Parkyn, Jr. et al. | |
| 5,699,186 A | 12/1997 | Richard | |
| 5,757,557 A | 5/1998 | Medvedev | |
| 5,777,433 A | 7/1998 | Lester et al. | |
| 5,806,955 A | 9/1998 | Parkyn, Jr. et al. | |
| 5,813,743 A | 9/1998 | Naka | |
| 5,865,529 A | 2/1999 | Yan | |
| 5,894,195 A | 4/1999 | McDermott | |
| 5,894,196 A | 4/1999 | McDermott | |
| 5,897,201 A | 4/1999 | Simon | |
| 5,898,267 A | 4/1999 | McDermott | |
| 5,898,809 A | 4/1999 | Taboada et al. | |
| 5,924,788 A | 7/1999 | Parkyn | |
| 5,926,320 A | 7/1999 | Parkyn et al. | |
| 5,966,250 A | 10/1999 | Shimizu | |
| 6,019,493 A | 2/2000 | Kuo et al. | |
| 6,030,099 A | 2/2000 | McDermott | |
| 6,044,196 A | 3/2000 | Winston et al. | |
| 6,048,083 A | 4/2000 | McDermott | |
| 6,097,549 A | 8/2000 | Jenkins et al. | |
| 6,139,166 A | 10/2000 | Marshall et al. | |
| 6,155,699 A | 12/2000 | Miller et al. | 362/293 |
| 6,166,860 A | 12/2000 | Medvedev et al. | |
| 6,166,866 A | 12/2000 | Kimura et al. | |
| 6,177,761 B1 | 1/2001 | Pelka et al. | |
| 6,181,476 B1 | 1/2001 | Medvedev | |
| 6,201,229 B1 | 3/2001 | Tawa et al. | |
| 6,222,623 B1 | 4/2001 | Wetherell | |
| 6,252,636 B1 | 6/2001 | Bartlett | |
| 6,268,963 B1 | 7/2001 | Akiyama | |
| 6,273,596 B1 | 8/2001 | Parkyn | |
| 6,282,821 B1 | 9/2001 | Freier | |
| 6,296,376 B1 | 10/2001 | Kondo et al. | |
| 6,301,064 B1 | 10/2001 | Araki et al. | |
| 6,336,734 B1 | 1/2002 | Arumugasaamy | |
| 6,350,041 B1 | 2/2002 | Tarsa et al. | |
| 6,356,700 B1 | 3/2002 | Strobel | |
| 6,361,190 B1 | 3/2002 | McDermott | |
| 6,450,661 B1 | 9/2002 | Okumura | |
| 6,473,554 B1 | 10/2002 | Pelka et al. | |
| 6,483,976 B2 | 11/2002 | Shie et al. | |
| 6,488,392 B1 | 12/2002 | Lu | |
| 6,494,596 B1 | 12/2002 | Burroughs | |
| 6,502,964 B1 | 1/2003 | Simon | |
| 6,504,301 B1 | 1/2003 | Lowery | |
| 6,536,921 B1 | 3/2003 | Simon | |
| 6,536,923 B1 | 3/2003 | Merz | |
| 6,547,400 B1 | 4/2003 | Yokoyama | |
| 6,547,423 B2 | 4/2003 | Marshall et al. | |
| 6,554,455 B2 | 4/2003 | Perlo et al. | |
| 6,560,038 B1 | 5/2003 | Parkyn et al. | |
| 6,576,488 B2 | 6/2003 | Collins, III et al. | 438/29 |
| 6,577,073 B2 * | 6/2003 | Shimizu et al. | 315/246 |
| 6,578,989 B2 | 6/2003 | Osumi et al. | |
| 6,580,228 B1 | 6/2003 | Chen et al. | |
| 6,582,103 B1 | 6/2003 | Popovich et al. | |
| 6,598,998 B2 | 7/2003 | West et al. | |
| 6,603,243 B2 | 8/2003 | Parkyn et al. | |
| 6,607,286 B2 | 8/2003 | West et al. | |
| 6,616,287 B2 | 9/2003 | Sekita et al. | |
| 6,621,222 B1 | 9/2003 | Hong | |
| 6,629,772 B2 | 10/2003 | Brunfeld | 362/582 |
| 6,637,924 B2 | 10/2003 | Pelka et al. | |
| 6,639,733 B2 | 10/2003 | Minano et al. | |
| 6,641,287 B2 | 11/2003 | Suehiro | |
| 6,646,813 B2 | 11/2003 | Falicoff | |
| 6,647,199 B1 | 11/2003 | Pelka et al. | |
| 6,674,096 B2 | 1/2004 | Sommers | |
| 6,679,621 B2 | 1/2004 | West et al. | |
| 6,688,758 B2 | 2/2004 | Thibault | |
| 6,692,136 B2 | 2/2004 | Marshall et al. | |
| 6,729,746 B2 | 5/2004 | Suehiro et al. | |
| 6,755,556 B2 | 6/2004 | Gasquet et al. | |
| 6,769,772 B2 | 8/2004 | Roddy et al. | |
| 6,783,260 B2 | 8/2004 | Machi et al. | 362/259 |
| 6,783,269 B2 | 8/2004 | Pashley | |
| 6,786,619 B2 | 9/2004 | Subisak et al. | |
| 6,786,625 B2 | 9/2004 | Wesson | |
| 6,796,698 B2 | 9/2004 | Sommers et al. | |
| 6,803,607 B1 | 10/2004 | Chan et al. | |
| 6,811,277 B2 | 11/2004 | Amano | |
| 6,830,359 B2 | 12/2004 | Fleury | |
| 6,848,820 B2 | 2/2005 | Natsume | |
| 6,863,402 B2 | 3/2005 | Roddy et al. | |
| 6,882,379 B1 | 4/2005 | Yokoyama et al. | |
| 6,886,962 B2 | 5/2005 | Suehiro | |
| 6,896,381 B2 | 5/2005 | Benitez | |
| 6,924,943 B2 | 8/2005 | Minano et al. | |
| 6,926,435 B2 | 8/2005 | Li | |
| 6,948,836 B2 | 9/2005 | Ishida et al. | |
| 6,953,265 B2 | 10/2005 | Suehiro et al. | |
| 6,988,813 B2 | 1/2006 | Hoelen et al. | |
| 6,997,587 B2 | 2/2006 | Albou | |
| 7,021,797 B2 | 4/2006 | Mlnano | |
| 7,042,655 B2 | 5/2006 | Sun | |
| 7,070,300 B2 | 7/2006 | Harbers et al. | 362/231 |
| 7,144,121 B2 | 12/2006 | Minano | |
| 7,152,985 B2 | 12/2006 | Benitez | |
| 7,160,002 B2 | 1/2007 | Simon | |
| 7,181,378 B2 | 2/2007 | Benitez | |
| 7,192,173 B2 | 3/2007 | Vaughnn | |
| 7,286,296 B2 | 10/2007 | Chaves et al. | 359/641 |
| 7,445,340 B2 | 11/2008 | Conner et al. | 353/20 |
| 2002/0034012 A1 | 3/2002 | Santoro et al. | |
| 2002/0080623 A1 | 6/2002 | Pashley | |
| 2002/0185651 A1 | 12/2002 | Sommers | |
| 2003/0076034 A1 | 4/2003 | Marshall | |
| 2004/0080947 A1 | 4/2004 | Subisak et al. | |
| 2004/0105171 A1 | 6/2004 | Minano | |
| 2004/0125614 A1 | 7/2004 | Ishida et al. | |
| 2004/0130907 A1 | 7/2004 | Albou | |

| | | | |
|---|---|---|---|
| 2004/0190304 | A1 | 9/2004 | Sugimoto et al. |
| 2004/0228131 | A1 | 11/2004 | Minano et al. |
| 2005/0024744 | A1 | 2/2005 | Falicoff |
| 2005/0086032 | A1 | 4/2005 | Benitez et al. |
| 2005/0088758 | A1 | 4/2005 | Minano et al. |
| 2005/0117172 | A1 | 6/2005 | Plamann et al. |
| 2005/0129358 | A1 | 6/2005 | Minano et al. |
| 2005/0135095 | A1 | 6/2005 | Geissler |
| 2005/0169002 | A1 | 8/2005 | Steen et al. |
| 2005/0200812 | A1 | 9/2005 | Sakata et al. |
| 2005/0219464 | A1 | 10/2005 | Yamasaki et al. |
| 2005/0225988 | A1 | 10/2005 | Chavez |
| 2005/0270775 | A1 | 12/2005 | Harbers et al. ............... 362/231 |
| 2006/0151800 | A1 | 7/2006 | Keong et al. |
| 2006/0239006 | A1 | 10/2006 | Chaves et al. ................ 362/294 |
| 2007/0081336 | A1 | 4/2007 | Bierhuizen et al. ........... 362/293 |
| 2008/0123349 | A1 | 5/2008 | Chavez et al. |
| 2008/0262316 | A1 | 10/2008 | Ajima et al. .................. 600/178 |
| 2009/0141474 | A1* | 6/2009 | Kolodin .......................... 362/84 |
| 2009/0168395 | A1* | 7/2009 | Mrakovich et al. ............. 362/84 |
| 2009/0225529 | A1* | 9/2009 | Falicoff et al. .................. 362/84 |

FOREIGN PATENT DOCUMENTS

| | | |
|---|---|---|
| ES | 2142752 | 4/2000 |
| SU | 1282051 A1 | 1/1987 |
| WO | WO-9909349 | 2/1999 |
| WO | WO-9913266 | 3/1999 |
| WO | WO-99/15826 | 4/1999 |
| WO | WO-9915826 | 4/1999 |
| WO | WO-0107828 A1 | 2/2001 |
| WO | WO-01/35128 | 5/2001 |
| WO | WO-0135128 | 5/2001 |
| WO | WO-01/40702 | 6/2001 |
| WO | WO-0140702 | 6/2001 |
| WO | WO-03/071352 | 8/2003 |
| WO | WO-03066374 A2 | 8/2003 |
| WO | WO-03066374 A3 | 8/2003 |
| WO | WO-03071352 | 8/2003 |
| WO | WO-2004007241 A2 | 1/2004 |

OTHER PUBLICATIONS

Winston, Roland et al., "NonImaging Optics", Elsevier Academic Press, Burlington, MA, USA, Copyright 2005, 260 pages (part 2).
U.S. Appl. No. 10/851,471, filed May 21, 2004, Benitez.
U.S. Appl. No. 10/851,471, filed May 21, 2004, Parkyn.
U.S. Appl. No. 60/780,520, filed Mar. 8, 2006, Benitez et al.
Benitez, P., "Chapter 6: The SMS Design Method in Three Dimensions", Conceptos avanzados de optica anidolica: diseno y fabricacion, PhD Dissertation, UPM (1998), 17 pages.
Benitez, P., "Design in 3D Geometry with the Simultaneous Multiple Surface design method of Nonimaging Optics", Instituto de Engergia Solar, E.T.S.I. Telecommunicacion, Universidad Politecnica, 28040, Madrid, Spain, Jul. 26, 2004, 11 pages.
European Patent Office, Supplementary European Search Report from EP04752067 mailed May 9, 2008, 5 pages.
Eurpean Patent Office, European Search Report from EP04752067 dated May 19, 2008, 5 pages.
Eurpoean Patent Office, Examination Report for EP Application No. 0475067.1 mailed Aug. 28, 2008, 6 pages.
Glaeser, Georg , "Reflections on Refraction", AMS, Sep. 5, 2001, pp. 1-18.
Infineon Technologies, "Hyper Argus Led, Hyper-Bright 3mm LED, Non Diffused", Mar. 1, 2000, 9 pages.
Parkyn, "The Black Hole: Cuspated waveguide-injectors and illuminators for LEDs", Part of the SPIE Conference on Nonimaging Optics: Maximum Efficiency Light Transfer V, Denver, CO Jul. 1999, 7 pages.
PCT, International Preliminary Report on Patentability, PCT/US04/38584, Jan. 24, 2006, 42 pages.
PCT, International Search Report and Written Opinion, PCT/US2004/38162, mail date Nov. 30, 2005, 9 pages.
PCT, International Search Report, PCT/US03/38240, W004051223, mail date Jul. 26, 2004, 3 pages.
PCT, International Search Report, PCT/US04/14938, WO04104642, mail date Mar. 1, 2005, 6 pages.
PCT, International Search Report, PCT/US04/16313, WO04104925, mail date Mar. 21, 2005, 3 pages.
PCT, International Search Report, PCT/US04/24450, WO05012952, mail date Aug. 3, 2005, 3 pages.
PCT, International Search Report, PCT/US04/38584, WO2005050710, mail date Jul. 18, 2005, 3 pages.
PCT, International Search Report, PCT/US2004/003054, WO2004070433A3, mail date Oct. 20, 2006, 2 pages.
Remillard, et al., "Loss Mechanisms in Optical Light Pipes", Applied Optics, vol. 31 #34 Dec. 1992 , pp. 7232-7241.
Spigulis, "Compact Dielectric Reflective Elements, Half-Sphere Concentrators of Radially Emitted Light", Applied Optics vol. 33, Nov. 25, 1994, 5 pages.
USPTO, Advisory Action from U.S. Appl. No. 10/772,088 dated Dec. 6, 2006, 3 pages.
USPTO, International Search Report and Written Opinion, PCT/US04/24330, mail date Jun. 27, 2006, 4 pages.
USPTO, International Search Report, PCT/US03/32076, W02004034100, mail date Apr. 20, 2004, 2 pages.
USPTO, Interview Summary from U.S. Appl. No. 10/269,479 dated Mar. 18, 2004, 1 page.
USPTO, Interview Summary from U.S. Appl. No. 10/461,557, mail date Aug. 5, 2005, 4 pages.
USPTO, Interview Summary from U.S. Appl. No. 10/772,088 dated Apr. 5, 2007, 2 pages.
USPTO, Notice of Allowability from U.S. Appl. No. 10/461,557, mail date Jan. 10, 2006, 5 pages.
USPTO, Notice of Allowance from U.S. Appl. No. 10/461,557, mail date Aug. 8, 2005, 9 pages.
USPTO, Notice of Allowance from U.S. Appl. No. 10/816,228, mail date Sep. 14, 2007, 6 pages.
USPTO, Notice of Allowance from U.S. Appl. No. 11/040,506, mail date Sep. 20, 2007, 11 pages.
USPTO, Office Action from U.S. Appl. No. 10/461,557, mail date Feb. 10, 2005, 32 pages.
USPTO, Office Action from U.S. Appl. No. 10/461,557 dated Nov. 24, 2004, 5 pages.
USPTO, Office Action from U.S. Appl. No. 10/772,088 dated Feb. 24, 2006, 29 pages.
USPTO, Office Action from U.S. Appl. No. 10/772,088 dated Apr. 24, 2007, 12 pages.
USPTO, Office Action from U.S. Appl. No. 10/772,088 dated Sep. 8, 2006, 17 pages.
USPTO, Office Action from U.S. Appl. No. 10/772,088 dated Sep. 27, 2007, 14 pages.
USPTO, Office Action from U.S. Appl. No. 10/772,088 dated Dec. 16, 2005, 5 pages.
USPTO, Office Action from U.S. Appl. No. 10/816,228 dated Mar. 31, 2006, 23 pages.
USPTO, Interview Summary from U.S. Appl. No. 10/816,228 dated Apr. 5, 2007, 3 pages.
USPTO, Office Action from U.S. Appl. No. 10/816,228 dated Jun. 12, 2007, 6 pages.
USPTO, Office Action from U.S. Appl. No. 10/851,471 dated Mar. 27, 2006, 8 pages.
USPTO, Office Action from U.S. Appl. No. 10/901,919 dated May 8, 2007, 35 pages.
USPTO, Office Action from U.S. Appl. No. 10/901,919 dated Oct. 19, 2007, 10 pages.
USPTO, Office Action from U.S. Appl. No. 11/040,506 dated Apr. 9, 2007, 29 pages.
*Examination Report from the European Patent Office for* App. No. 047520671 dated Nov. 16, 2009.
*Examiner Interview from* U.S. Appl. No. 11/970,462 mailed Feb. 22, 2010.
*Examiner Interview Summary from* U.S. Appl. No. 11/970,462 mailed Apr. 13, 2010.
*International Search Report and Written Opinion of the International Searching Authority for PCTUS2009056683* mail date Apr. 20, 2010).

*Non-final office action from* U.S. Appl. No. 11/970,462 mailed Oct. 30, 2009.
*Notice of Allowance from* U.S. Appl. No. 11/970,462 mailed Apr. 13, 2010.
U.S. Appl. No. 10/772,088, filed Feb. 3, 2004, Minano.
U.S. Appl. No. 10/903,925, filed Jul. 29, 2004, Falicoff.
U.S. Appl. No. 10/816,228, filed Mar. 31, 2004, Chavez et al.
U.S. Appl. No. 10/814,598, filed Mar. 30, 2004, Chavez et al.
U.S. Appl. No. 10/726,130, filed Dec. 1, 2003, Minano et al.
U.S. Appl. No. 10/901,919, filed Apr. 21, 2005, Benitez.
U.S. Appl. No. 11/040,506, filed Jun. 16, 2005, Minano et al.
Benitez, P. "Chapter 6: The SMS Design Method in Three Dimensions", *Conceptos avanzados de optica anidolica: diseno y fabricacion, PhD dissertation, UPM* (1998), 17 pages.
Winston, Roland, et al., "Non-Imaging Optics", *Elsevier Academic Press*, Burlington, MA, USA, Copyright 2005, 509 pages.
PCT, *International Search Report*, PCT/US2004/003054, WO2004070433A3, mail date Aug. 19, 2004, 2 pages.
Glaeser, Georg, "Reflections on Refraction", *AMS* Sep. 5, 2001, 19 pages.
PCT, *International Preliminary Report on Patentability*, PCTUS0438584, mail dated Jan. 24, 2006, 42 pages.
PCT, *International Search Report and Written Opinion*, PCT/US2004/38162, mail date Nov. 30, 2005, 9 pages.
Remillard, et al., "Loss Mechanisms Optical Light Pipes", *Applied Optics*, vol. 31 #34 (Dec. 1992),10 pages.
Parkyn, "The Black Hole: Cuspated waveguide-injectors and illuminators for LEDs", *Part of the SPIE Conference on Nonimaging Optics: Maximum Efficiency Light Transfer V*, Denver, CO, (Jul. 1999), 7 pages.
Osram, "Hyper Argus LED, Hyper-Bright 3mm LED, Non Diffused", *Infineon Technologies*, (Mar. 1, 2000), 9 pages.
Spigulis, "Compact Dielectric reflective elements, Half Sphere concentrators of radially emitted light", *Applied Optics* vol. 33, (Nov. 25, 1994), 5 pages.
PCT, International Search Report, PCT/US03/32076, WO2004034100, dated Apr. 9, 2004, 2 pages.
Benitez, P., "Design in 3D Geometry with the Simultaneous Multiple Surface design method of Nonimaging Optics", *Instituto de Engergia Solar, E.T.S.I. Telecommunicacion, Universidad Politecnica*, 28040. Madrid, Spain, (Jul. 26, 2004), 11 pages.
PCT, International Search Report, PCT/US03/38240, WO04051223, mail date Jul. 26, 2004, 3 pages.
PCT, International Search Report, PCT/US04/16313, WO04104925, mail date Mar. 21, 2005, 3 pages.
PCT, International Search Report, PCT/US04/24450, WO05012952, mail date Aug. 3, 2005, 3 pages.
PCT, International Search Report, PCT/US04/38584, WO2005050710, mail date Jul. 18, 2005, 3 pages.
PCT, International Search Report, PCT/US03/38024, WO2004051321, mail date Nov. 10, 2004, 2 pages.
PCT, International Search Report, PCT/US04/14938, WO04104642, mail date Mar. 1, 2005, 6 pages.
USPTO, Office Action from U.S. Appl. No. 10/461,557, dated Nov. 24, 2004, 5 pages.
USPTO, Notice of Allowance from U.S. Appl. No. 10/461,557, dated Aug. 8, 2005, 9 pages.
USPTO, Office Action from U.S. Appl. No. 10/772,088, dated Apr. 24, 2007, 10 pages.
USPTO, Interview Summary from U.S. Appl. No. 10/772,088, dated Apr. 5, 2007, 2 pages.
USPTO, Advisory Action from U.S. Appl. No. 10/772,088, dated Dec. 6, 2006, 3 pages.
USPTO, Office Action from U.S. Appl. No. 10/772,088, dated Sep. 8, 2006, 17 pages.
USPTO, Office Action from U.S. Appl. No. 10/772,088, dated Feb. 24, 2006, 29 pages.
USPTO, Office Action from U.S. Appl. No. 10/772,088, dated Dec. 16, 2005, 5 pages.
USPTO, Notice of Allowance from U.S. Appl. No. 10/816,228, dated Sep. 14, 2007, 6 pages.
USPTO, Office Action from U.S. Appl. No. 10/816,228, dated Jun. 12, 2007, 6 pages.
USPTO, Interview Summary from U.S. Appl. No. 10/816,228, dated Apr. 5, 2007, 3 pages.
USPTO, Office Action from U.S. Appl. No. 10/816,228, dated Mar. 31, 2006, 23 pages.
USPTO, Office Action from U.S. Appl. No. 10/901,919, dated May 8, 2007, 35 pages.
USPTO, Notice of Allowance from U.S. Appl. No. 11/040,506, dated Sep. 20, 2007, 11 pages.
USPTO, Office Action from 11/040,506 dated Apr. 9, 2007, 29 pages.
USPTO, Office Action from U.S. Appl. No. 10/772,088, dated Sep. 27, 2007, 14 pages.
PCT, *International Search Report and Written Opinion*, PCT/US04/24330, mail date Jun. 27, 2006, 4 pages.
USPTO, Office Action from U.S. Appl. No. 10/901,919, dated Oct. 19, 2007, 10 pages.
Parkyn, William A., U.S. Appl. No. 10/851,471, May 21, 2004, 59 pages.
USPTO, Office Action from U.S. Appl. No. 10/851,471, dated Mar. 27, 2006, 8 pages.
Benitez, Pablo, U.S. Appl. No. 10/269,479, Oct. 11, 2002, 86 pages.
Minano, Juan U.S. Appl. No. 10/622,874, Jul. 18, 2003, 44 pages.
USPTO, Office Action from U.S. Appl. No. 10/461,557, dated Feb. 10, 2005, 32 pages.
USPTO, Interview Summary from U.S. Appl. No. 10/461,557, dated Jul. 25, 2005, 4 pages.
USPTO, Notice of Allowability from U.S. Appl. No. 10/461,557, dated Jan. 10, 2006, 8 pages.
Yupin, Sun U.S. Appl. No. 10/726,130, Dec. 1, 2003, 48 pages.
Minano, Juan C., U.S. Appl. No. 10/772,088, Feb. 3, 2004, 73 pages.
Benitez, Pablo U.S. Appl. No. 10/779,259, Feb. 13, 2004, 86 pages.
Chavez, Julio C., U.S. Appl. No. 10/816,228, Mar. 31, 2004, 68 pages.
Falicoff, Waqidi, U.S. Appl. No. 10/903,925, Jul. 29, 2004, 69 pages.
Benitez, Pablo, U.S. Appl. No. 10/901,919, Jul. 28, 2004, 136 pages.
Benitez, Pablo, U.S. Appl. No. 10/880,386, Jun. 28, 2004, 84 pages.
Minano, Juan C., U.S. Appl. No. 10/987,182, Nov. 12, 2004, 21 pages.
European Patent Office, Supplementary European Search Report from EP04752067, dated May 8, 2008, 5 pages.
Eurpean Patent Office, Supplementary European Search Report from EP04752067, dated May 19, 2008 (replacement of May 8, 2008 Search Report), 5 pages.
Eurpoean Patent Office, Examination Report for EP 0475067, dated Aug. 28, 2008, 6 pages.
Minano, Juan C., U.S. Appl. No. 11/040,506, Jan. 21, 2005, 69 pages.
PCT, International Search Report for PCT/US04/14938, mailed Mar. 1, 2005, 6 pages.
*European Patent Office*, Examination Report from EP04752067, mailed Feb. 10, 2009, 5 pages.
USPTO, Office Action from U.S. Appl. No. 11/970,462, dated Mar. 9, 2009, 5 pages.
USPTO, Interview Summary from 11/970,462, mailed Jun. 26, 2009, 4 pages.
Benitez, Pablo, U.S. Appl. No. 60/780,520, Mar. 8, 2006, 31 pages.
Office Action dated Feb. 1, 2011 on U.S. Appl. No. 12/378,666.
A.A. Bergh and P.J. Dean: *Light-emitting diodes*. Clarendon Press, Oxford, 1976.
L.F. Johnson, H.J. Guggenheim, T.C. Rich, and F.W. Ostermayer: *Infrared-to-Visible Conversion by Rare-Earth Ions in Crystals*. Bell Telephone Laboratories, Murray Hill, New Jersey. J. Appl. Phys., vol. 43, No. 3, Mar. 1972.

* cited by examiner

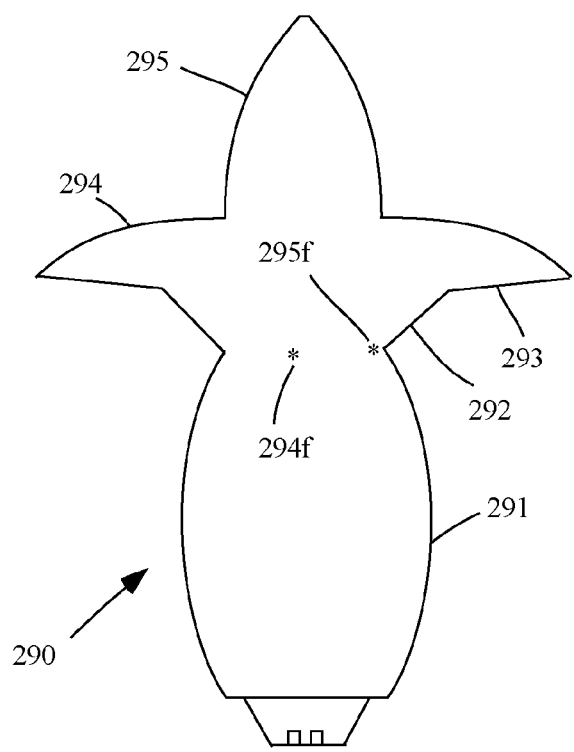 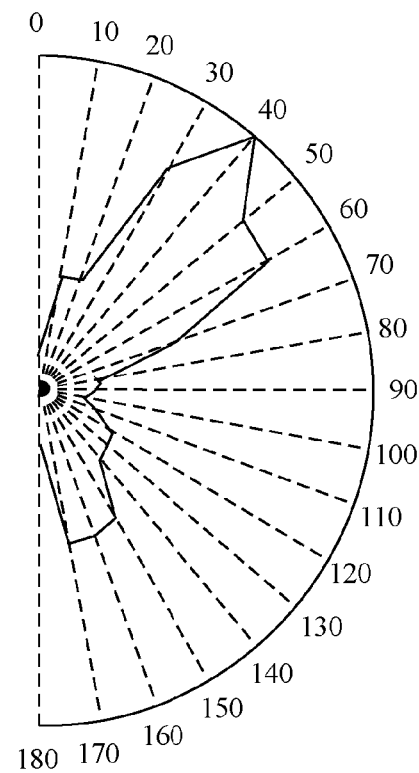
Fig. 3A  Fig. 3B
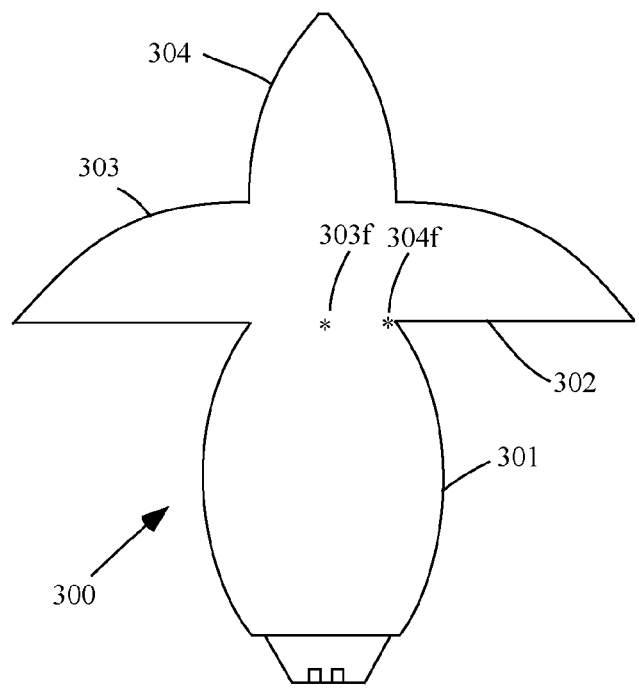 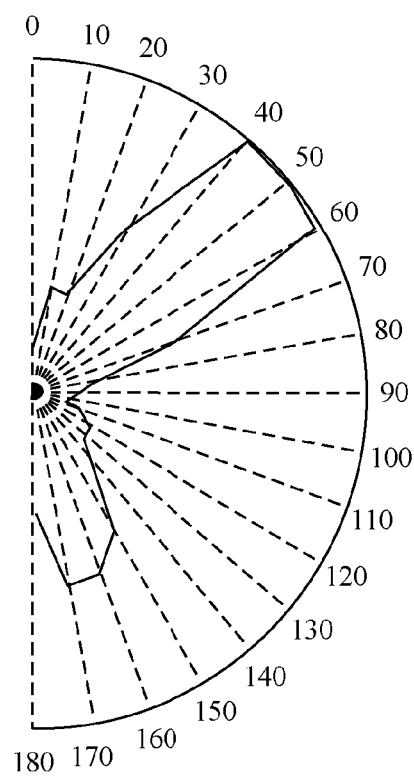
Fig. 4A  Fig. 4B

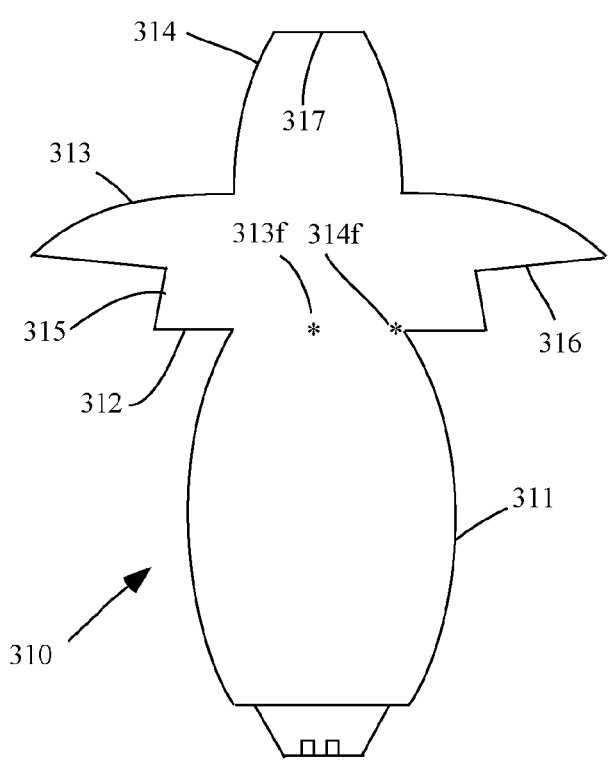
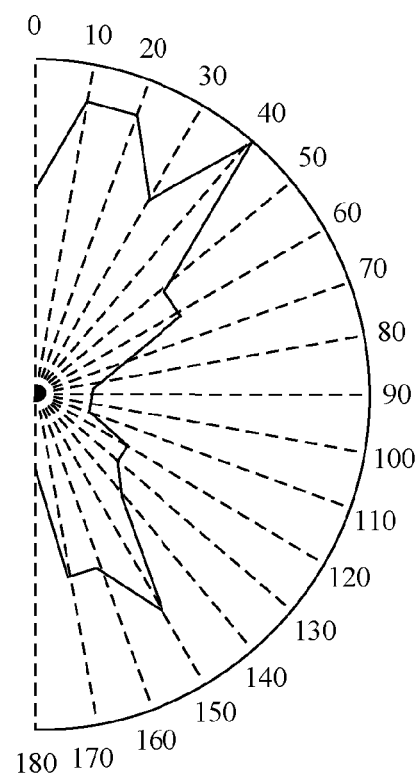
Fig. 5A Fig. 5B
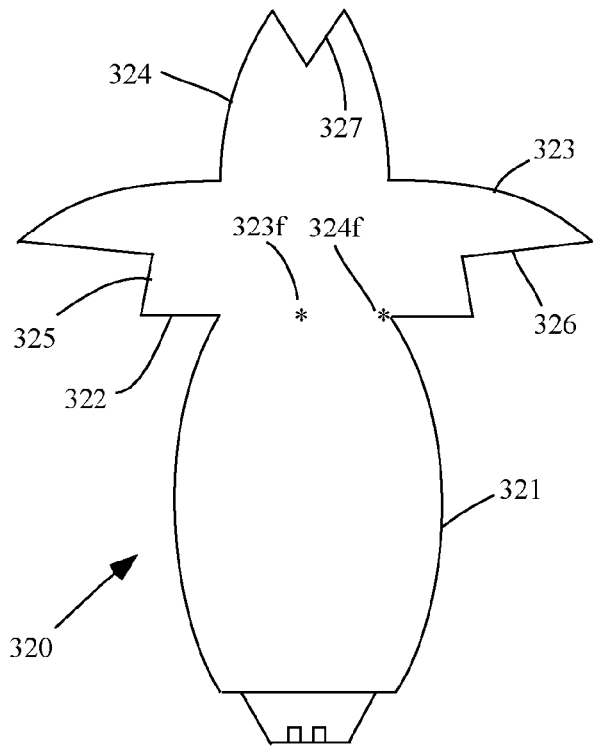
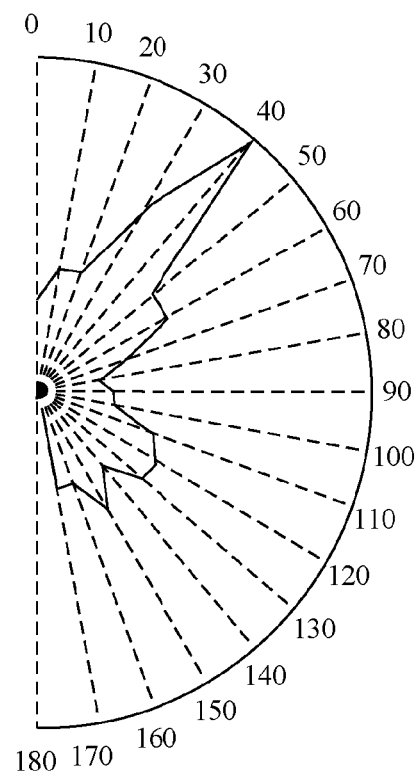
Fig. 6A Fig. 6B

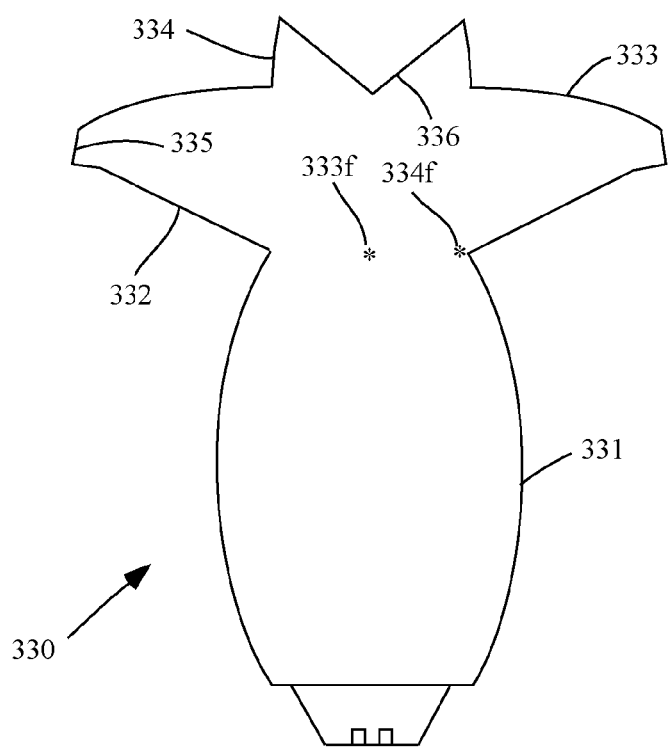
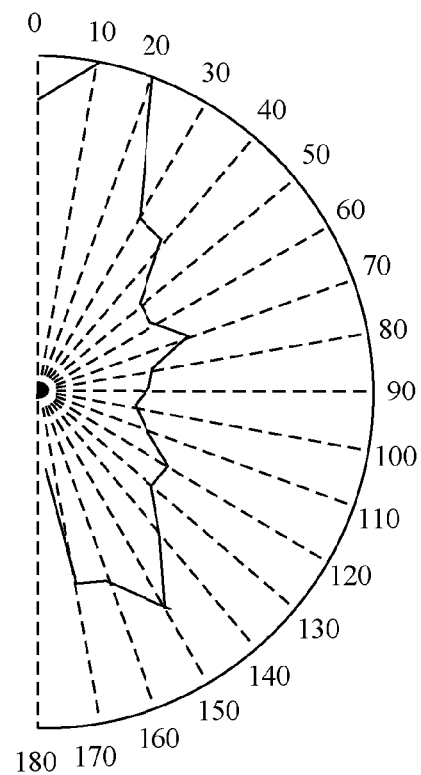
Fig. 7A　　　　　Fig. 7B
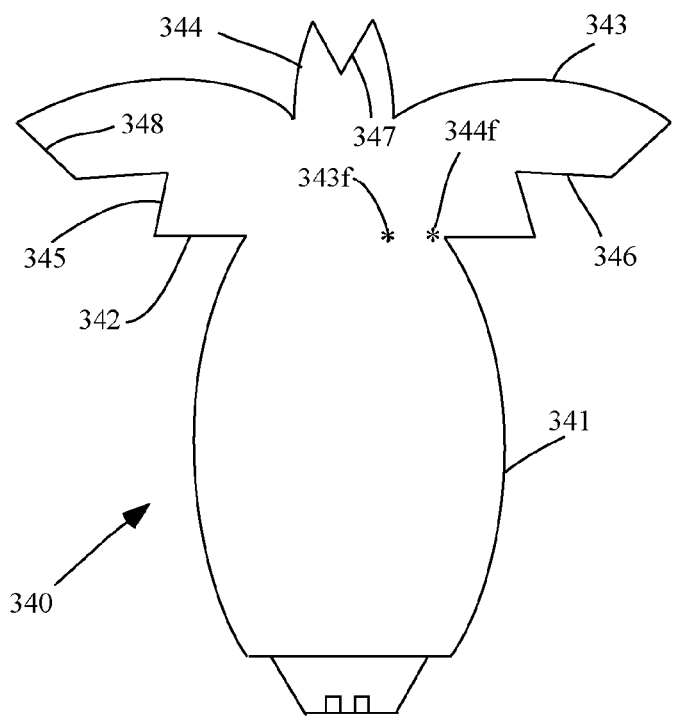
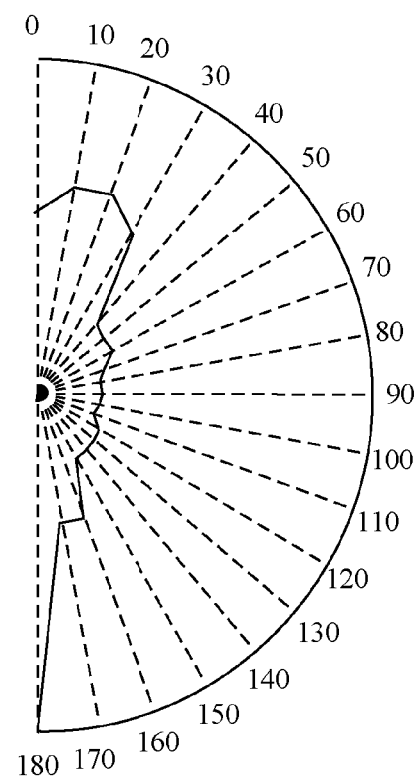
Fig. 8A　　　　　Fig. 8B

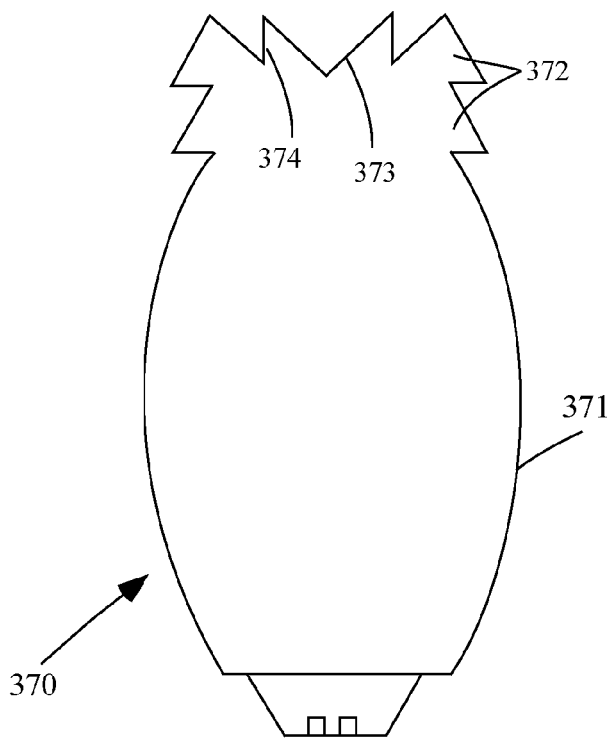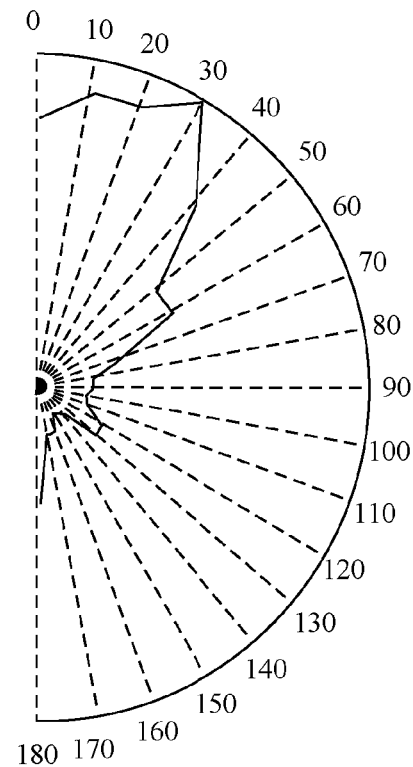
Fig. 11A   Fig. 11B
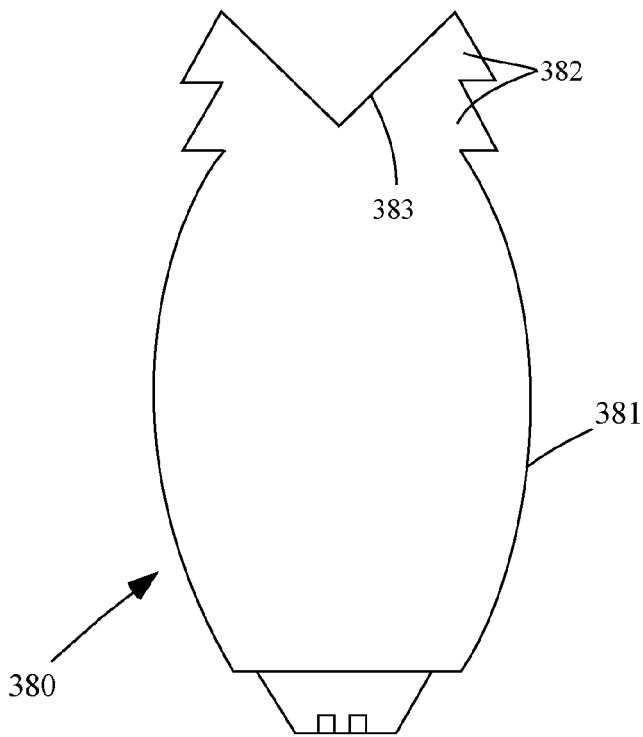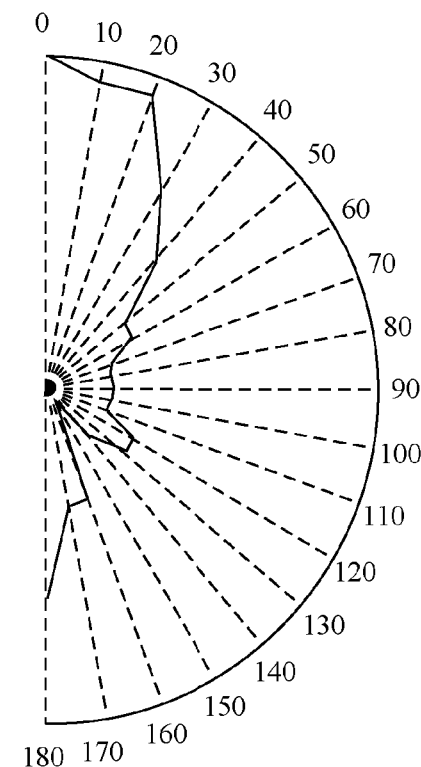
Fig. 12A   Fig. 12B

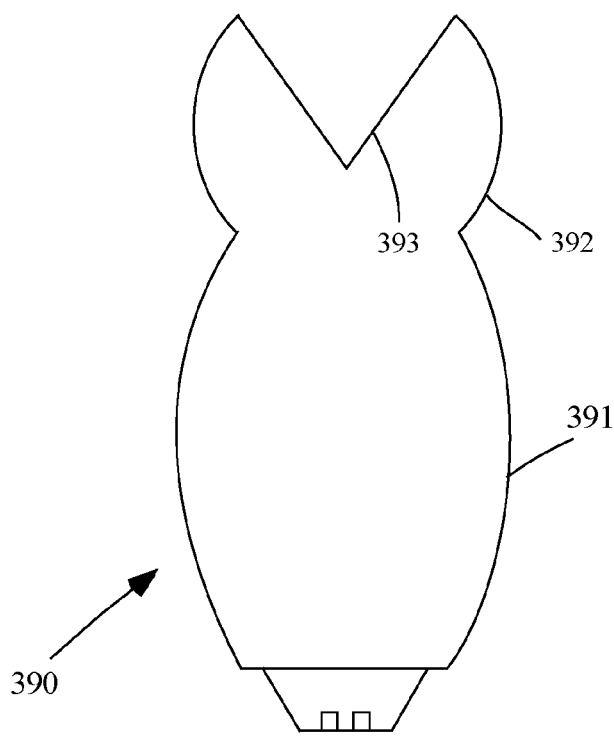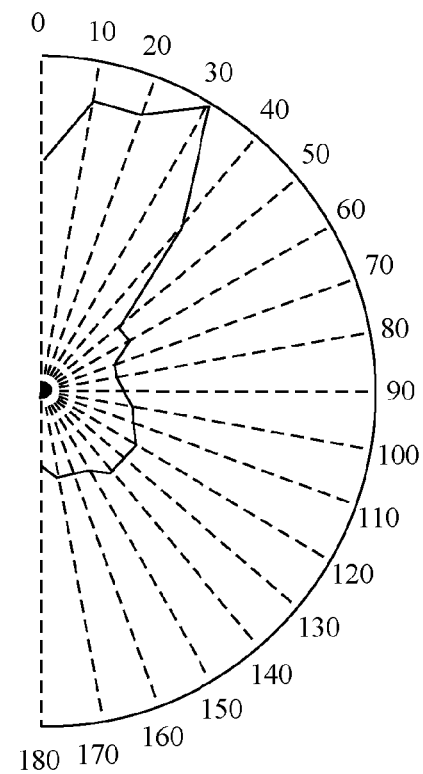
Fig. 13A　　　　Fig. 13B
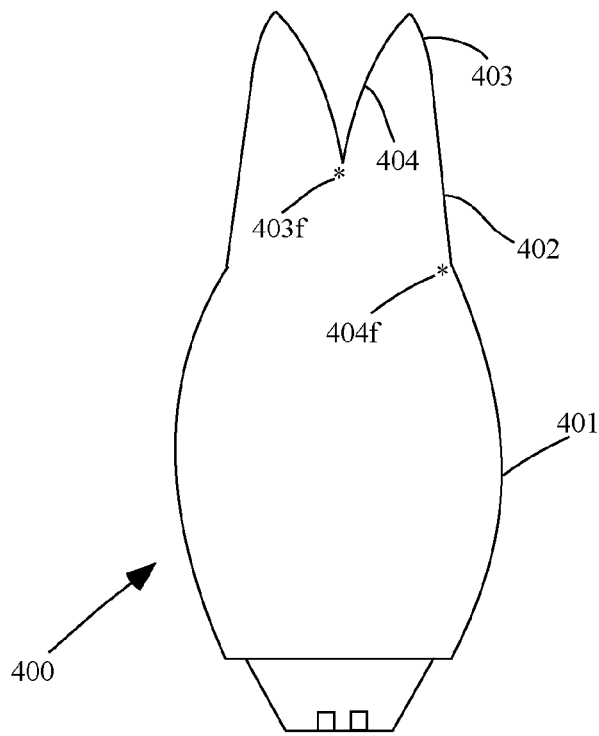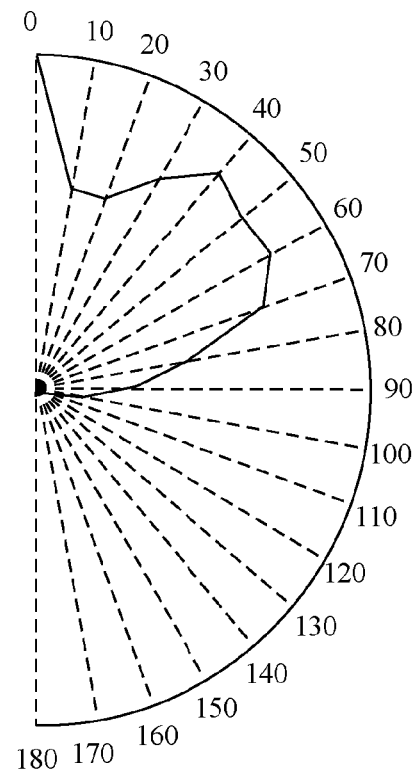
Fig. 14A　　　　Fig. 14B

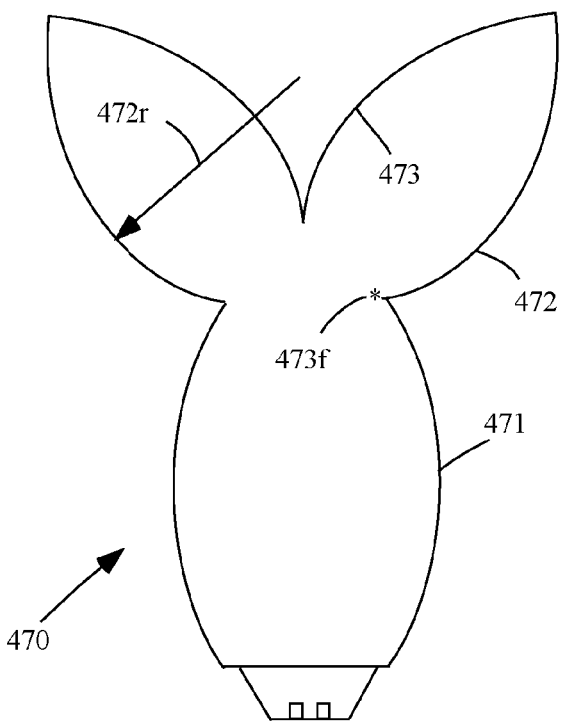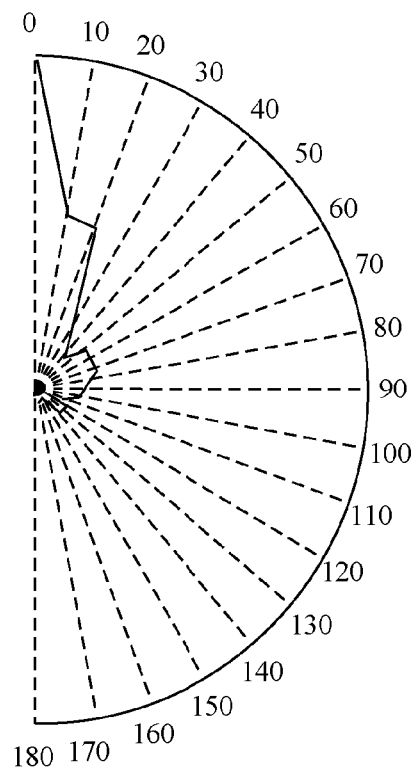
Fig. 21A          Fig. 21B
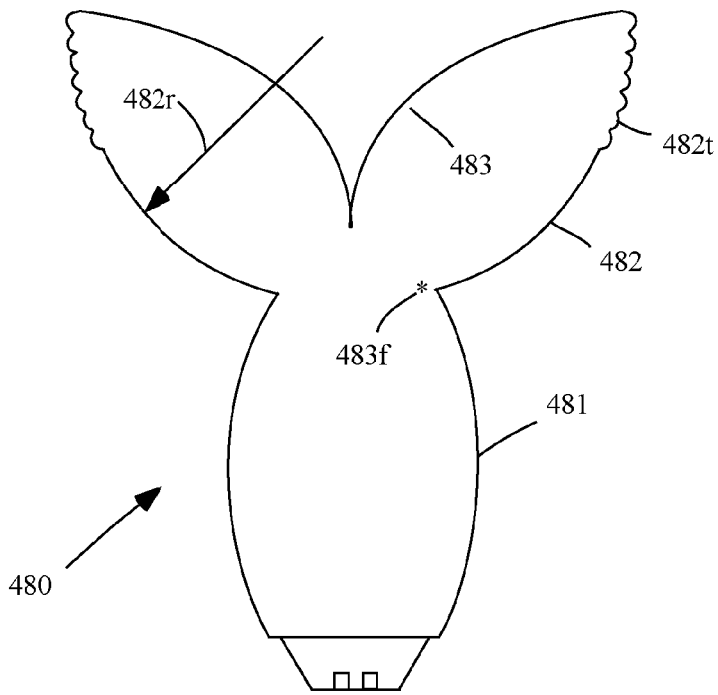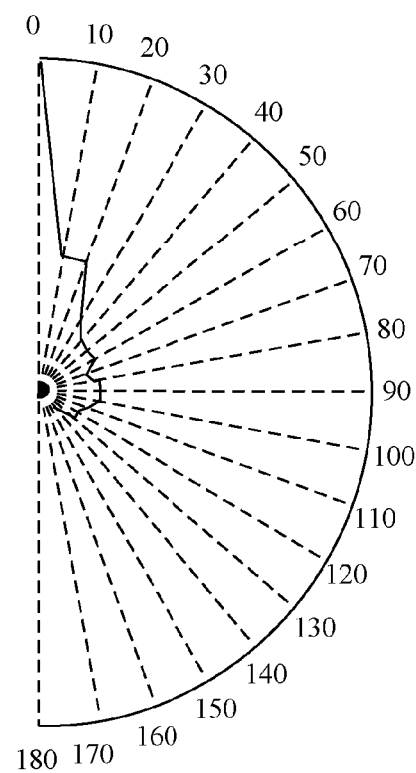
Fig. 22A          Fig. 22B

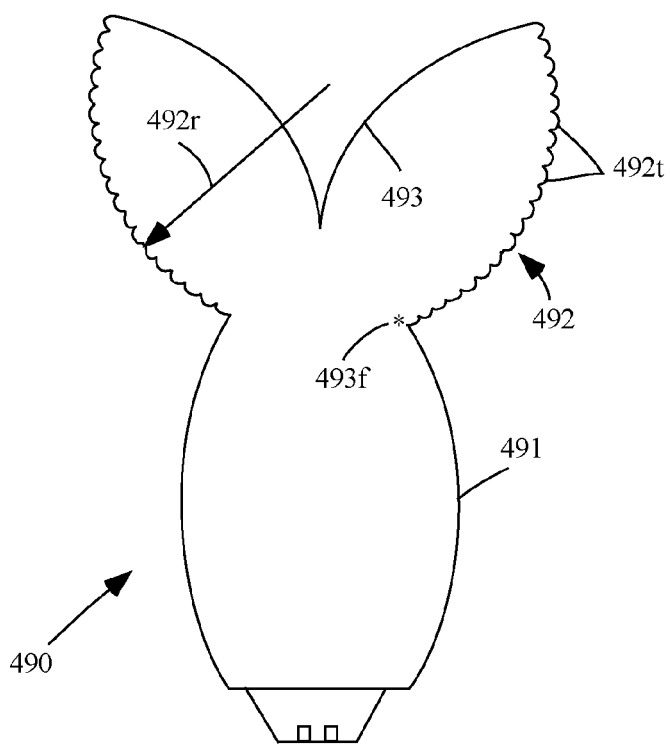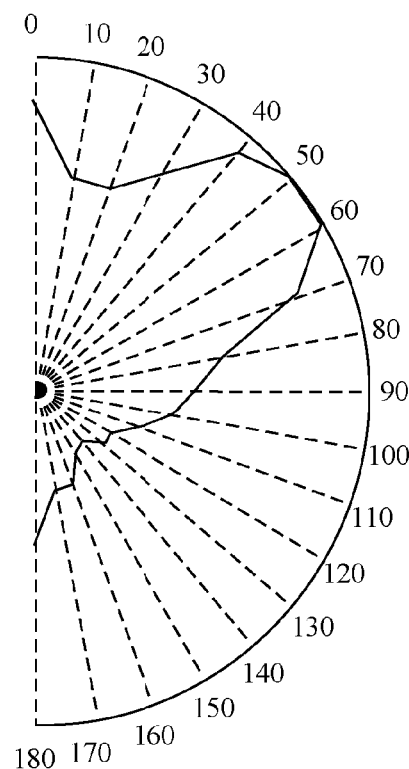
Fig. 23A    Fig. 23B
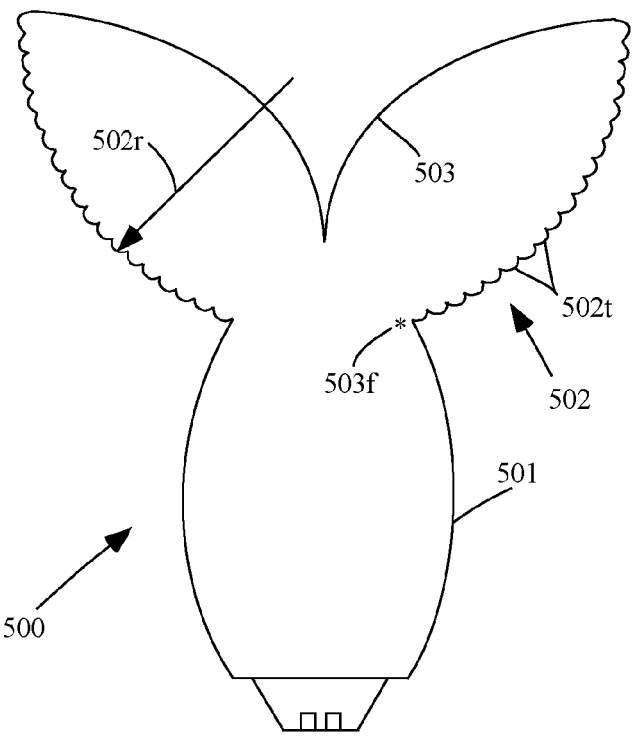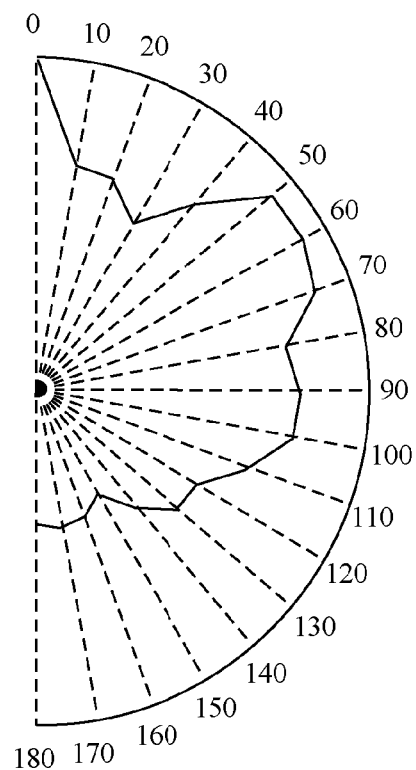
Fig. 24A    Fig. 24B

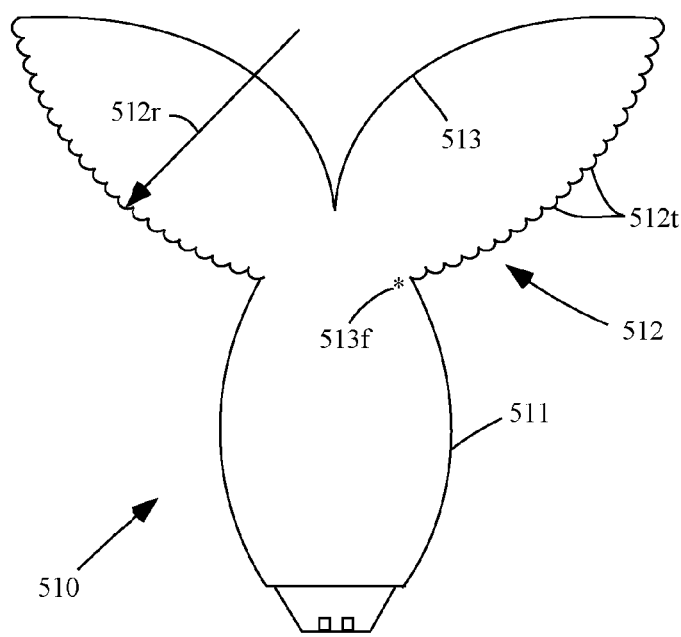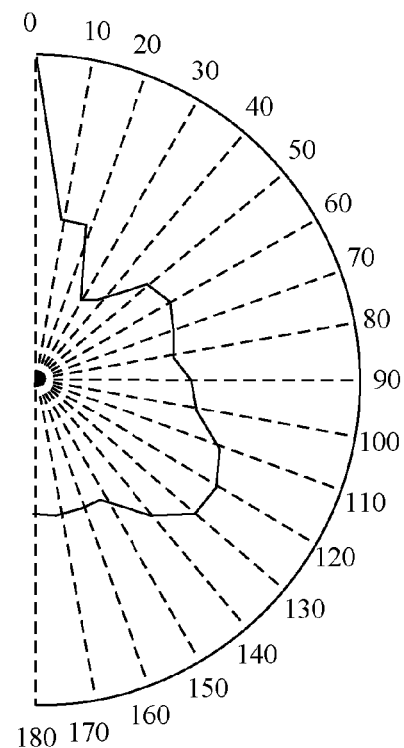
Fig. 25A  Fig. 25B
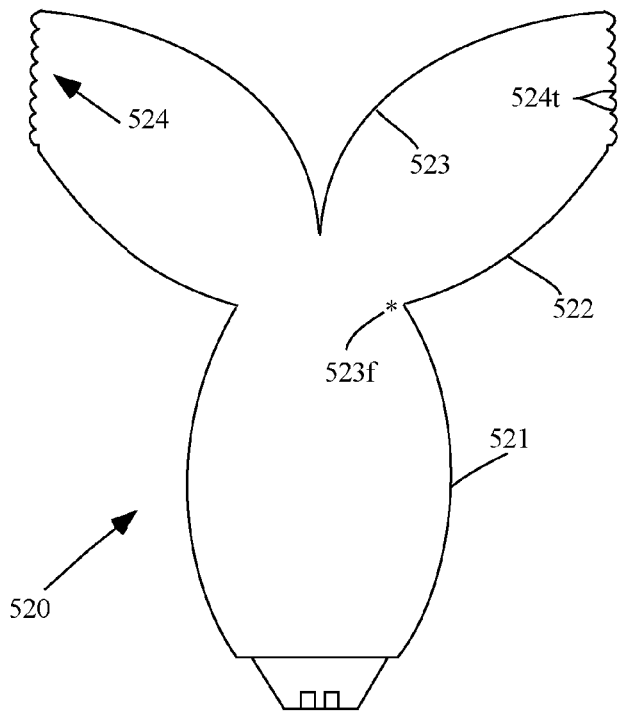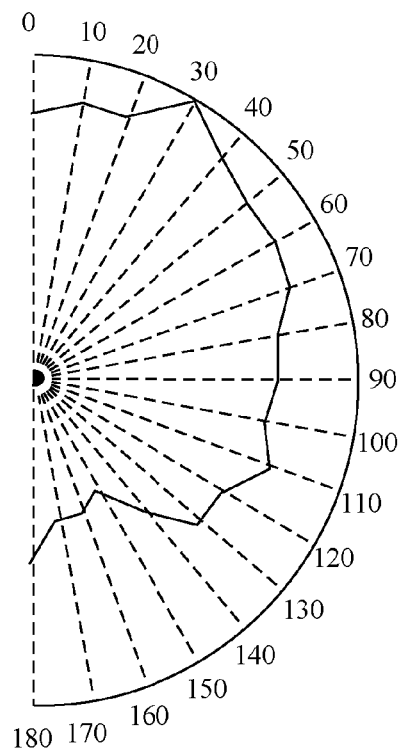
Fig. 26A  Fig. 26B

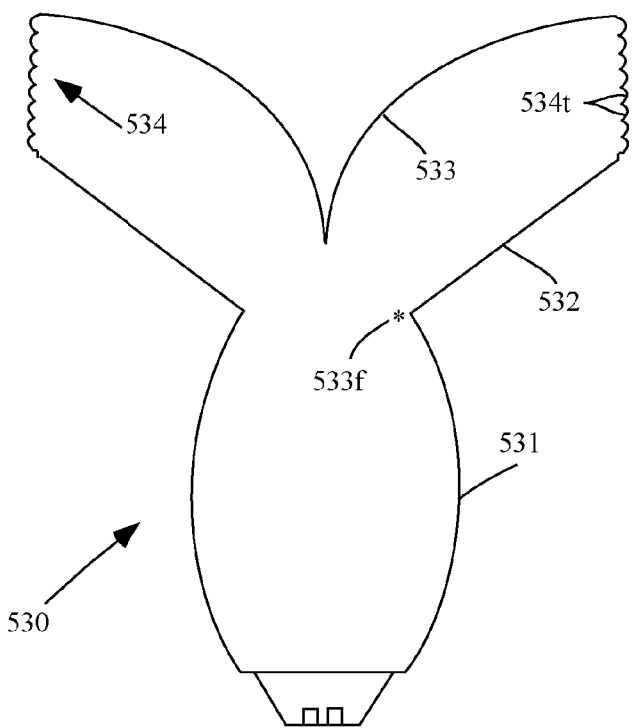 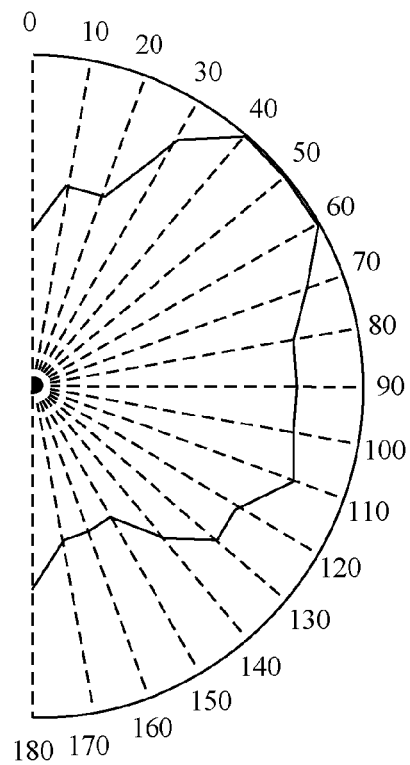
Fig. 27A　　　Fig. 27B
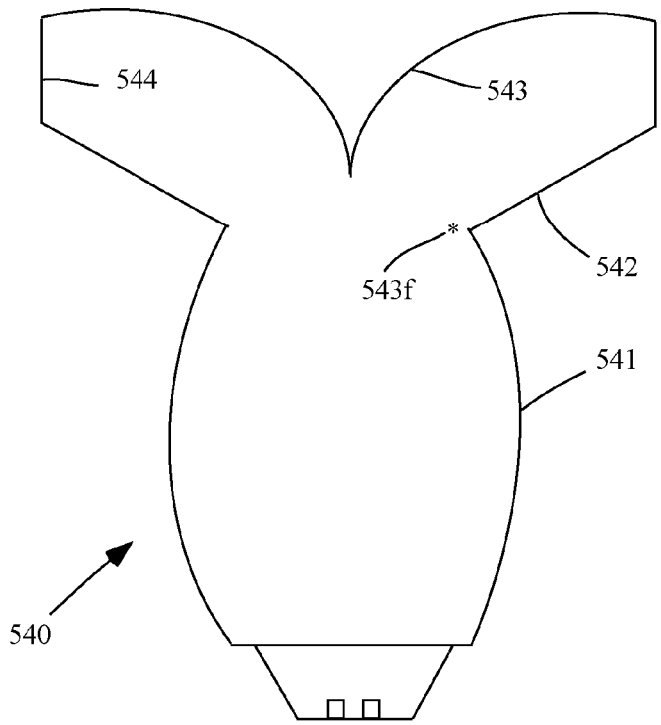 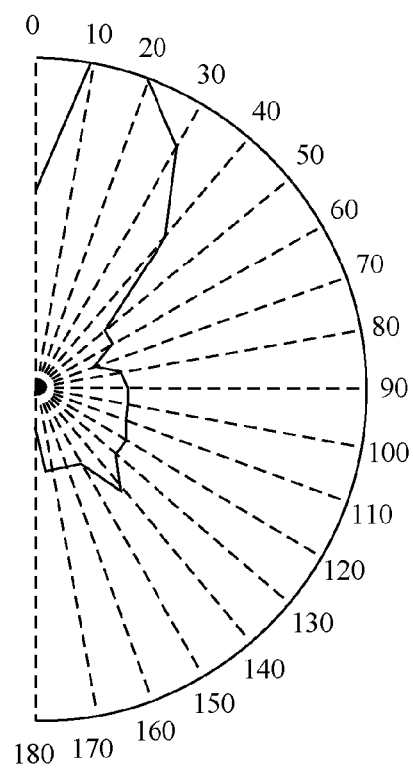
Fig. 28A　　　Fig. 28B

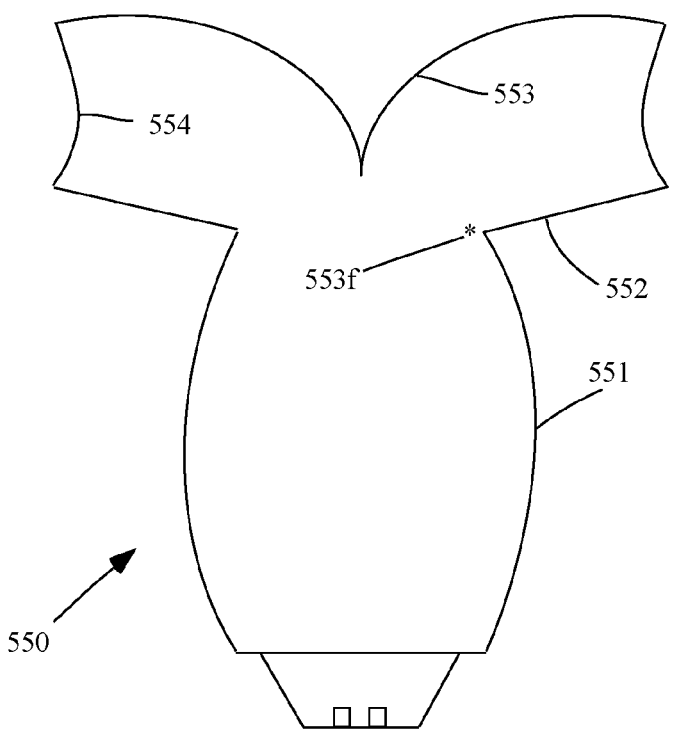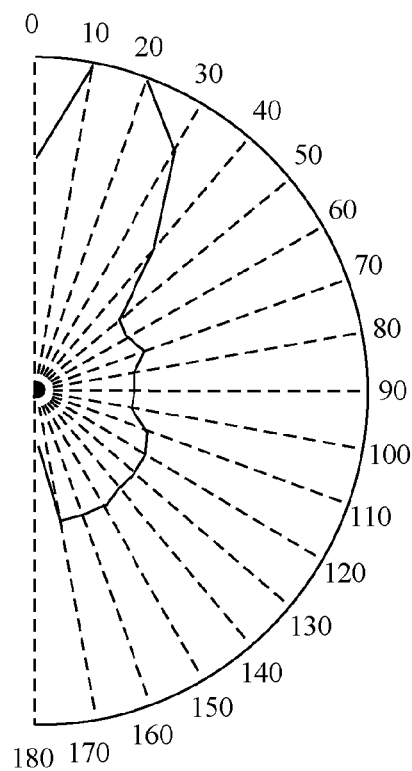
Fig. 29A        Fig. 29B
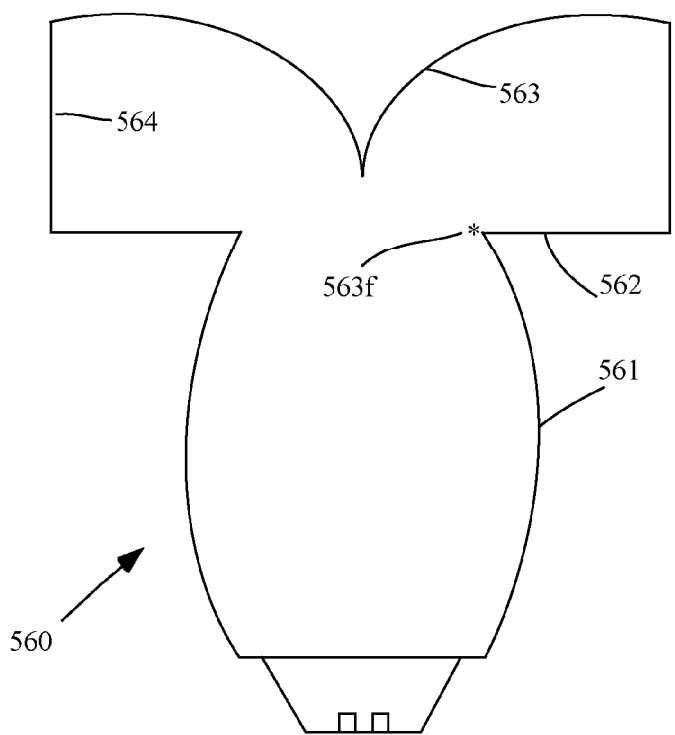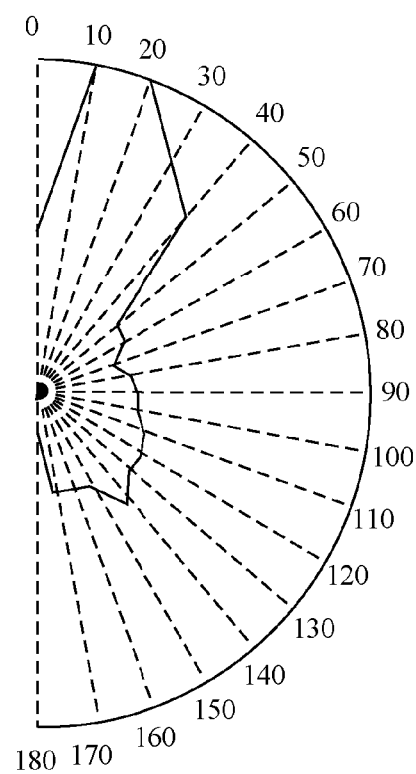
Fig. 30A        Fig. 30B

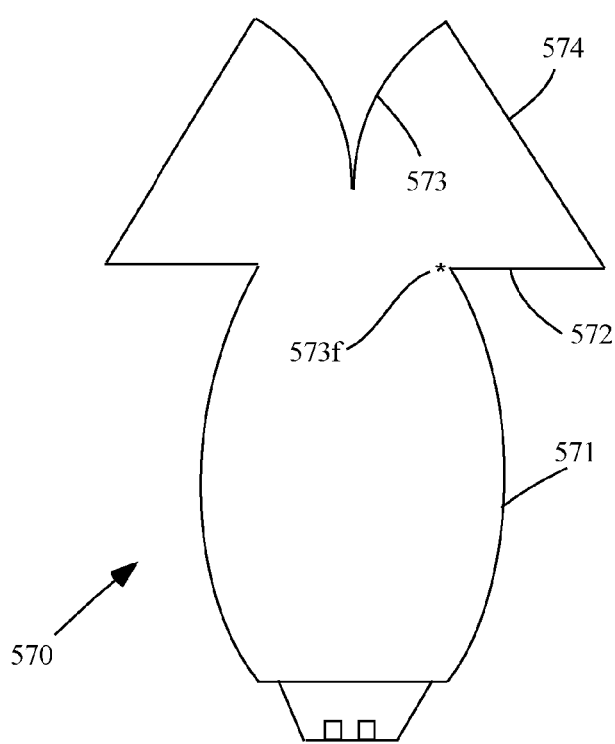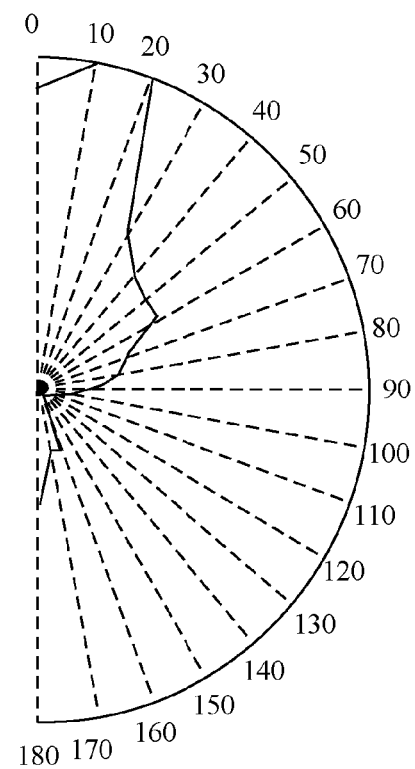
Fig. 31A  Fig. 31B
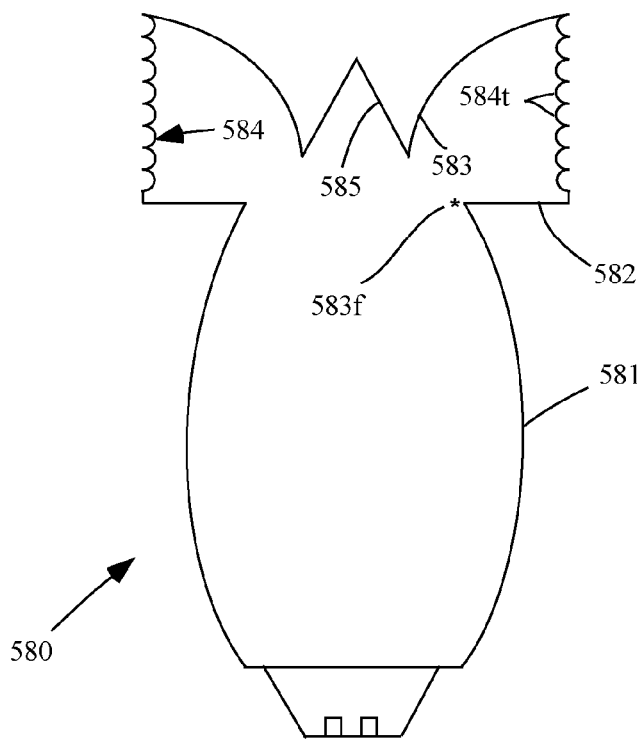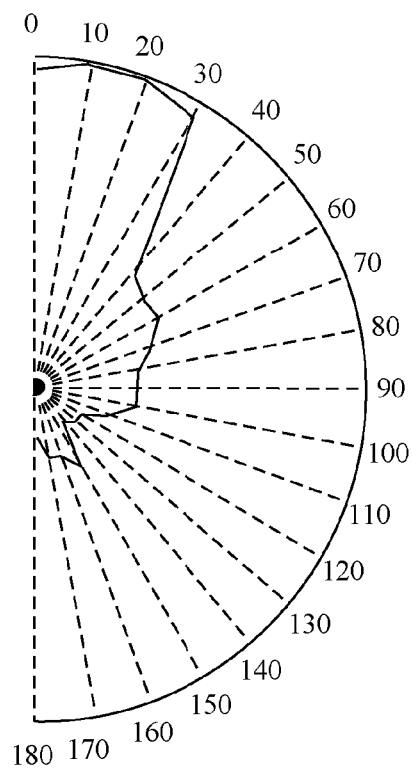
Fig. 32A  Fig. 32B

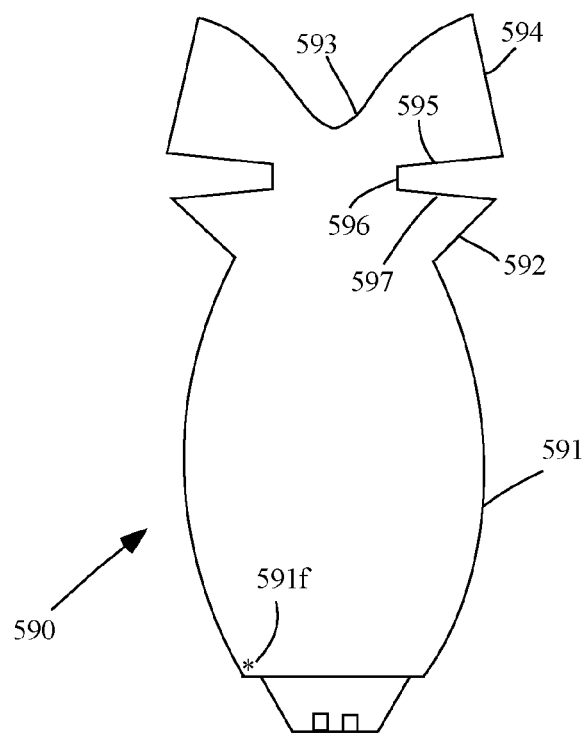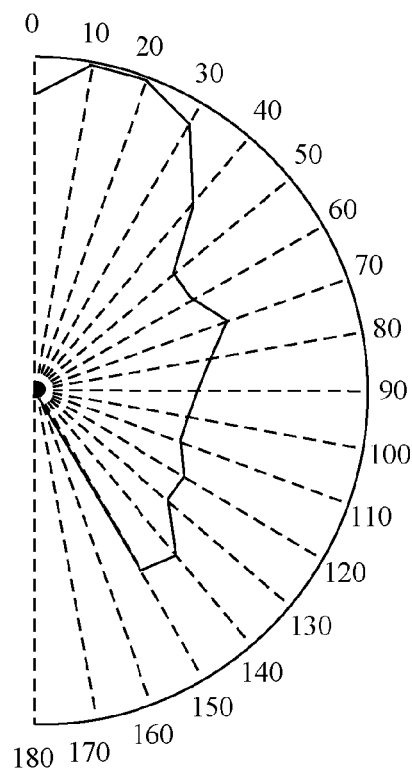
Fig. 33A  Fig. 33B
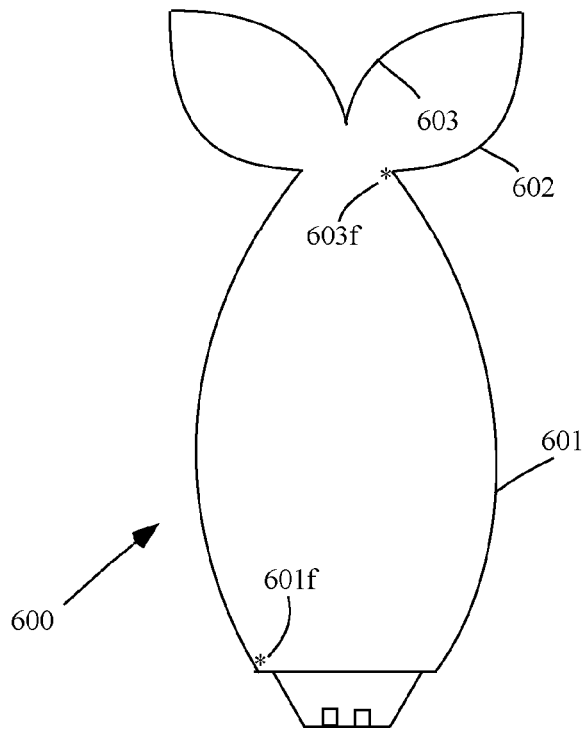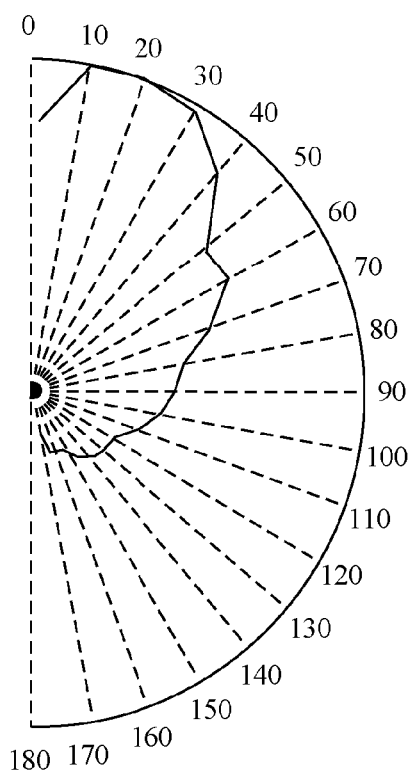
Fig. 34A  Fig. 34B

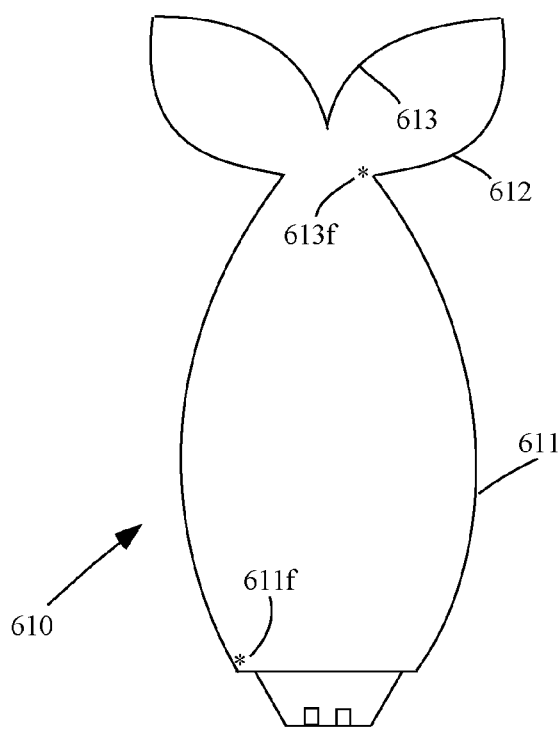 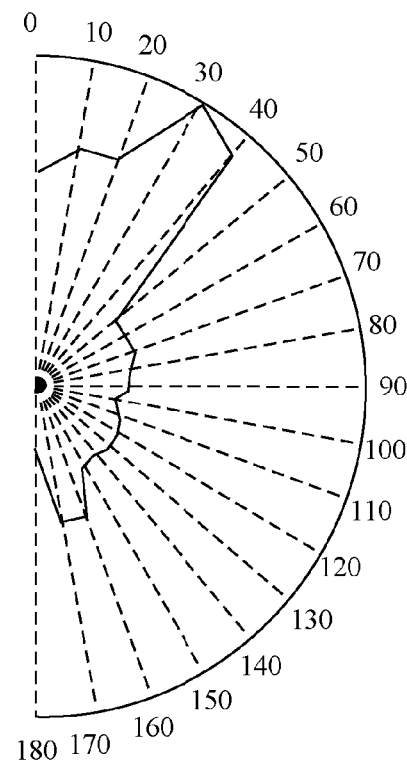
Fig. 35A        Fig. 35B
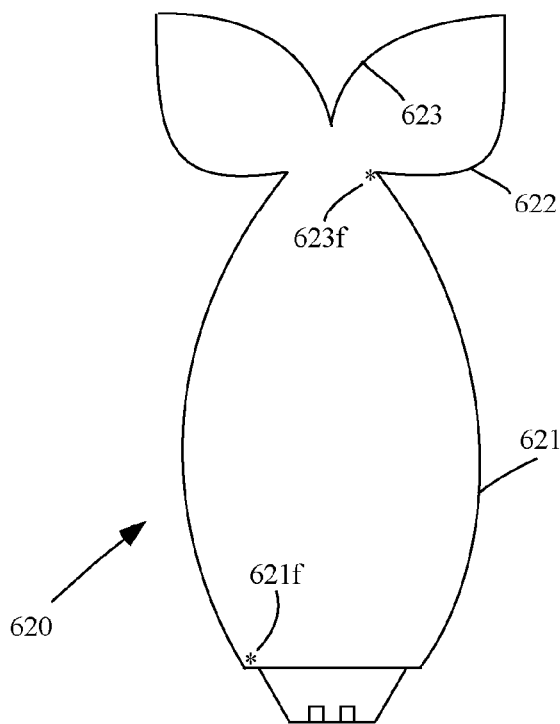 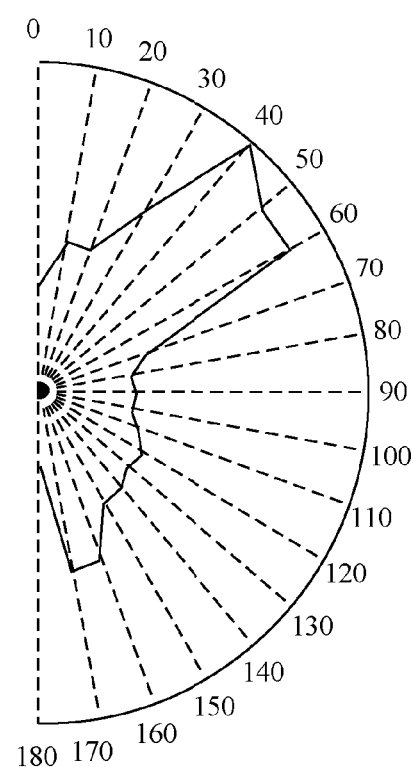
Fig. 36A        Fig. 36B

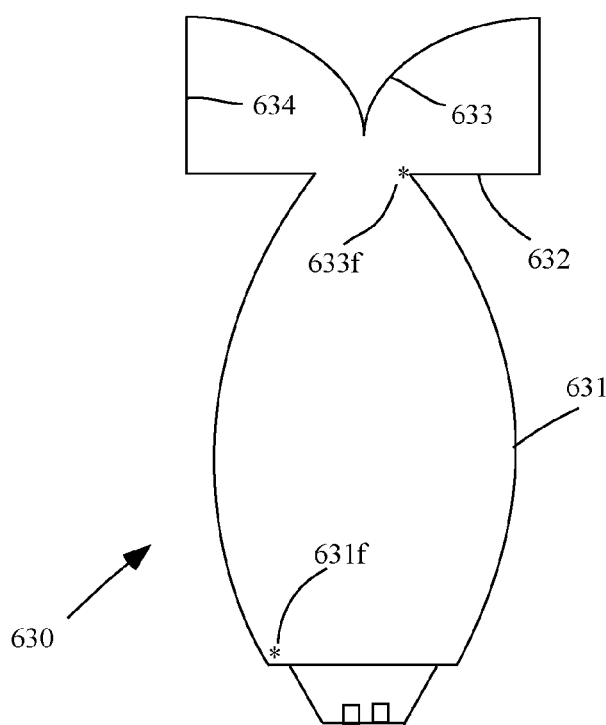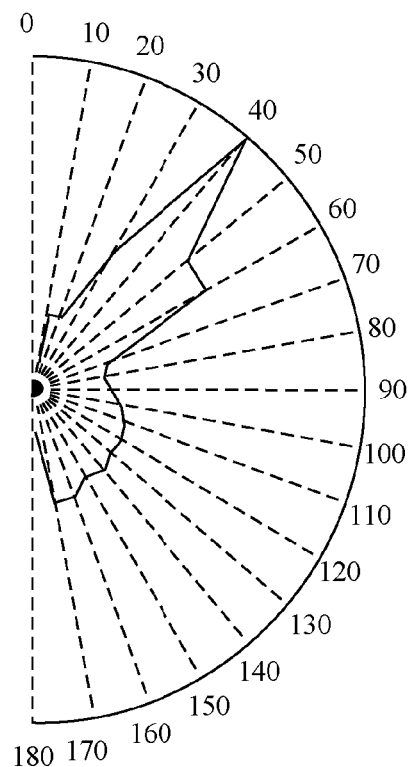
Fig. 37A  Fig. 37B
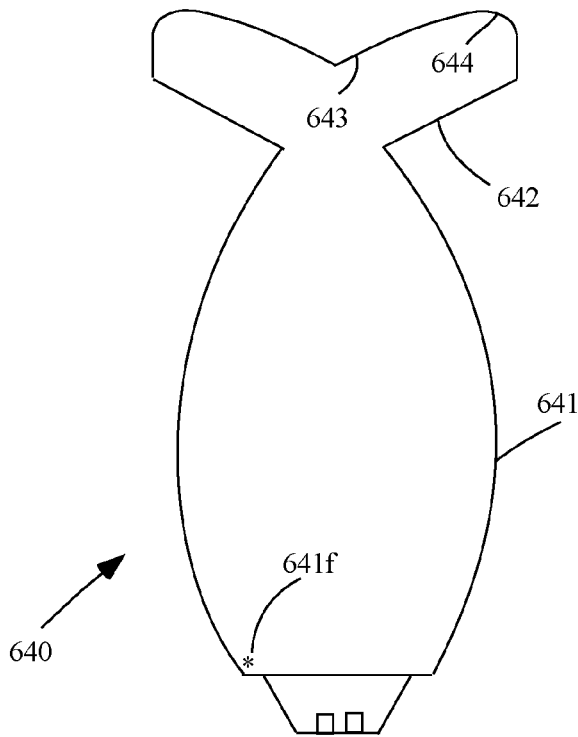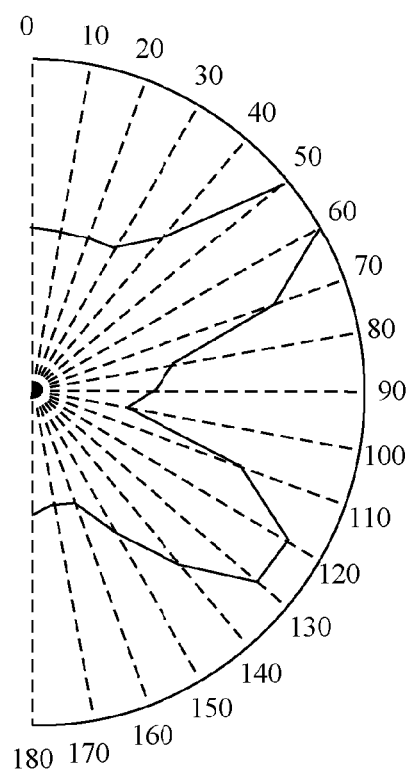
Fig. 38A  Fig. 38B

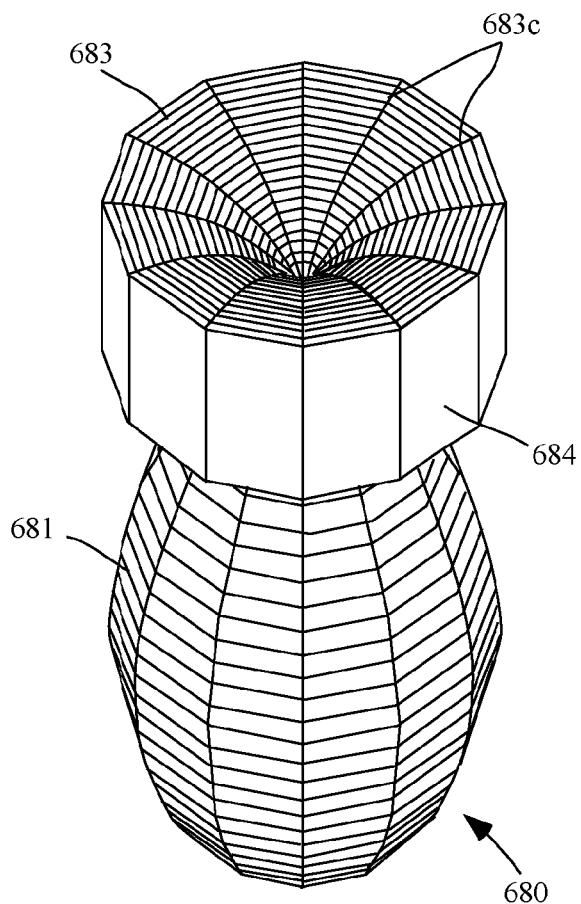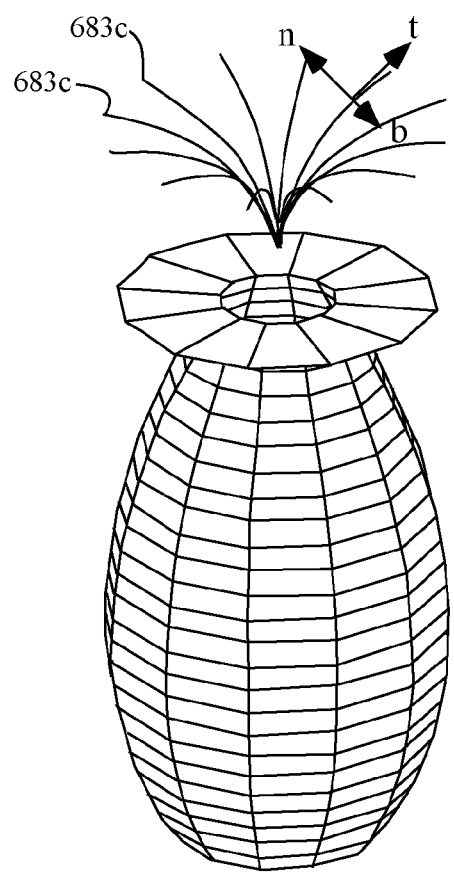
Fig. 42A     Fig. 42B
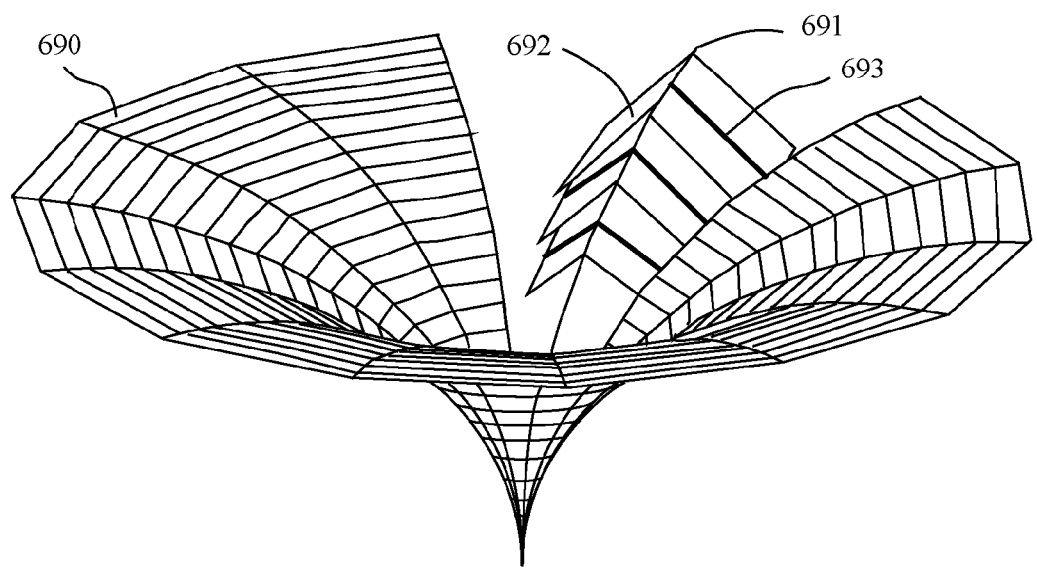
Fig. 43

OPTICAL DEVICE FOR LED-BASED LAMP

PRIORITY CLAIM

This application is a continuation-in-part of U.S. patent application Ser. No. 11/970,462, filed Jan. 7, 2008 to Chaves et al., entitled OPTICAL DEVICE FOR LED-BASED LAMP, which is a Divisional application of U.S. patent application Ser. No. 10/816,228, filed Mar. 31, 2004, to Chaves et al., entitled OPTICAL DEVICE FOR LED BASED LAMP, now U.S. Pat. No. 7,329,029, which is a continuation-in-part of:

U.S. patent application Ser. No. 10/814,598, filed Mar. 30, 2004, to Chaves et al., entitled OPTICAL DEVICE FOR LED-BASED LAMP, which claims the benefit under 35 U.S.C. §119(e) of both provisional Application No. 60/470,691, filed May 13, 2003, to Miñano, titled OPTICAL DEVICE FOR LED-BASED LIGHT-BULB SUBSTITUTE, and provisional Application No. 60/520,951, filed Nov. 17, 2003, to Falicoff et al., titled COLOR-MIXING COLLIMATOR, each of provisional Application Nos. 60/470,691 and 60/520,951 are incorporated herein by reference in their entirety; and U.S. Patent Application No. 10/461,557, filed Jun. 12, 2003, to Miñano, et al., entitled OPTICAL DEVICE FOR LED-BASED LIGHT-BULB SUBSTITUTE, now U.S. Pat. No. 7,021,797, which claims the benefit under 35 U.S.C. §119(e) of provisional Application No. 60/470,691, filed May 13, 2003, to Miñano, titled OPTICAL DEVICE FOR LED-BASED LIGHT-BULB SUBSTITUTE, each of U.S. patent application Ser. Nos. 11/970,462, 10/816,228, 10/814,598 and 10/461,557, and provisional Application No. 60/470,691 are incorporated herein by reference in their entirety;

this application is a continuation-in-part of U.S. patent application No. 11/890,601, filed Aug. 6, 2007 to Chaves et al., entitled OPTICAL MANIFOLD FORLIGHT-EMITTING DIODES, incorporated herein by reference in its entirety, which is a Divisional of U.S. patent application Ser. No. 11/115,055, filed Apr. 25, 2005 to Chaves et al., now U.S. Pat. No. 7,286,296, entitled OPTICAL MANIFOLD FOR LIGHT-EMITTING DIODES, incorporated herein by reference in its entirety, which claims the benefit under 35 U.S.C. §119(e) of: provisional Application No. 60/658,713, filed Mar. 3, 2005, entitled OPTICAL MANIFOLDS FOR LIGHT-EMITTING DIODES, incorporated herein by reference in its entirety; provisional Application No. 60/614,565, filed Sep. 29, 2004, entitled OPTICAL MANIFOLDS FOR LIGHT-EMITTING DIODES, incorporated herein by reference in their entirety; provisional Application No. 60/612,558, filed Sep. 22, 2004, entitled OPTICAL MANIFOLDS FOR LIGHT-EMITTING DIODES, incorporated herein by reference in their entirety; and provisional Application No. 60/564,847, filed Apr. 23, 2004, entitled OPTICAL MANIFOLDS FOR LIGHT-EMITTING DIODES, incorporated herein by reference in their entirety;

this application claims the benefit under 35 U.S.C. §119(e) of U.S. provisional Application No. 61/066,528, filed Feb. 21, 2008, titled SPHERICALLY EMITTING REMOTE PHOSPHOR, which is incorporated herein by reference in its entirety; and this application claims the benefit under 35 U.S.C. §119(e) of U.S. provisional Application No. 61/125,844, filed Apr. 29, 2008, titled SPHERICALLY EMITTING REMOTE PHOSPHOR, which is incorporated herein by reference in its entirety.

The present embodiments may be further understood and/or can also be utilized with the embodiments described in U.S. patent application Ser. No. 10/461,557, filed Jun. 12, 2003, to Minano et al., titled OPTICAL DEVICE FOR LED-BASED LIGHT-BULB SUBSTITUTE, which is incorporated herein by reference in its entirety; U.S. provisional Application No. 61/066,528, filed Feb. 21, 2008, titled SPHERICALLY EMITTING REMOTE PHOSPHOR; and U.S. provisional Application No. 61/125,844, filed Apr. 29, 2008, titled SPHERICALLY EMITTING REMOTE PHOSPHOR, both of which are incorporated herein by reference in their entirety.

BACKGROUND OF THE INVENTION

The present invention relates to light-emitting diodes (LEDs), particularly optical means for producing various far-field light intensity distributions for LEDs.

Conventional incandescent lamps of less than 100 lumens output can be matched by the latest white LEDs, albeit at a higher price. At this low end of the lumen range, the majority of incandescent applications are battery-powered. It is desirable to have an LED suitable for direct installation in the place of a burnt-out flashlight bulb.

LED's can offer superior luminous efficacy over the conventional incandescent lamps used in battery-operated flashlights. Moreover, LEDs are far more tolerant of shock, vibration, and crush-stress. Although they currently cost more to produce than the incandescents, their lifetimes are ten thousand times longer. For the sake of efficacy flashlight bulbs are run hot so they typically last only a few hours until filament failure. Also, the prices of LEDs continue to fall, along with those of the control-electronics to handle variations in battery voltage.

Indeed, LED flashlights are commercially available already, but their optics have to be adapted to the geometry of light-emitting diodes, which only emit into a hemisphere. Conventional LED lamps are unsuitable for direct installation into conventional flashlights, both electrically and optically. LED lamps are electrically unsuitable because they are current-driven devices, whereas batteries are voltage sources. Typical variations in the voltage of fresh batteries are enough to exceed an LED's tolerable operating-voltage range. This causes such high currents that the Ohmic heating within the die exceeds the ability of thermal conduction to remove it, causing a runaway temperature-rise that destroys the die. Therefore, a current-control device must accompany the lamp.

Conventional LED lamps are optically unsuitable for direct installation into the parabolic reflectors of flashlights. This is because their bullet-lens configuration forms a narrow beam that would completely miss a nearby parabola. Using instead a hemispherically emitting non-directional dome, centered on the luminous die, gives the maximum spread commercially available, a Lambertian pattern, with a $\sin^2 \theta$ dependence of encircled flux on angle $\theta$ from the lamp axis. Since $\theta$ for a typical parabolic flashlight reflector extends from 45° to 135°, an LED with a hemispheric pattern is mismatched because it's emission falls to zero at only $\theta=90°$. This would result in a beam that was brightest on the outside and completely dark halfway in. Worse yet, even this inferior beam pattern from a hemispheric LED would require that it be held up at the parabola's focal point, several millimeters above the socket wherein a conventional incandescent bulb is installed.

Another type of battery-powered lamp utilizes cylindrical fluorescent lamps. Although LEDs do not yet offer better luminous efficacy, fluorescent lamps nonetheless are relatively fragile and require unsafely high voltages. A low-voltage, cylindrical LED-based lamp could advantageously provide the same luminous output as a fluorescent lamp.

Addressing the needs above, U.S. patent application Ser. No. 10/461,557, OPTICAL DEVICE FOR LED-BASED LIGHT-BULB SUBSTITUTE, filed Jun. 12, 2003, which is hereby incorporated by reference in its entirety, discloses such LED-based lamps with which current fluorescent and incandescent bulb flashlights can be retrofitted. It often desirable, however, for LED lamps such as those described in U.S. patent application Ser. No. 10/461,557 to have other far-field intensity distributions of interest. Also, U.S. patent application Ser. No. 10/461,557 touched on the function of color mixing, to make the different wavelengths of chips 23, 24, and 25 of FIG. 2 of U.S. patent application Ser. No. 10/461,557 have the same relative strengths throughout the light coming out of ejector section 12. This assures that viewers will see only the intended metameric hue and not any colors of the individual chips. Previously, rectangular mixing rods have been used to transform the round focal spot of an ellipsoidal lamp into a uniformly illuminated rectangle, typically in cinema projectors. Generally, polygonal mixing rods worked best with an even number of sides, particularly four and six. With color mixing for LEDs, however, such rods are inefficient because half of an LED's Lambertian emission will escape from the base of the rod.

There is thus a need in the art for effective and optically suitable LED lamps with various far-field intensity distributions and have proper shaping of their transfer sections enabling polygonal cross-sections to be used.

SUMMARY OF THE INVENTION

The present invention advantageously addresses the needs above as well as other needs by providing an optical device for LED-based lamps with configurations for various far-field intensity distributions.

In some embodiments, an optical device for use in distributing radiant emission of a light emitter is provided. The optical device can comprise a lower transfer section, and an upper ejector section situated upon the lower transfer section. The lower transfer section is operable for placement upon the light emitter and further operable to transfer the radiant emission to said upper ejector section. The upper ejector section can be shaped such that the emission is redistributed externally into a substantial solid angle. In some preferred embodiments, the transfer section is a solid of revolution having a profile in the shape of an equiangular spiral displaced laterally from an axis of said solid of revolution so as to place a center of the equiangular spiral on an opposite side of the axis therefrom.

In some embodiments, an optical device for distributing the radiant emission of a light emitter is provided. The optical device can comprise a lower transfer section, and an upper ejector section situated upon the lower transfer section. The lower transfer section can be operable for placement upon the light emitter and operable to transfer the radiant emission to the upper ejector section. The upper ejector section can be shaped such that the emission is redistributed externally into a substantial solid angle. The ejector section can further comprise lower and connecting upper portions.

Some preferred embodiments provide an optical device for distributing radiant emissions of a light emitter. The optical device can comprise a transfer section, and an ejector section situated upon the transfer section. The transfer section is operable for placement adjacent with a light emitter and operable to transfer radiant emission from the light emitter to the ejector section. The ejector section is shaped such that the emission is redistributed externally into a substantial solid angle. In some embodiments, the ejector section has an upper surface with a profile of an equiangular spiral with a center at an upper edge of said transfer section. Some embodiments further provide for the ejector section to include a surface comprised of a radial array of V-grooves. Still further embodiments provide that a surface of said transfer section is comprised of an array of V-grooves. Further, the transfer section can be a polygonal, can be faceted and/or have other configurations.

In one embodiment, the invention can be characterized as an optical device for distributing radiant emission of a light emitter comprising a lower transfer section and an upper ejector section situated upon the lower transfer section. The lower transfer section is operable for placement upon the light emitter and operable to transfer the radiant emission to the upper ejector section. The upper ejector section is shaped such that the light within it is redistributed out an external surface of the upper ejector section into a solid angle substantially greater than a hemisphere, and approximating that of an incandescent flashlight bulb. The ejector section is positioned at the same height as the glowing filament of the light bulb it replaces. It is easier to optically move this emission point, using the transfer section, than to put the LED itself at such a height, which would make heat transfer difficult, among other problems that the present invention advantageously addresses.

In another embodiment, this invention comprises a multiplicity of such transfer sections joined end-to-end, with two LED sources at opposite ends of this line-up. These transfer sections have slightly roughened surfaces to promote diffuse emission, so that the entire device acts as a cylindrical emitter, and approximating the luminous characteristics of a fluorescent flashlight bulb.

Other embodiments comprise a compound elliptical concentrator transfer section and an ejector section with a photostimulative layer, for example a coating of a photostimulative phosphor, on its external surface. The light source for the transfer section can comprise an array of blue LEDs, at a wavelength that stimulates the phosphor to emit yellow light, which combines with the blue light to produce a white output. The ejector section can be spherical, for spherical emission, conical, for partially spherical emission, or other relevant configurations. A thickness of the phosphor coating can be selected in accordance with a color temperature of the output white light.

Other embodiments provide optical devices that distribute radiant emissions of light. These embodiments comprise a lower transfer section; and an upper ejector section situated upon the lower transfer section, said lower transfer section operable for placement upon a light emitter and operable to transfer through total internal reflection radiant emission to said upper ejector section, said upper ejector section shaped such that the emission is redistributed externally into a substantial solid angle.

Still other embodiments provide optical device in distributing radiant emissions, where the optical device comprises a lower transfer section comprising an expanding portion and an contracting section; and an upper ejector section optically cooperated with the expanding portion of the lower transfer section, said lower transfer section operable for placement upon a light emitter and operable to transfer radiant emission to said upper ejector section, said upper ejector section comprising a photostimulative layer extending about the ejector section, where the photostimulative layer comprises a photostimulative component.

Some embodiments provide optical devices for use in distributing radiant emission. At least some of these devices comprise a transfer section optically configured to receive radiant emission; and an ejector section situated adjacent and optically coupled with the transfer section, said transfer section configured to transfer the radiant emission to said ejector section, said ejector section comprising a sphere.

Still other embodiments provide optical devices for use in distributing radiant emission that comprise a transfer section optically configured to receive radiant emission; and an ejector section situated adjacent and optically coupled with the transfer section, said transfer section configured to transfer the radiant emission to said ejector section, said ejector section comprising a cone extending from an interface of the transfer section and the ejector section.

A better understanding of the features and advantages of the present invention will be obtained by reference to the following detailed description of the invention and accompanying drawings, which set forth an illustrative embodiment in which the principles of the invention are utilized.

BRIEF DESCRIPTION OF THE DRAWINGS

The above and other aspects, features and advantages of the present invention will be more apparent from the following more particular description thereof, presented in conjunction with the following drawings wherein:

FIGS. 1a through 38b are cross sectional views of LED lamps having various configurations of transfer and ejector lens sections (hereafter called virtual filaments) according to the present invention, with each cross sectional view accompanied, respectively, by the individual configuration's far field pattern.

FIG. 42a is a perspective view of the configuration of FIG. 37a according to the present invention.

FIG. 42b is a perspective view showing the vector triad on the configuration of FIG. 42a according to the present invention.

FIG. 43 is a perspective view of the construction of a V-groove on a curved surface according to the present invention.

FIG. 48c depicts a 300° emission pattern produced by the collar of FIG. 48a.

Corresponding reference characters indicate corresponding components throughout the several views of the drawings, especially the explicit label in FIG. 1a of LED package 20 being implied throughout FIG. 2a to FIG. 38a.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

The present embodiments provide light sources with predefined far-field intensities. The present embodiments can be utilized in numerous applications. For example, in some applications, the embodiments can be utilized to replace and/or substitute for other types of light sources, such as compact light sources, incandescent light sources, florescent light sources and other light sources. As a further example, the present embodiments can be utilized in replacing incandescent light sources in flight lights and other devices using incandescent light sources.

The present embodiments can also be utilized with the embodiments described in co-pending U.S. Provisional Patent application No. 60/520,951, filed Nov. 17, 2003, incorporated herein by reference in its entirety. The surface faceting configuration presented herein in FIG. 49A and FIG. 49B, and in co-pending U.S. Provisional Patent Application No. 60/520,951, filed Nov. 17, 2003, can be employed in variations of all of the non-faceted embodiments shown herein in order to achieve the color mixing and other benefits thereof.

The present embodiments can further be utilized with the embodiments of and in the applications described in U.S. Provisional Patent Application No. 60/470,691, filed May 13, 2003, and U.S. patent application Ser. No. 10/461,557, filed Jun. 12, 2003, incorporated herein by reference in their entirety. For example, the present embodiments can be utilized in the light sources described in U.S. Provisional Patent Application No. 60/470,691, filed May 13, 2003, and U.S. patent application Ser. No. 10/461,557, filed Jun. 12, 2003.

Still further, LED white-light sources can be utilized, according to some embodiments, with similar spherical type of emission as conventional light bulbs. Some of these embodiments comprise a remote phosphor (e.g., with blue LEDs separated from the yellow phosphor they stimulate), and some embodiments further employ highly efficient blue-delivery optics as described below.

FIGS. 1a through 38b are cross sectional views of LED lamps having various configurations of transfer and ejector lens sections (hereafter called virtual filaments) according to some present embodiments, with each cross sectional view accompanied, respectively, by the individual configuration's far field pattern.

Figure 1A:
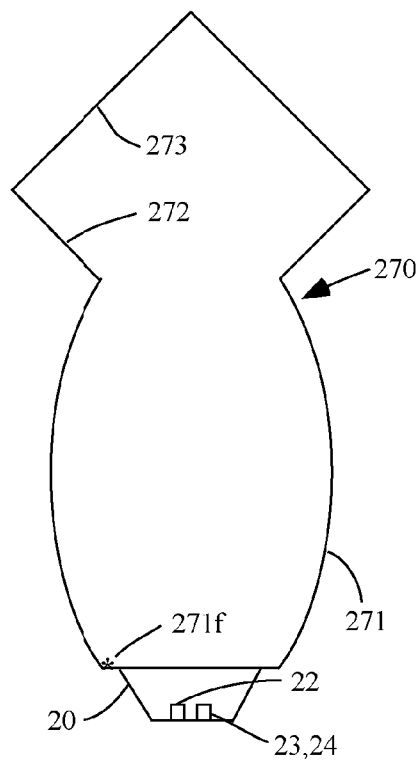
Figure 1B:
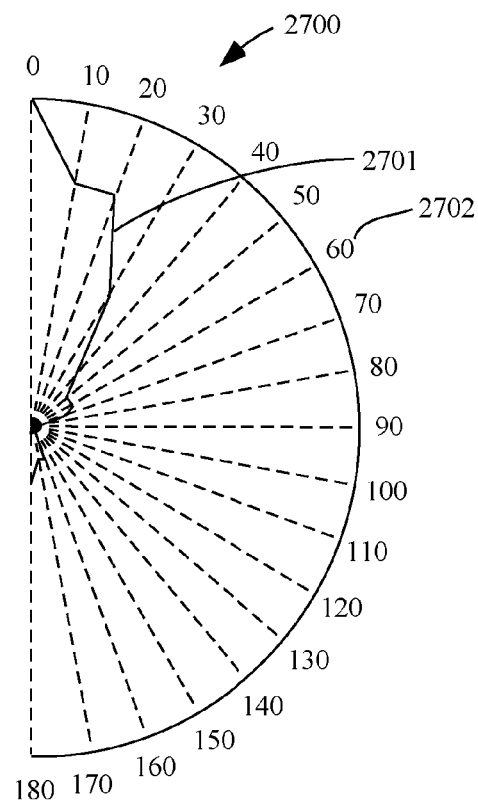

Only FIG. 1b has the labels that are implicit in all the output patterns of the preferred embodiments in the figures that follow: semicircular polar plot 2700 shows normalized far-field distribution 2701 on semi-circular angular scale 2702, with off-axis angle, with zero denoting the on-axis direction, and 180° the opposite direction, totally backward. This is possible for those preferred embodiments having some sideways extension so that 180° is unimpeded by the source.

In FIG. 1a only, the light source is designated as LED package 20 with LED chips 22, 23, and 24, but the same package-outline is depicted without labels in all subsequent figures of virtual filaments. This LED package represents but one possible way for the present invention to utilize multiple light emitters. Such multiple chips can have identical or different wavelengths. For example, the different wavelengths can be red, green, and blue wavelengths that span a chromaticity gamut for human color vision, or amber, red, and infrared wavelengths for night-vision devices, or other combinations of different wavelengths.

Similarly in FIG. 1a only, the position of the focus of ellipse segment 271 is shown by star 271f. In all subsequent figures, the focus of the profile of the transfer section is also near the bottom point of the same curve on an opposite side of a central axis.

FIG. 1a shows virtual filament 270 comprising compound elliptical concentrator (hereinafter CEC) transfer section 271, and an ejector section comprising outward slanting lower cone 272 and inward slanting upper cone 273. FIG. 1b shows that the far-field distribution of this preferred embodiment peaks in the forward direction with a ±20° extent.

Figure 2A:
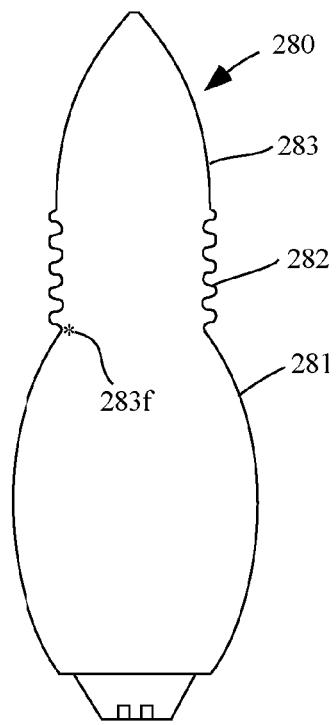
Figure 2B:
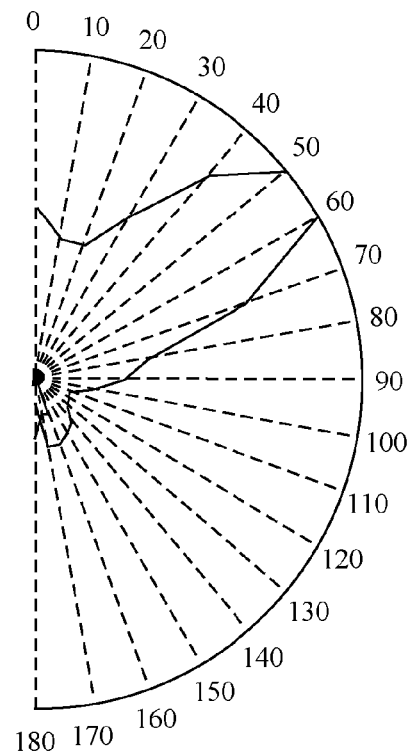

FIG. 2a shows virtual filament 280 comprising CEC transfer section 281, multiple stacked toroids 282, and ejector section 283, shaped as an equiangular spiral with origin at point 283f. FIG. 2b shows that the maximum far-field intensity of this preferred embodiment lies on angles from about 50° to 60° off-axis, a so-called bat-wing distribution.

FIG. 3a shows virtual filament 290, comprising CEC transfer section 291, cones 292 and 293, and equiangular spirals 294 and 295. Predominantly horizontal equiangular spiral 294 has its center at central point 294f. Equiangular spiral profile 295 has oppositely situated center 295f. FIG. 3b shows the far-field distribution of this preferred embodiment, peaking at 40° off-axis and mostly confined to the range of 10-70°, also with a secondary lobe from 150-170°.

FIG. 4a shows virtual filament 300 comprising CEC section 301, flat 302, sideways equiangular spiral 303 with center at point 303f, and top equiangular spiral 304 with center at point 304f. FIG. 4b shows a subtle tuning of the far-field resulting from the noticeable profile-modification, as shown in FIG. 4a, of the preferred embodiment shown in FIG. 3a. FIG. 4b shows that the far-field distribution of this preferred embodiment has a primary maximum on a main lobe between 40° and 60° off-axis, and a secondary maximum on a secondary rear lobe extending between 160° and 170°, nearly backwards. The next preferred embodiment is a modification of this one.

FIG. 5a shows virtual filament 310 with CEC transfer section 311, planar annulus 312, equiangular spiral 313 with center at axial point 313f, and upper equiangular spiral 314 with center at opposite point 314f. In addition to elements in correspondence with those of FIG. 4a are inward slanting steep cone 315, upward slanting shallow cone 316, and upper flat circle 317. The normalized far-field pattern of this preferred embodiment differs significantly from the previous, as shown in FIG. 5b, with a fluctuating forward lobe and a half-strength rear lobe.

Delving further on the theme of minor modifications, FIG. 6a shows virtual filament 320 comprising CEC transfer section 321, planar annulus 322, equiangular spiral 323 with axial position of its center as shown by star 323f, upper equiangular spiral 324 with center at opposite point 324f, and a new element—central upper equiangular spiral 327, also with center at 324f. In similarity to FIG. 5a, virtual filament 320 also comprises inwardly slanting steep cone 325 and upward shallow cone 326. The normalized far-field pattern of the preferred embodiment of FIG. 6a is shown by FIG. 6b to be mainly between 30° and 50° off axis, with a rear lobe from 120° to 170°, with reduced forward emission as compared to FIG. 5b.

FIG. 7a depicts a preferred embodiment that is the result of small modifications of virtual filament 320 of FIG. 6a. FIG. 7a is a cross-section of virtual filament 330, comprising CEC transfer section 331, slanting conical section 332, horizontal equiangular spiral 333 with center at axial point 333f, steep conic edge 335, vertical equiangular spiral 334 with oppositely situated center 334f, and central cone 336. FIG. 7b shows its far-field intensity concentrated in a forward lobe within ±20° of the axis, with a strong rearward lobe peaking at 150°.

Continuing the theme of component modifications, FIG. 8a depicts virtual filament 340 comprising CEC transfer section 341, planar annulus 342, inwardly slanting steep cone 335, downward slanting shallow cone 346, outer edge 348, horizontal equiangular spiral 343 with center at off-axis point 343f, vertical equiangular spiral 344 with center at opposite point 344f, and upper equiangular spiral 347, also with center at opposite point 344f. FIG. 8b shows that its far field pattern has a collimated anti-axial beam and a broader ±30° forward beam.

Figure 9A:
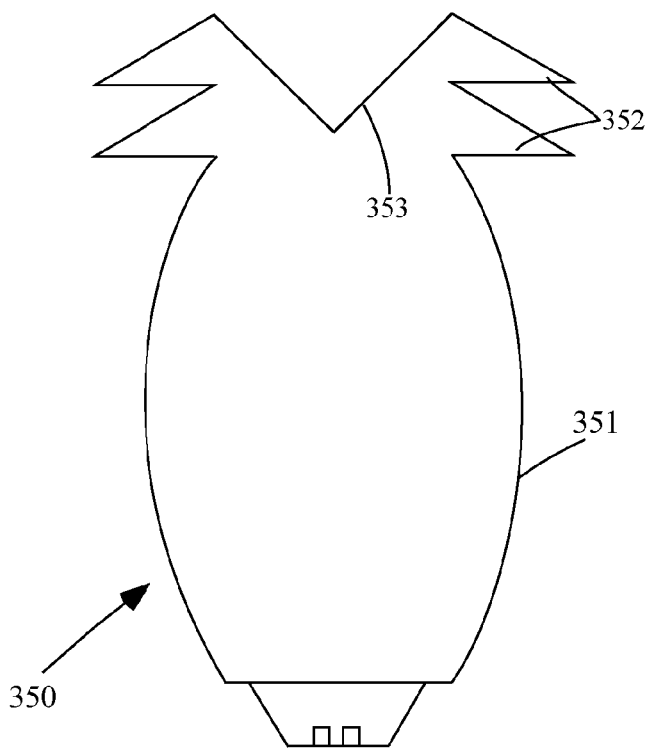
Figure 9B:
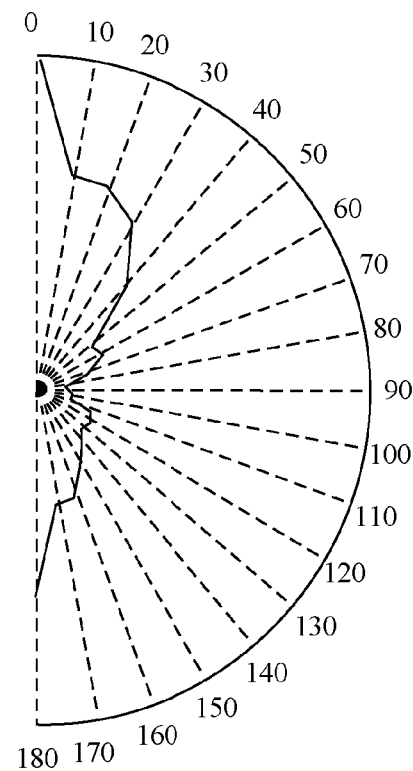

FIG. 9a depicts virtual filament 350 comprising CEC transfer section 351, dual conical flanges 352, and upper conic indentation 353. FIG. 9b shows that its far-field pattern has strong forward and rear lobs, but some side emission.

Figure 10A:
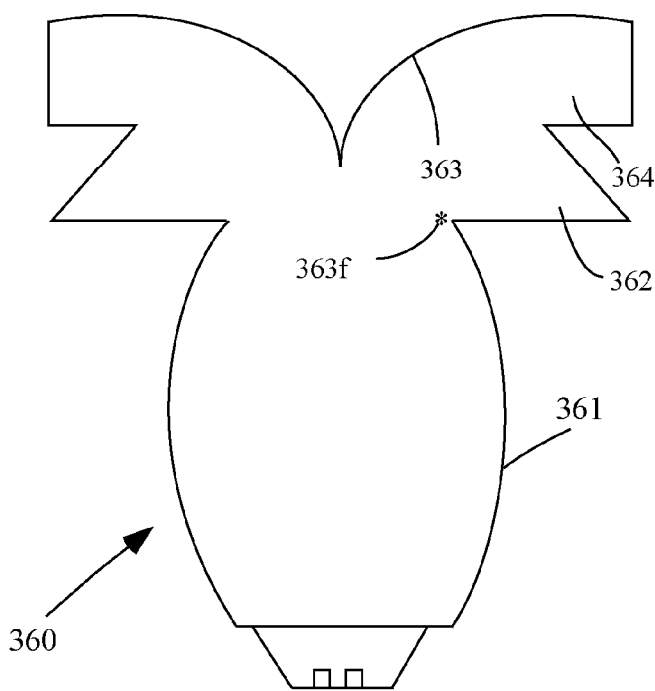
Figure 10B:
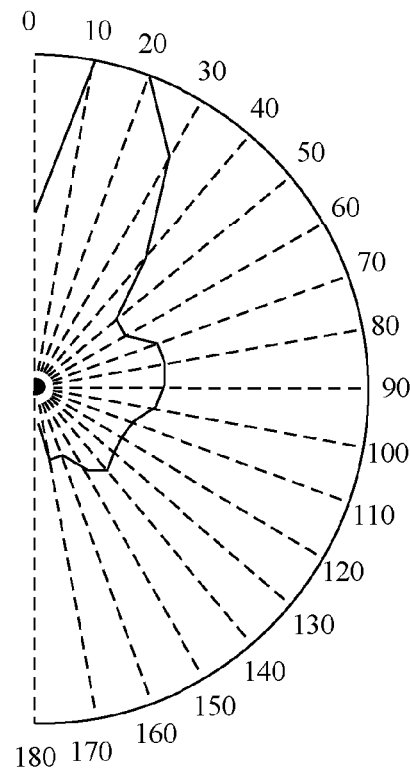

FIG. 10a depicts virtual filament 360 comprising CEC transfer section 361, conical flange 362, upper equiangular spiral indentation 363 with center at proximal point 363f, and cylindrical flange 364. FIG. 10b shows how the rearward emission of FIG. 9b has been eliminated.

FIG. 11a depicts another variation of FIG. 10a. Virtual filament 370 comprises CEC transfer section 371, dual conic flanges 372, central conic indentation 373, set into central cylinder 374. The far field pattern of FIG. 11b shows a forward ±30° main lobe and a small secondary lobe at 125°.

FIG. 12a depicts a variation of component proportions in the preferred embodiment of FIG. 11a. Virtual filament 380 comprises CEC transfer section 381, dual conic flanges 382, and central conic indentation 383. The far field intensity pattern of FIG. 12b shows the same overall forward and backward emphasis of FIG. 9b, with differing details.

FIG. 13a depicts virtual filament 390 comprising CEC transfer section 391, spheric section 392, and central conic indentation 393. In similarity to spheric ejector section 72 of FIG. 7 of U.S. patent application Ser. No. 10/461,557, both surfaces 392 and 393 are diffusing, in that rays from within and going through them are scattered diffusely into air. FIG. 13b shows a strong forward lobe of ±40° superimposed on a weaker emission that is nearly omnidirectional.

FIG. 14a depicts virtual filament 400 comprising CEC transfer section 401, steeply slanting cone 402, outer equiangular spiral 403 with axially located center 403f, and inner equiangular spiral 404 with center at proximal point 404f. As shown in FIG. 14b, its far field intensity pattern has no rearward energy, and somewhat approximates a Lambertian pattern.

Figure 15A:
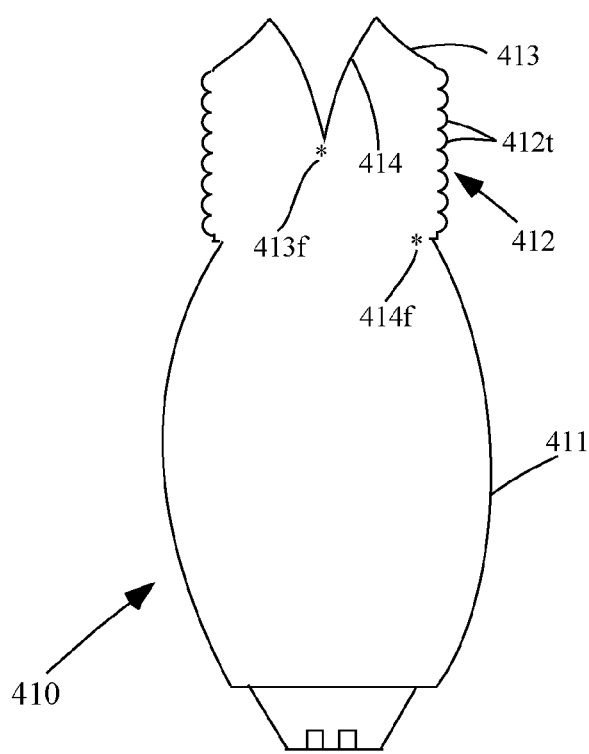
Figure 15B:
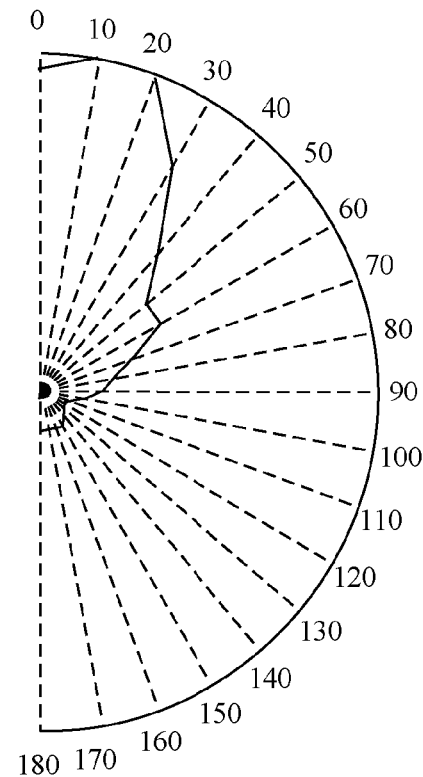

In a variant of the previous figure, FIG. 15a depicts virtual filament 410 comprising CEC transfer section 411, cylindrical stack 412 of multiple toroidal sections 412t, inner equiangular spiral 414 with center at proximal point 414f, and upper curve 413 tailored to refract rays coming from 414f and being reflected at 414 and direct them tangent to 413. FIG. 15b shows the resultant far-field pattern to be mostly forward, within ±30°.

Figure 16A:
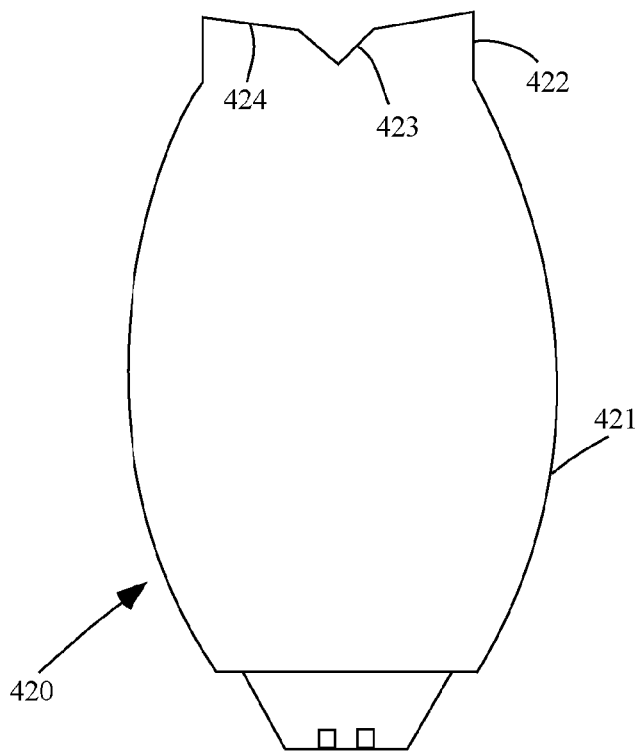
Figure 16B:
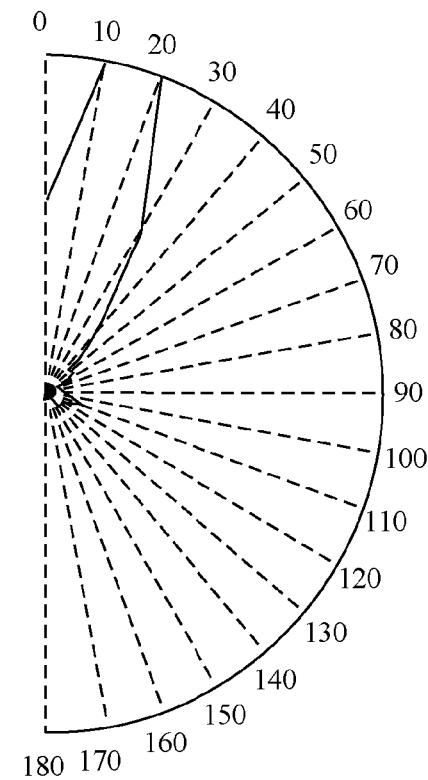

FIG. 16a depicts virtual filament 420, comprising CEC transfer section 421, cylinder 422, conical indentation 423 in shallower top cone 424. FIG. 16b shows its far-field pattern is mostly between 10° and 20° off axis.

Figure 17A:
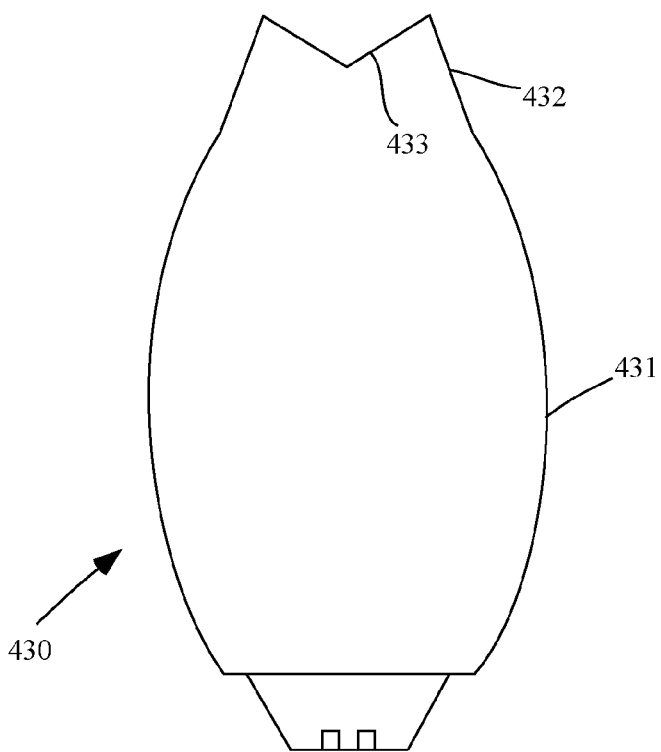
Figure 17B:
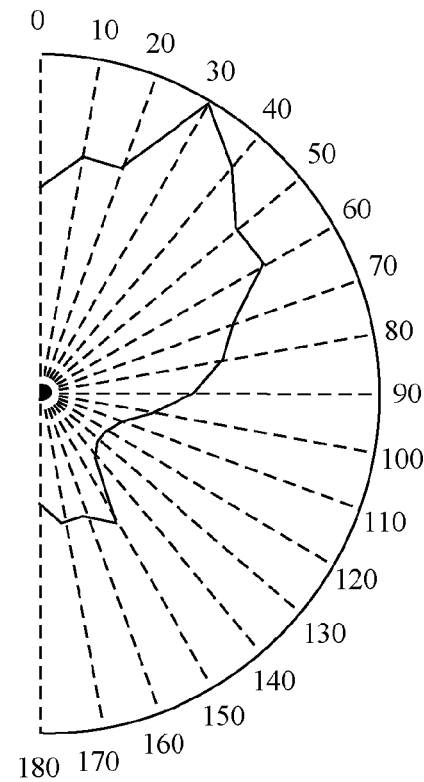

FIG. 17a depicts virtual filament 430, comprising CEC transfer section 431, outer cone 432, and inner conical indentation 433. In spite of the small differences from FIG. 16a, the far-field pattern of FIG. 17b is considerably different from that of FIG. 16b.

Figure 18A:
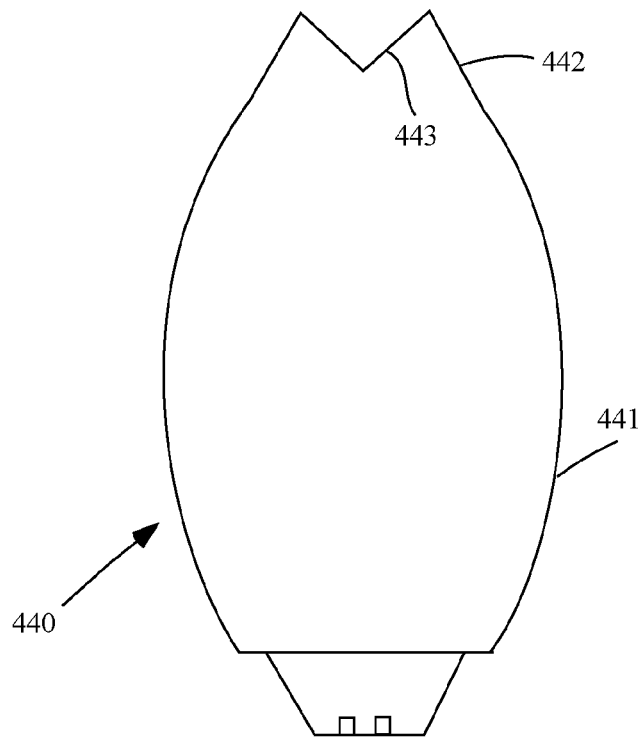
Figure 18B:
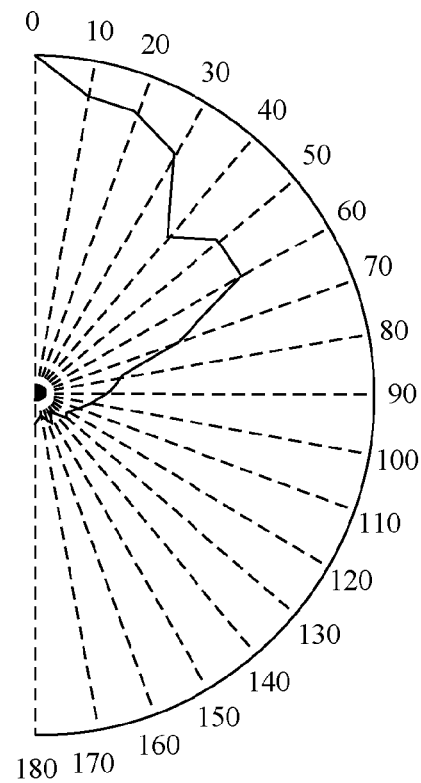

FIG. 18a depicts virtual filament 440, comprising CEC transfer section 441, outer cone 442, and inner conical indentation 443. In spite of the small differences of this preferred embodiment from that of from FIG. 17a, the far-field pattern of FIG. 18b is narrower than that of FIG. 17b.

Figure 19A:
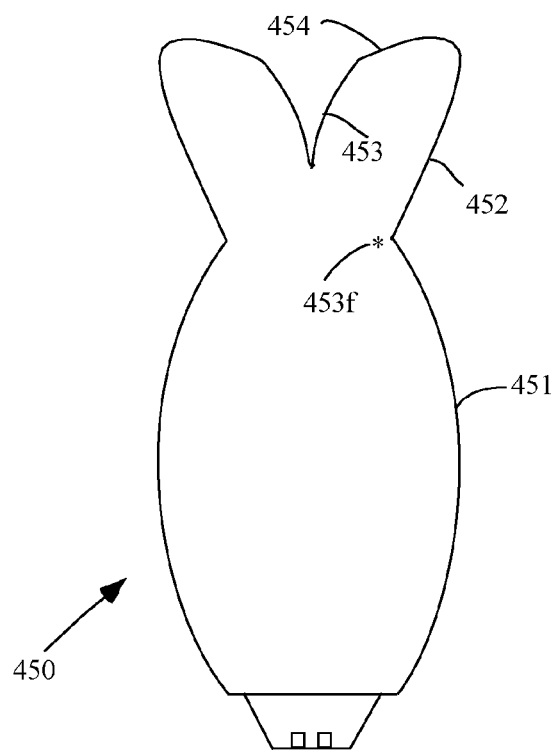
Figure 19B:
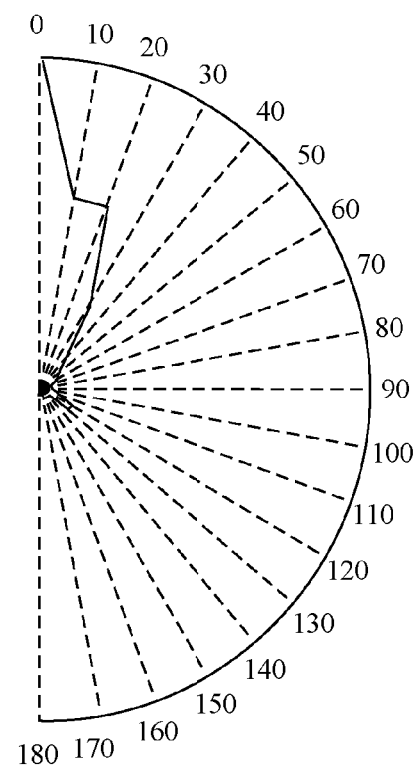

FIG. 19a depicts virtual filament 450 comprising CEC transfer section 451, spline curve 452, central equiangular spiral 453 with center at proximal point 453f, and surrounding top conic indentation 454. FIG. 19b shows its far-field pattern is predominantly forward, with ±20° at the half-power point.

Figure 20A:
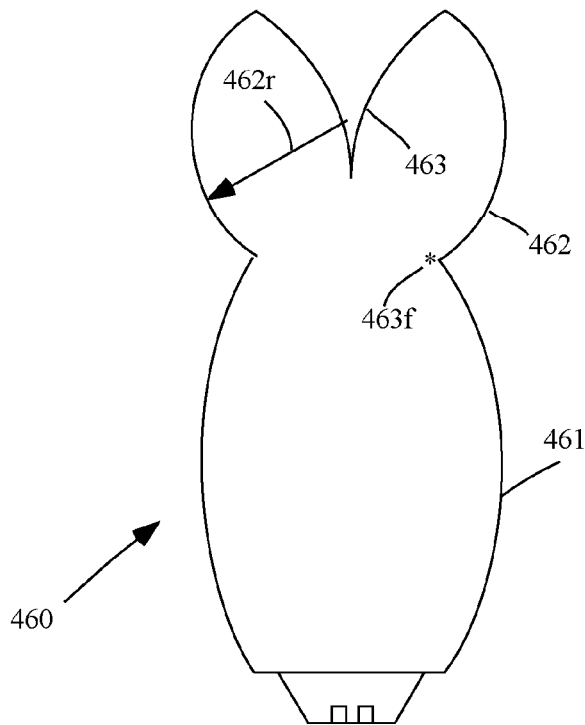
Figure 20B:
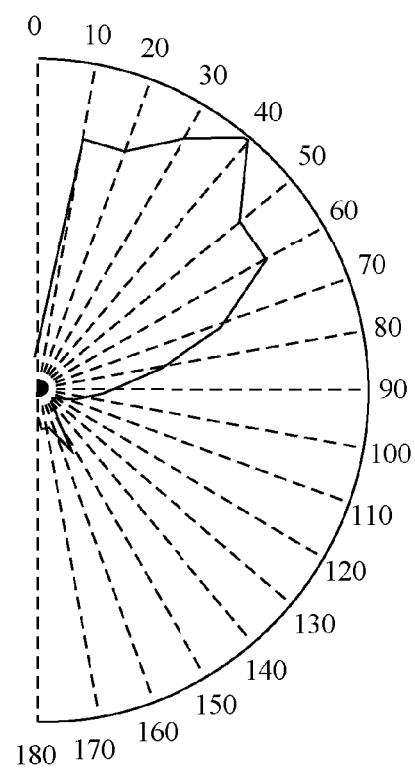

FIG. 20a depicts virtual filament 460 comprising CEC transfer section 461, spheric section 462 with radius 462r that equals 0.38 times the height of section 461, and central equiangular spiral 463 with center at proximal point 463f. FIG. 20b shows its far-field pattern to lie between 10° and 60° off axis.

FIG. 21a depicts another similar configuration, virtual filament 470 comprising CEC transfer section 471, spheric section 472 with radius 472r that is 0.7 times the height of section 471, and central equiangular spiral 473 with center at proximal point 473f. FIG. 21b shows that the far-field pattern has significantly narrowed from the previous one.

FIG. 22a depicts another similar configuration, virtual filament 480 comprising CEC transfer section 481, spheric section 482 with radius 482r that is 0.8 times the height of section 481, and central equiangular spiral 483 with center at proximal point 483f. Spheric section 482 is partially covered with multiple convex toroidal lenslets 482t. FIG. 22b shows that the far-field pattern undergoes only minor change from the previous one, with narrowing of the central beam compared to that seen in FIG. 21b.

FIG. 23a depicts virtual filament 490 comprising CEC transfer section 491, spheric section 492 with radius 492r that is 0.62 times the height of section 491, section 492 being fully surfaced by multiple toroidal lenslets 492t, and central equiangular spiral 493 with center at proximal point 493f. FIG. 23b shows how these lenslets greatly broaden the far-field pattern over that of FIG. 22b.

FIG. 24a depicts virtual filament 500 comprising CEC transfer section 501, spheric section 502 with radius 502r that is 0.76 times the height of section 501, section 502 being surfaced by multiple convex toroidal lenslets 502t, and central equiangular spiral 503 with center at proximal point 503f. FIG. 24b shows that the far field pattern is not greatly changed from that of FIG. 23b, by section 502 having a somewhat larger radius than that of section 492 of FIG. 23a.

FIG. 25a depicts virtual filament 510 comprising CEC transfer section 511, spheric section 512 with radius 512r that is equal to the height of section 511, section 512 surfaced by multiple convex toroidal lenslets 512t, and central equiangular spiral 513 with center at proximal point 513f. FIG. 25b shows that the far field pattern is now considerably changed from that of FIG. 24b, due to the larger radius of section 512 than that of section 502 of FIG. 24a.

FIG. 26a depicts virtual filament 520 comprising CEC transfer section 521, lower spline section 522, central equiangular spiral 523 with center at proximal point 523f, and outer cylindrical section 524 covered with multiple convex toroidal lenslets 524t. FIG. 26b shows a very broad pattern that does not vary much until 130° and is only reduced by half at 180°.

FIG. 27a depicts virtual filament 530 comprising CEC transfer section 531, conical section 532, central equiangular spiral 533 with center at proximal point 533f, and cylindrical stack 534 surfaced by multiple convex toroidal lenslets 534t. FIG. 27b shows that this substitution of a cone for a tailored spline causes the far-field pattern to drop in the near-axis angles, as compared to FIG. 26b. In the following FIGURE there are no such lenslets.

FIG. 28a depicts virtual filament 540 comprising CEC transfer section 541, conic section 542, central equiangular spiral 543 with center at proximal point 543f, and outer cylinder 544. FIG. 28b shows that the far-field pattern of this preferred embodiment is much narrower without the lenslets 534t of FIG. 27a.

FIG. 29a depicts virtual filament 550 comprising CEC transfer section 551, shallow upward cone 552, central equiangular spiral 553 with center at proximal point 553f, and outer concave spline 554. FIG. 29b shows its far-field pattern, with substantial axial emission.

FIG. 30a depicts virtual filament 560 comprising CEC transfer section 561, planar annulus 562, central equiangular spiral 563 with center at proximal point 563f, and outer cylinder 564. FIG. 30b shows its far-field pattern FIG. 31a depicts virtual filament 570 comprising CEC transfer section 571, planar annulus 572, central equiangular spiral 573 with center at proximal point 573f, and outer conical edge 574. FIG. 31b shows that far-field emission is predominantly forward.

FIG. 32a depicts virtual filament 580 comprising CEC transfer section 581, planar annulus 582, upper equiangular spiral 583 with center at proximal point 583f, outer cylinder 584 surfaced with concave toroidal lenslets 584t, and central upper cone 585. FIG. 32b shows that its far-field pattern is predominantly forward, with full intensity within ±30°.

FIG. 33a depicts virtual filament 590 comprising equiangular-spiral transfer section 591 with center at opposite point 591f, outward cone 592, central indentation 593 shaped as a higher-order polynomial, and steep outer cone 594, and surfaces 595, 596, and 597 forming a slot. Its far-field pattern is shown in FIG. 33b, with a sharp cutoff at 150° off-axis and only 2:1 variation from uniform intensity at lesser angles.

FIG. 34a depicts virtual filament 600 comprising equiangular-spiral transfer section 601 with center on opposite point 601f, protruding cubic spline 602, and central equiangular spiral 603 with center at proximal point 603f. Its far field pattern is shown in FIG. 34b, and is to be compared with those of the following two preferred embodiments, in which the cubic spline protrudes more.

FIG. 35a depicts virtual filament 610 comprising equiangular-spiral transfer section 611 with center at opposite point 611f, protruding cubic spline 612, and central equiangular spiral 613 with center at proximal point 613f. FIG. 35b shows that its far field pattern has reduced on-axis intensity compared with FIG. 34b.

FIG. 36a depicts virtual filament 620 comprising equiangular-spiral transfer section 621 with center at opposite point 621f, protruding cubic spline 622, and central equiangular spiral 623 with center at proximal point 623f. FIG. 36b shows that its far field pattern has reduced on-axis intensity compared with FIG. 35b.

FIG. 37a depicts virtual filament 630 comprising equiangular-spiral transfer section 631 with center at opposite point 631f, planar annulus 632, central equiangular spiral 633 with center at proximal point 633f, and outer cylinder 634. FIG. 37b shows that its far field pattern has no on-axis intensity. FIG. 37b can be compared with FIG. 30b, given the similarity of FIG. 37a to FIG. 30a.

FIG. 38a depicts virtual filament 640 comprising equiangular-spiral transfer section 641 with center at opposite point 641f, lower conical section 642, upper conical section 643, and outer spline curve 644. FIG. 38b shows the far-field pattern. Cone 642 is a white diffuse reflector with Lambertian scattering, so that unlike the diffuse transmissive surface 392 of FIG. 13a, it only reflects light falling on it.

Previous embodiments have complete circular symmetry, since they are formed by a 360° cylindrical profile-sweep. Thus they have no azimuthal shape variation, only the radial variation of the profile. This is because real-world 360° output patterns do not call for azimuthal variation. There is one type of azimuthal shape variation, however, having no azimuthal intensity variations in its light output. This is the V-groove.

Figure 39:
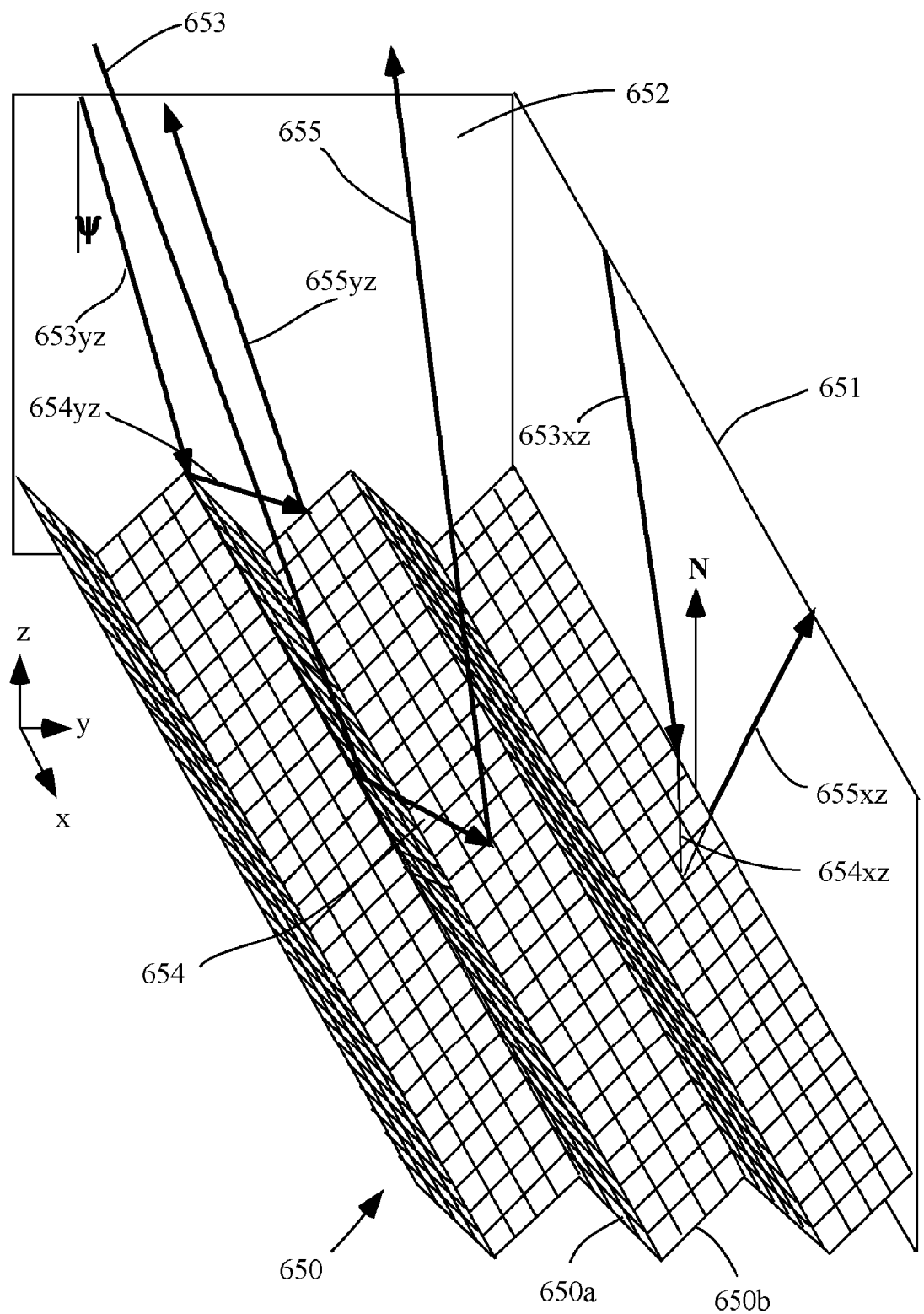
FIG. 39 is a perspective view of a linear array of V-grooves.

The geometry of a linear array of V-grooves is shown in FIG. 39. Reflective 90° V-groove array 650 is bordered by x-z plane 651 and y-z plane 652. Incoming ray 653 is reflected at first groove wall 650a become bounce ray 654, then reflected at second groove wall 650b to become outgoing ray 655. Incoming ray 653 has projection 653yz on border plane 652 and projection 653xz on border plane 651. Bounce ray 654 has projection 654yz on border plane 652 and projection 654xz on border plane 651. Outgoing ray 655 has projection 655yz on border plane 652 and projection 655xz on border plane 651.

FIG. 39 also shows macrosurface normal N lying perpendicular to the plane of V-groove array 650, which in the case of FIG. 39 is the xy plane. The directions of projected rays 653xz and 655xz obey the law of reflection from a planar mirror with the same surface normal. But on yz plane 652, outgoing projection 655yz has the opposite direction of incoming projection 653yz, which has in-plane incidence angle Ψ. Thus linear V-groove array 650 acts as a combination of retroreflector and conventional reflector. That is, when incoming ray 653 has direction vector (p,q,r), then outgoing ray 655 has direction vector (p,-q,-r). This condition, however, only holds for those rays undergoing two reflections. Of all possible input-ray directions, the fraction that is reflected twice is $1-\tan(\Psi)$.

The configuration pertinent to the present invention is when surface 650 is the interface between a transparent dielectric, such as acrylic or polycarbonate, lying above the surface (i.e. positive z) and air below it. The particular case shown in FIG. 39 is also valid for total internal reflection, which occurs whenever the incidence angle θ of a ray on the dielectric-air interface exceeds the local critical angle $$\theta_c = \arcsin(1/n)$$ for refractive index n.

Since the unitary normal vectors on the 2 sides of the grooves are $(0,\sqrt{0.5},\sqrt{0.5})$ and $(0,\sqrt{0.5},\sqrt{0.5})$, the condition for total internal reflection can be vectorially expressed as $$(p,q,r)\cdot(0,\sqrt{0.5},\sqrt{0.5}) < \cos\theta_c$$

which can be rearranged to yield $$|q|+\sqrt{(1-p^2-q^2)} < \sqrt{[2(1-1/n^2)]}.$$

Figure 40:
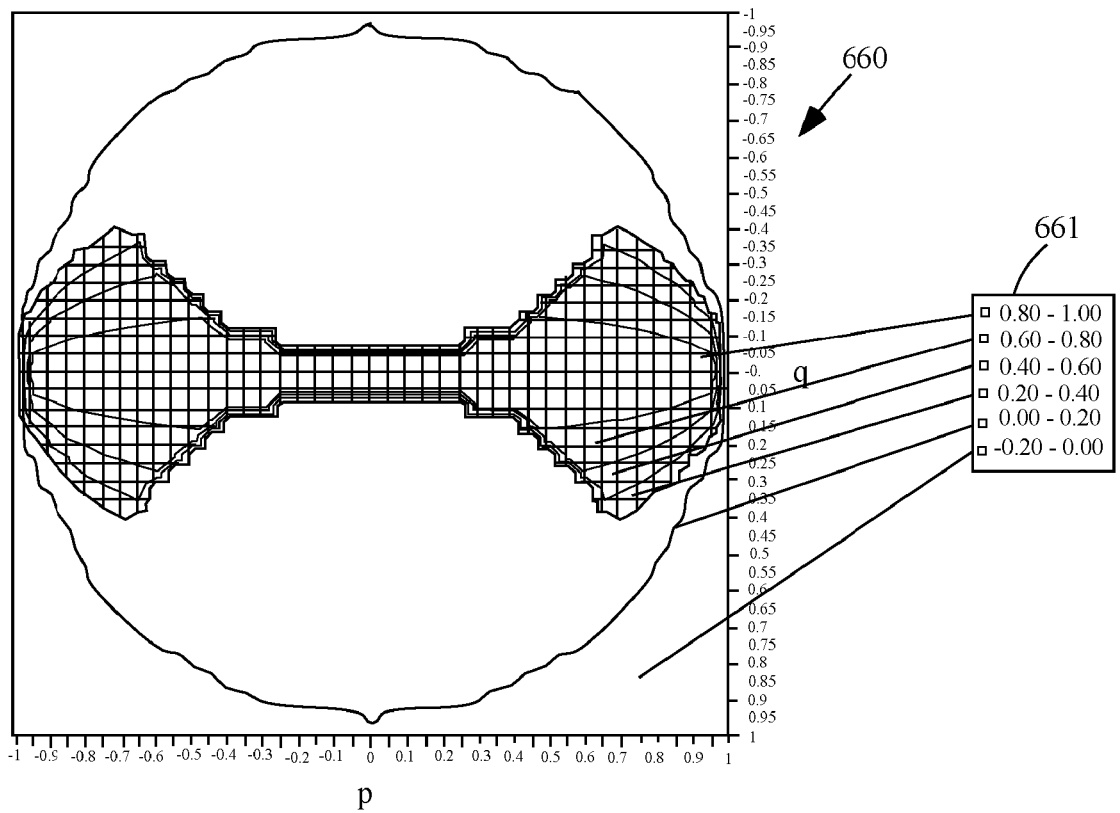
FIG. 40 is a diagram of the angles reflected by a linear V-groove array.

FIG. 40 shows contour graph 660 with abscissa p and ordinate q. Legend 661 shows the fraction of rays that are retroreflected by total internal reflection. For p=0, the maximum q value for which there is total internal reflection for the 2 reflections is $$|\cos^{-1}q| < 45° - \theta_c$$

which amounts to a vertical width of ±2.8° for acrylic (n=1.492) and ±6° for polycarbonate (n=1.585). These small angles are how much such incoming rays are not in plane 651.

Figure 41:
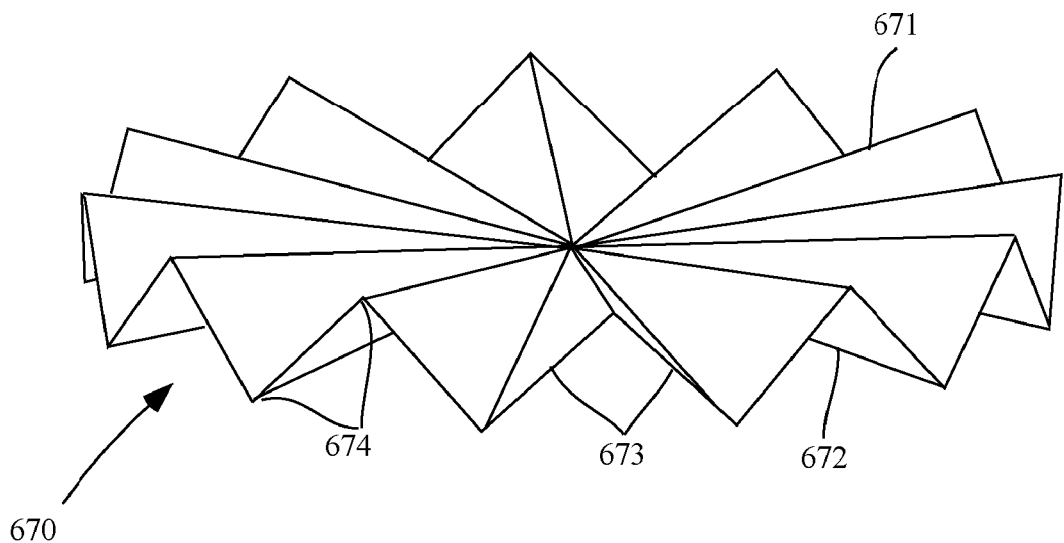
FIG. 41 is a perspective view of a radial array of V-grooves.

More pertinent to the present invention is radial V-groove array 670 shown in FIG. 41. Crest-lines 671 and trough-lines 672 are the boundaries of planar triangles 673, which meet at the crest-lines and trough-lines with 90° included angles 674.

In FIG. 37a, the genatrix curve of upper surface 633 has the form of an equiangular spiral. It is possible to impose a radial V-groove array on such a surface, so that crest-lines 671 of FIG. 41 would become curved downward, depressing the center point.

FIG. 42a is a perspective view of the preferred embodiment of FIG. 37a. Virtual filament 680 comprises equiangular-spiral transfer section 681, equiangular-spiral top surface 683, and cylindrical side surface 684, the apparently polygonal shape of which is a pictorial artifact. Crest curves 683c are shown as twelve in number, to correspond with crest-lines 671 of FIG. 41.

FIG. 42b is another perspective view of the same preferred embodiment, but with surfaces 683 and 684 of FIG. 42a removed. Twelve crest-curves 683c are shown, one shown with tangent vector t, normal vector n, and their vector product the binormal vector b=t×n. If a crest-curve were the path followed at uniform speed by a particle, then its velocity vector lies along tangent vector t and its acceleration vector is the negative the normal vector n. The latter is so that it will coincide with the surface normal of the surface. Because each crest-curve lies in a plane, binormal vector b is constant, meaning the crest-curves have zero torsion.

FIG. 43 is a perspective view of the construction of a V-groove on a curved surface according to the present invention.

In modifying surface 683 of FIG. 42a to become like radial-groove array 670 of FIG. 41, the curvature of the crest-lines would make the groove surfaces become non-planar. In fact, such surfaces would be the envelopes of elemental planes coming off each point on the curve at a 45° angle, as shown in FIG. 43. Incompletely swept equiangular spiral surface 690 is identical to surface 683 of FIG. 42a. Part of the sweep is unfinished so that crest-curve 691 can be clearly seen. Tangent to it are three elemental planar ridges 692 with 90° interior angles. Let a crest curve be specified by the parametric function P(t), where t is the path-length along said crest-curve, with normal vector n(t) and binormal vector b(t). Any point X on a 45° plane touching the crest-curve at P(t) is specified by $$(X-P(t)) \cdot (n(t) \pm b(t)) = 0 \qquad (1)$$

with the '±' referring to there being two such 45° planes corresponding to the walls of a 90 V-groove. Varying t gives a family of such planes. In order to calculate the envelope surface to this family of planes, differentiate Equation (1) with respect to parameter t, giving $$-\frac{dP(t)}{dt} \cdot (n(t) \pm b(t)) + (X - P(t)) \cdot \left(\frac{dn(t)}{dt} \pm \frac{db(t)}{dt}\right) = 0 \qquad (2)$$

The orthogonal vector triad formed by the parametrically specified unit vectors t(t), n(t), and b(t) is called the Frenet frame of the curve it follows as t varies. Each of these three vectors has a definition based on various derivatives of the equation for P(t). Differentiating these definitions with respect to t gives the Frenet equations, well-known in differential geometry. A laborious combination of the Frenet equations with Equation (2), and eliminating t, finally yields $$(X-P(t)) \cdot t(t) = 0 \qquad (3)$$

Equation (3) and Equation (1) must be fulfilled simultaneously for each point X of the envelope surface. Equation (3) establishes that the same vector X–P is normal to tangent vector t, while Equation (1) implies that the vector X–P is normal to n±b. Thus X–P, for a point satisfying equations (1) and (3), must be in the direction n–b, because n and b are orthogonal unit vectors so that (n–b)·(n+b)=0, i.e., $$X-P(t) = s(-n(t) \pm b(t)) \qquad (4)$$

This is the parametric equation of the two envelope surfaces of the ridge. The radial parameter is t and transverse parameter is s, with one ridge for +b(t) and the other for −b(t). Curves 683c of FIG. 42b will be crest curves if we take s>0 for both ridges (with s=0 for the crest curves) and they will be trough curves if s<0 (with s=0 for the trough curves in this case). More pertinently, $$X(t,s) = P(t) + s(-n(t) \pm b(t)) \qquad (5)$$

is the equation of the envelope surface as a function of the crest equation P(t), and its normal and binormal vectors. The parameter s extends to the value of s that at the bottom of the groove, where it meets the corresponding point on the next ridge.

The upshot of this differential-geometry proof is that each of the planes of FIG. 43 contributes thick lines 693 to the envelope surface of the curved V-groove. Thick lines 693 of FIG. 43 in fact represent the second term in Equation (5). If successive lines 693 cross as they issue from closely neighbouring points, then the resultant envelope surface may have ripples or even caustics (which are physically unrealisable). In the present invention, any such mathematical anomalies would be too far from the crest curve to be of relevance.

Figure 44:
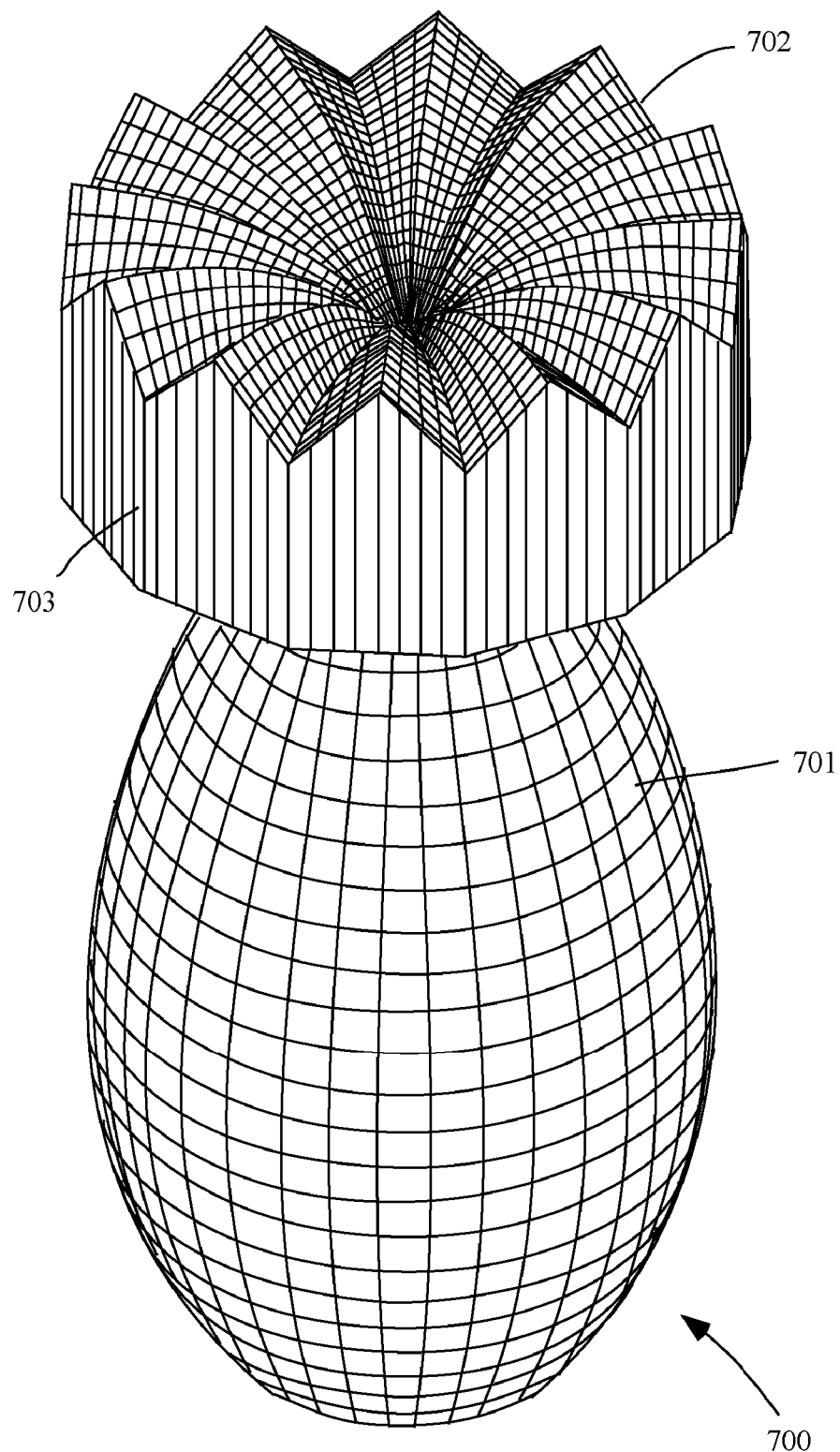
FIG. 44 is a perspective view of a virtual filament with a curved radial V-groove array on top according to the present invention.

FIG. 44 is a perspective view of virtual filament 700, comprising equiangular-spiral transfer section 701, radial V-grooves 702, and cylindrical sidewall 703. Only twelve V-grooves are shown, for the sake of clarity, but an actual device may have many more. The utility of such grooves is that they enable the designer to avoid the use of a coated reflector.

Figure 45:
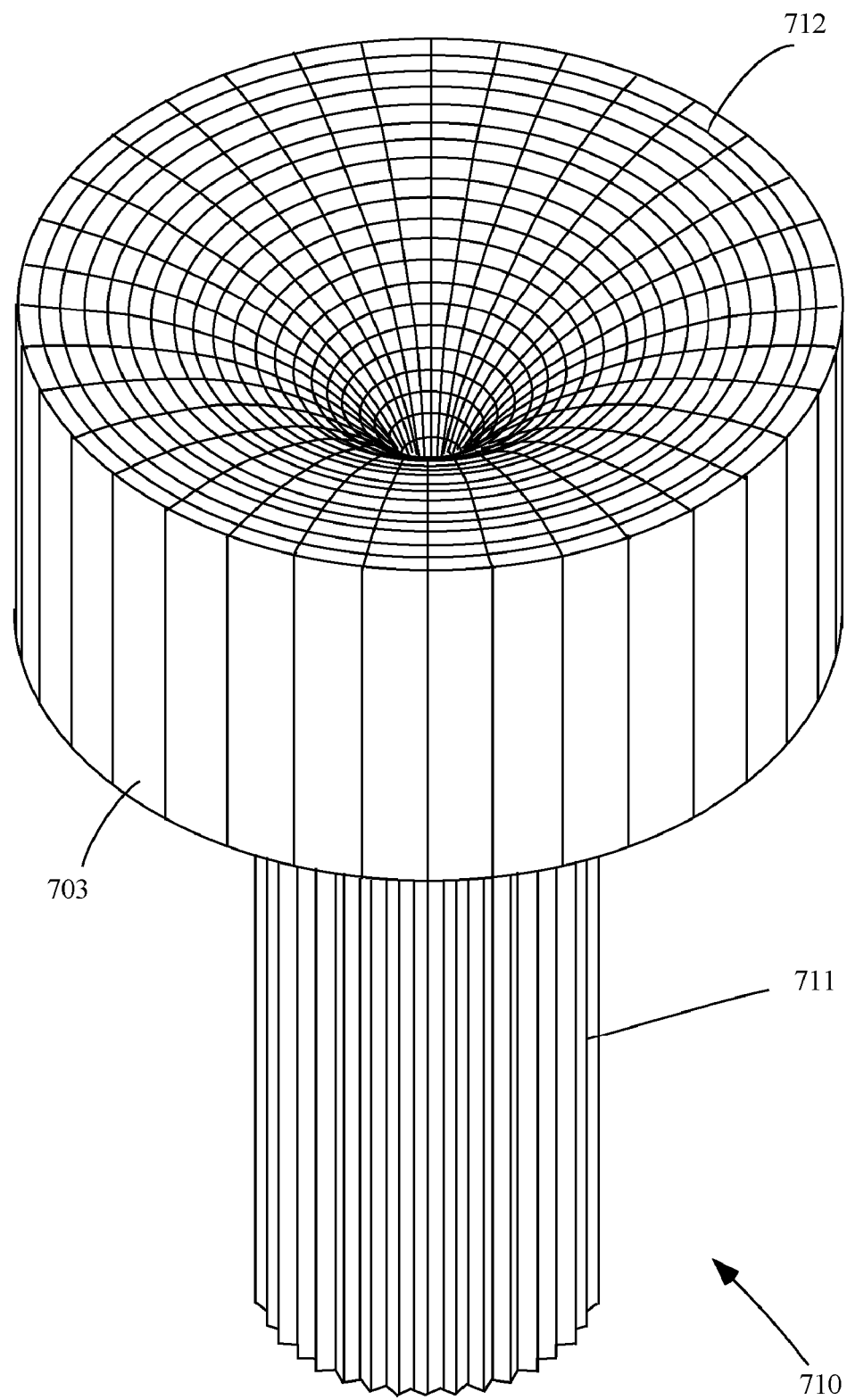
FIG. 45 is a perspective view of a virtual filament with a linear V-groove array on its transfer section according to the present invention.

FIG. 45 shows virtual filament 710, comprising transfer section 711 with longitudinal V-grooves, and ejector section 703. As shown in FIG. 45, V-grooves can also be used on the transfer section of the present invention, enabling a cylindrical shape to be used.

The discussion of FIG. 2 of U.S. patent application Ser. No. 10/461,557 touched on the function of color mixing, to make different wavelengths from chips 23, 24, and 25 have the same relative strengths throughout the light coming out of ejector section 12. This assures that viewers will see only the intended metameric hue and not any colors of the individual chips. Previously, rectangular mixing rods have been used to transform the round focal spot of an ellipsoidal lamp into a uniformly illuminated rectangle, typically in cinema projectors. Generally, polygonal mixing rods worked best with an even number of sides, particularly four and six. With color mixing for LEDs, however, such rods are inefficient because half of an LED's Lambertian emission will escape from the base of the rod.

The following preferred embodiments of the present invention remedy this deficit by proper shaping of its transfer section. This shaping enables polygonal cross-sections to be used in the present invention.

Figure 46:
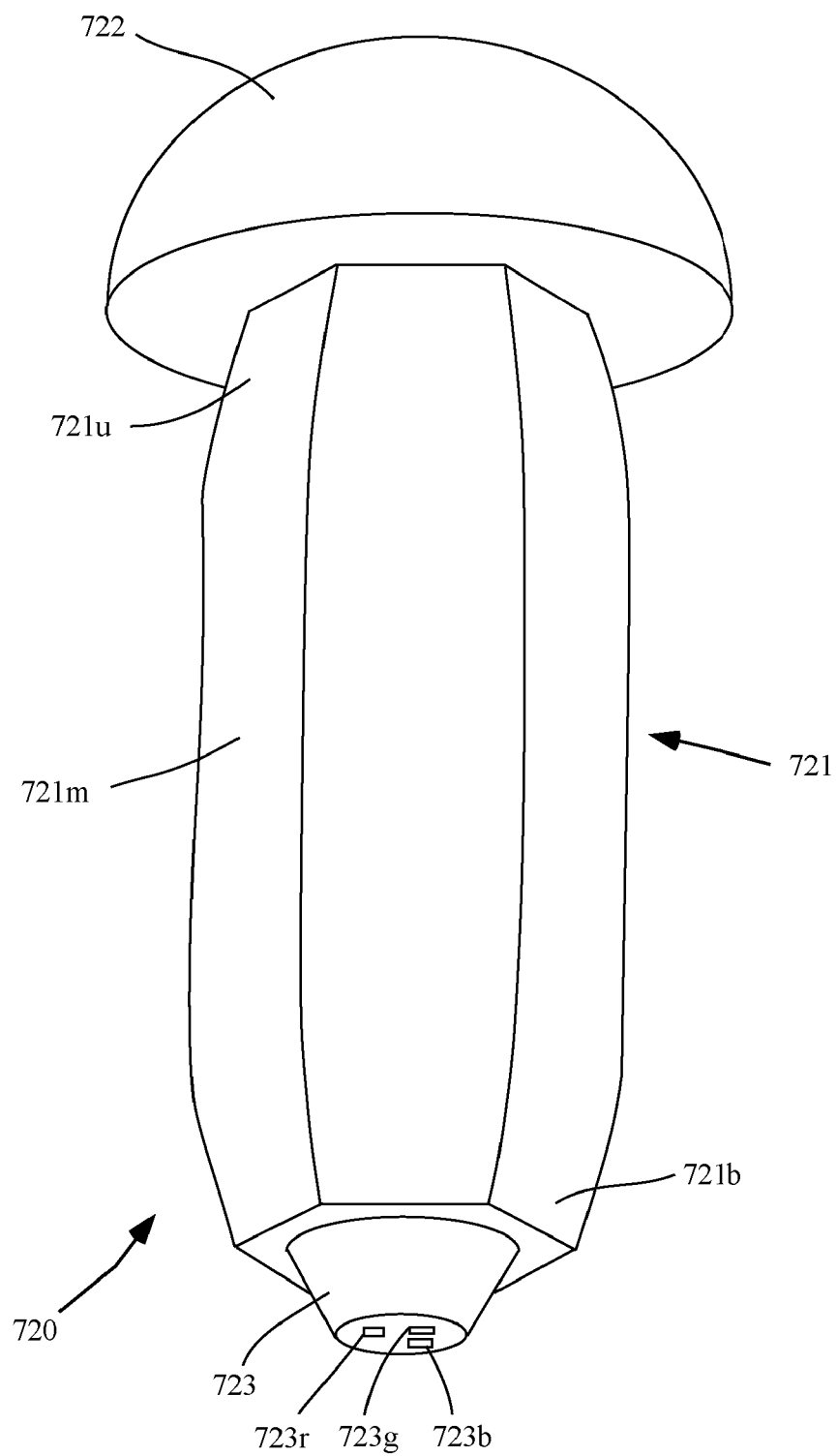
FIG. 46 is a perspective view of a six-sided barrel-shaped virtual filament according to the present invention.

FIG. 46 depicts virtual filament 720, comprising hexagonal transfer section 721 and hemispheric ejector section 722. Within package 723 are red LED chip 723r, green chip 723g, and blue chip 723b. Transfer section 721 comprises expanding bottom section 721b, mid-section 721m with constant cross-section, and contracting upper section 721u. The shape of sections 721b and 721u acts to prevent the escape of rays that a constant cross section would allow if it extended the entire length of transfer section 721. Similar to the grooves of FIG. 44 and FIG. 45, a polygonal transfer section would constitute a departure from complete rotational symmetry.

Figure 47A:
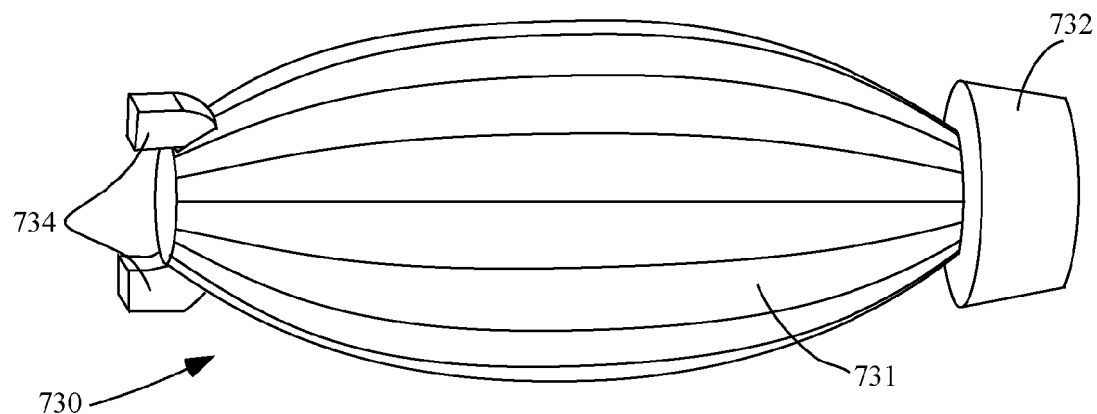
FIGS. 47a and 47b is a side and perspective view, respectively, of a sixteen-sided virtual filament according to the present invention.
Figure 47B:
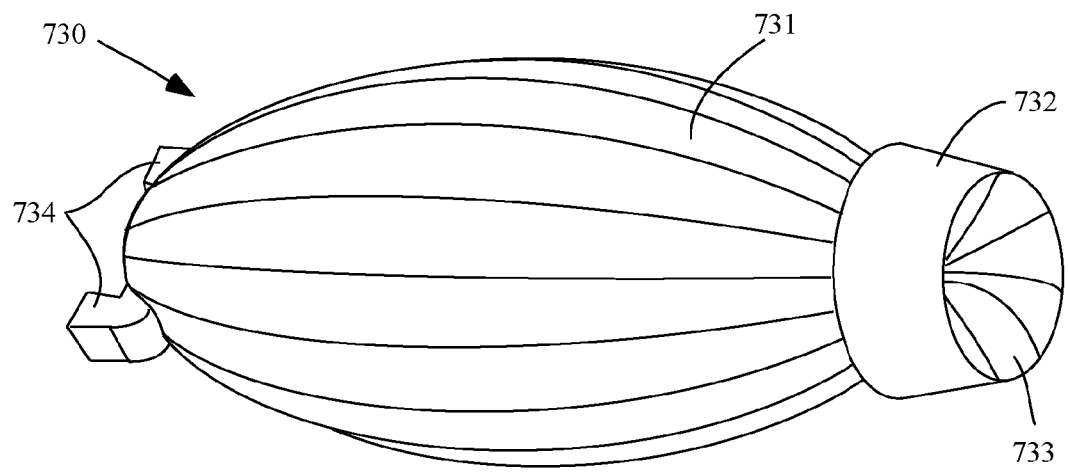
Figure 47C:
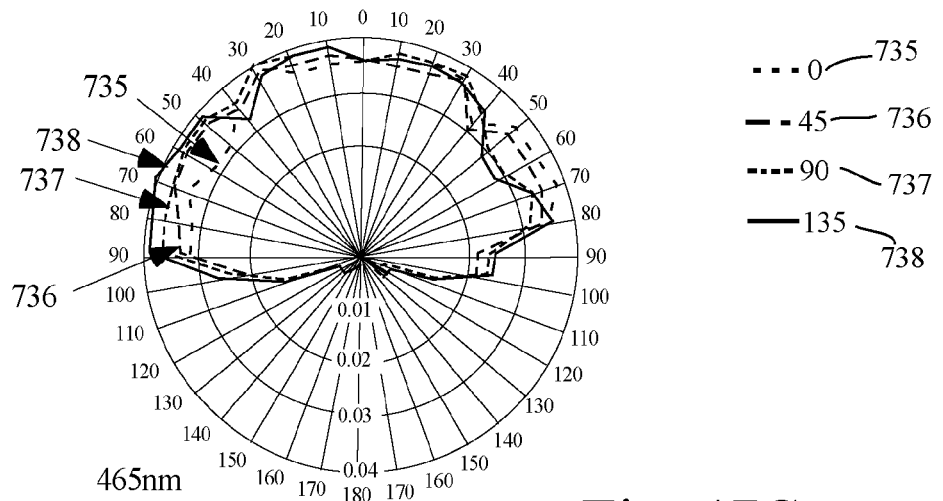
FIG. 47c-e show blue (465 nanometers), green (520 nanometers) and red (620 nanometers) emission patterns, respectively, of the embodiments of FIGS. 47a-b, at the various cylindrical azimuths.
Figure 47D:
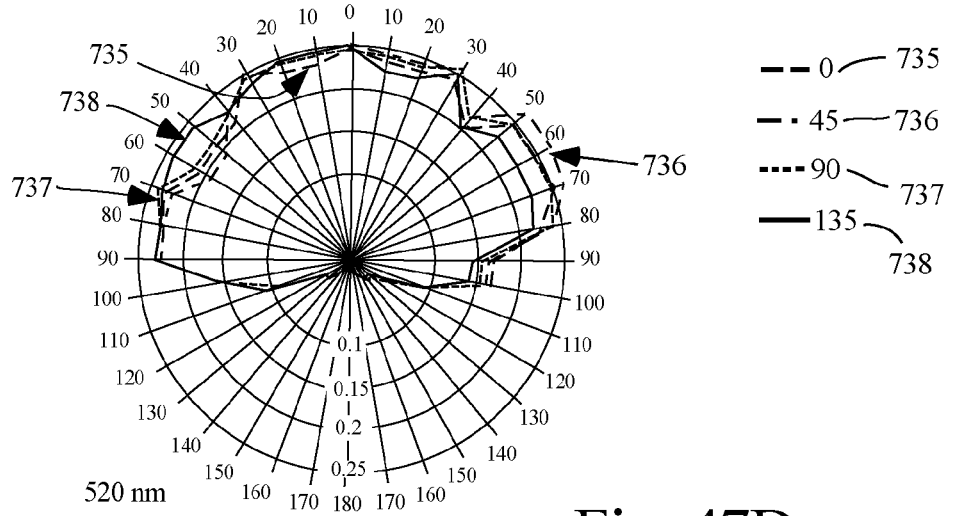
Figure 47E:
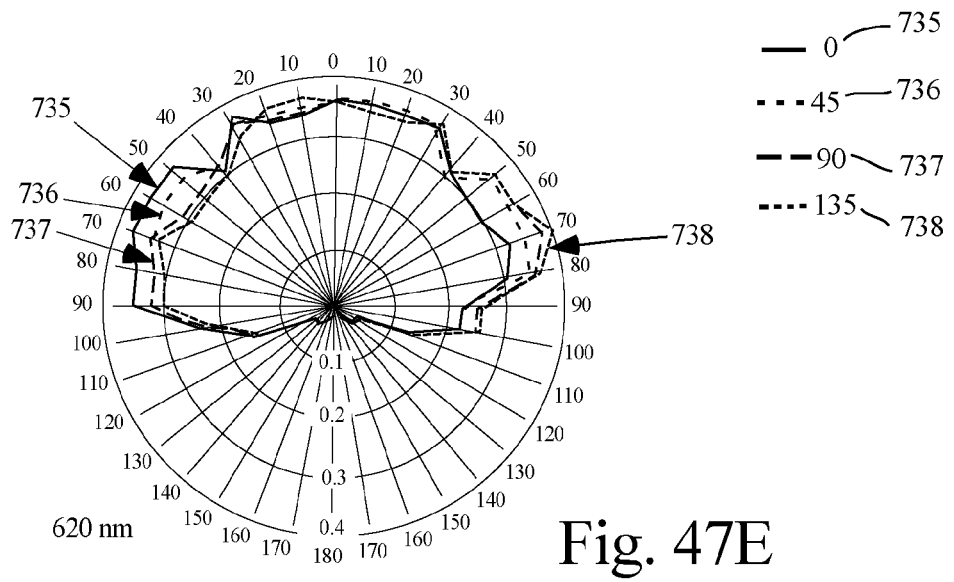

FIG. 47a is a side view of virtual filament 730 comprising sixteen-sided off-axis ellipsoid 731, conical ejector section 732, and mounting feet 734. FIG. 47b is a perspective view of the same preferred embodiment, also showing spline top surface 733. FIG. 47c shows the blue (465 nanometers) emission pattern of this preferred embodiment, at the various cylindrical azimuths, 0° azimuth indicated by reference numeral 735, 45° azimuth indicated by reference numeral 736, 90° azimuth indicated by reference numeral 737, and 135° azimuth indicated by reference numeral 738, and as indicated in the legend at upper right. FIG. 47d shows the green (520 nanometers) emission pattern of this preferred embodiment, at the various cylindrical azimuths 735-738 and as indicated in the legend at upper right. FIG. 47E shows the red (620 nanometers) emission pattern of this preferred embodiment, at the various cylindrical azimuths 735-738 and as indicated in the legend at upper right.

Figure 48A:
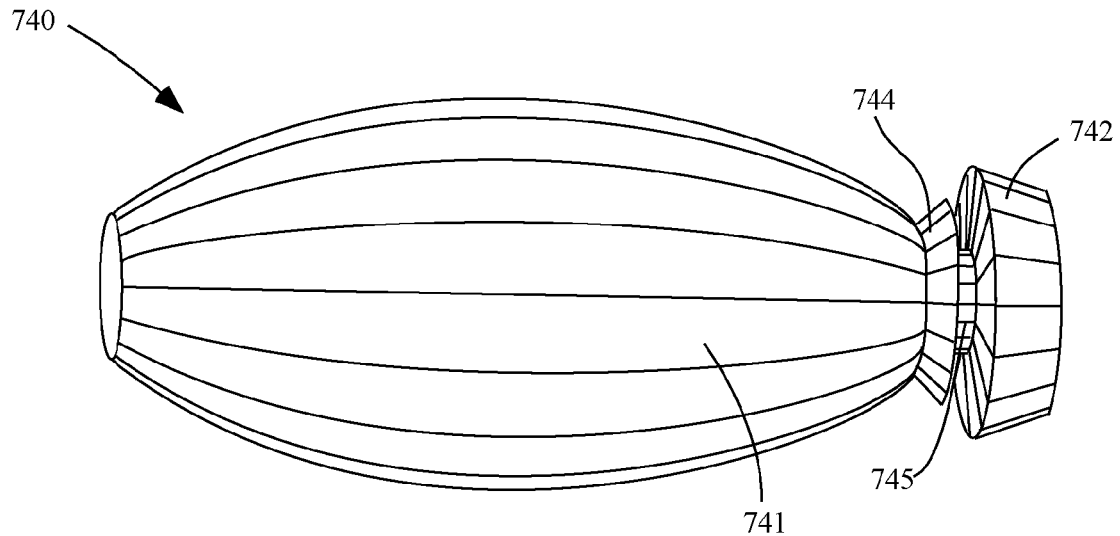
FIGS. 48a and 48b is a side and perspective view, respectively, of another sixteen-sided virtual filament, with a slotted ejector section according to the present invention.
Figure 48B:
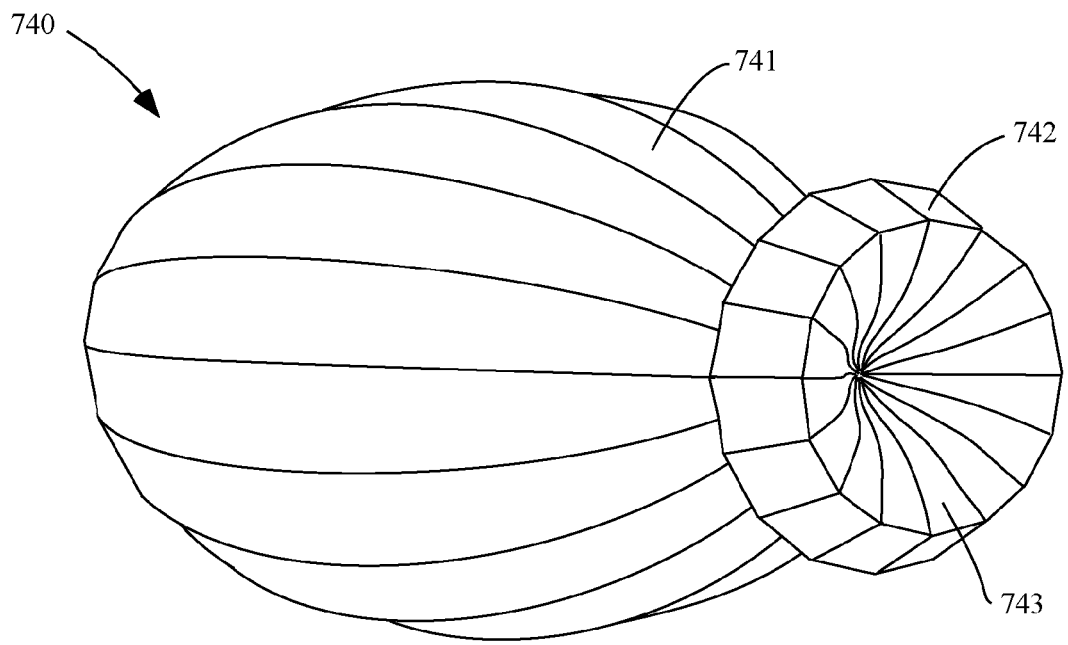
Figure 48C:
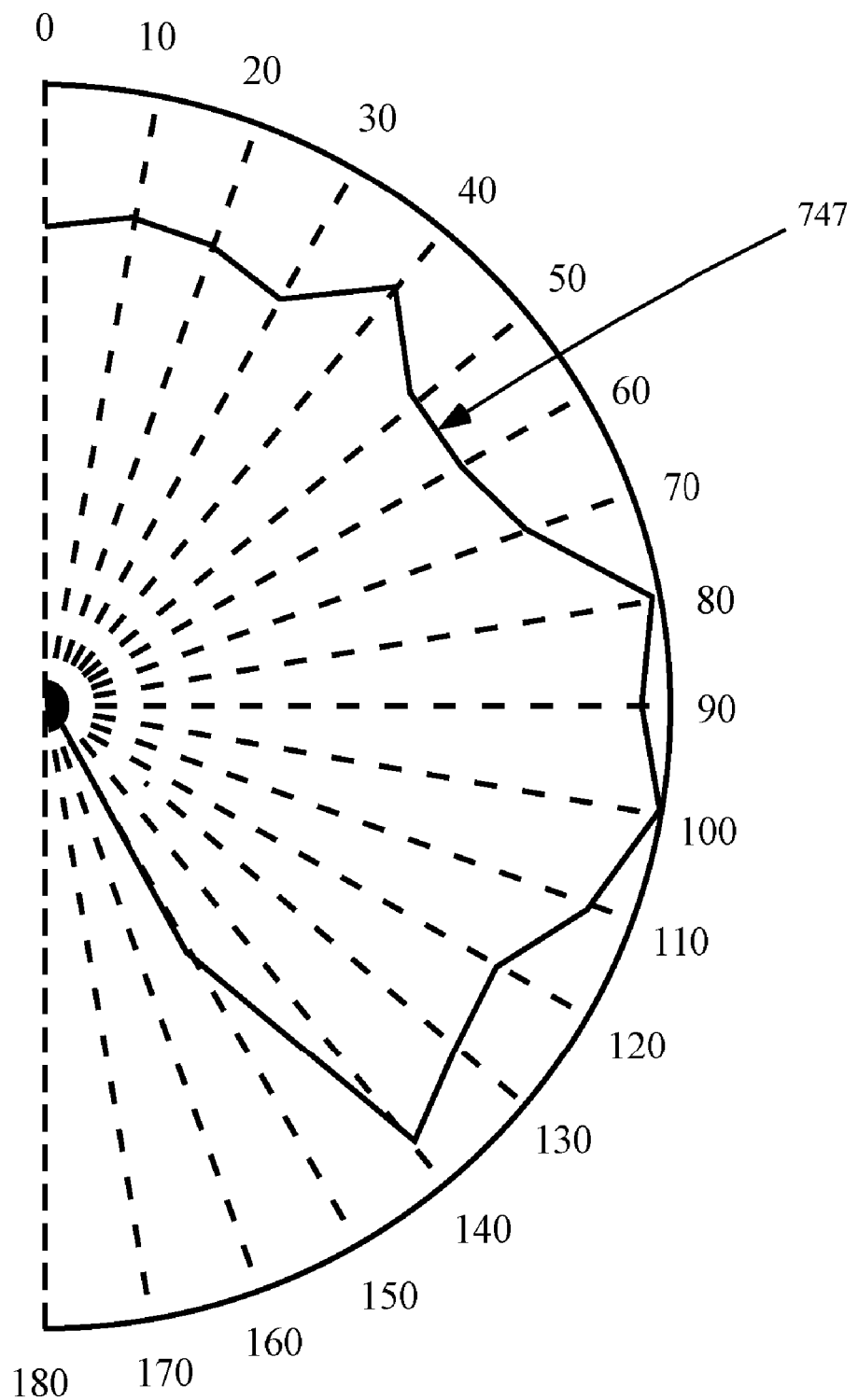

FIG. 48a is a side view of virtual filament 740 comprising sixteen-sided off-axis ellipsoid 741, conical ejector section 742, conical collar 744, and cylindrical connector 745. FIG. 48b is a perspective view of the same preferred embodiment 743. The purpose of the narrowing by collar 744 is to produce the 300° emission pattern 747 shown in FIG. 48c.

Figure 49A:
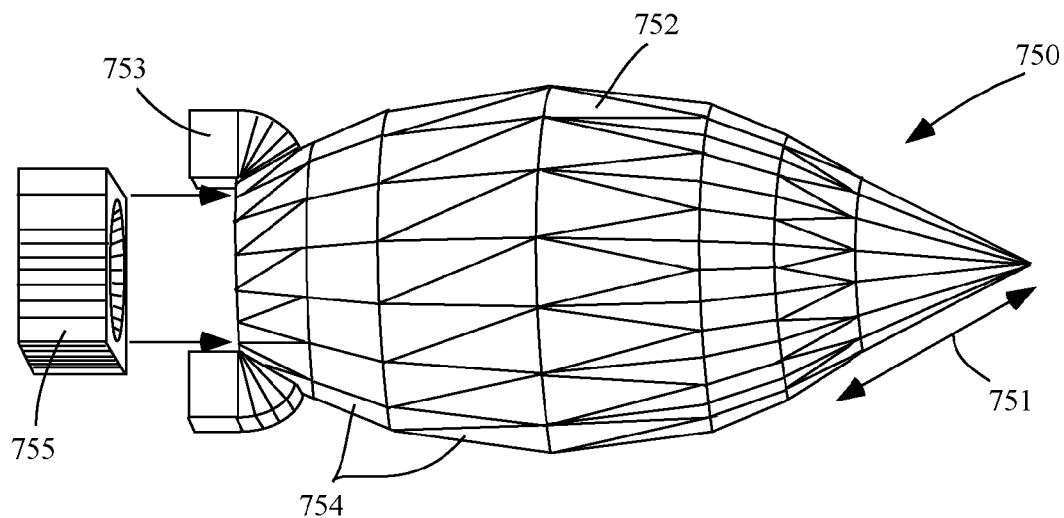
FIGS. 49a and 49b is a side and perspective view, respectively, of a faceted virtual filament that mixes the disparate wavelengths of a tricolor LED according to the present invention.

FIG. 49a is an exploded side view of faceted virtual filament 750 and tricolor LED package 755 being inserted into and optically coupled to the filament 750. Beyond polygonally-shaped transfer sections are more complex departures from circular symmetry. Virtual filament 750 comprises an output section spanned by arrow 751, transfer section 752, and mounting feet 753. Faceted virtual filament 750 is a single piece of plastic, such as acrylic, the surface of which is covered by planar facets 754. The two mounting feet 753 are designed to be proximate to the outer surfaces of LED package 755, to aid in alignment and bonding of virtual filament 750 to package 755. In one embodiment of the invention, adhesive is applied to the inner sidewalls of feet 753 for bonding to LED package 755. In this instance the inner sidewall of each leg 753 has a surface that is substantially parallel to the proximate edge surface of LED package 755. Optical coupling of the bottom of virtual filament 750 to the top surface of LED package 755 can be achieved by several means, such as use of optical adhesives, non-curing and curing optical gels (such as available from Nye Optical Products of Fairhaven, Ma) or index matching liquids (such as available from Cargille Laboratories of Cedar Grove, N.J.).

Figure 49B:
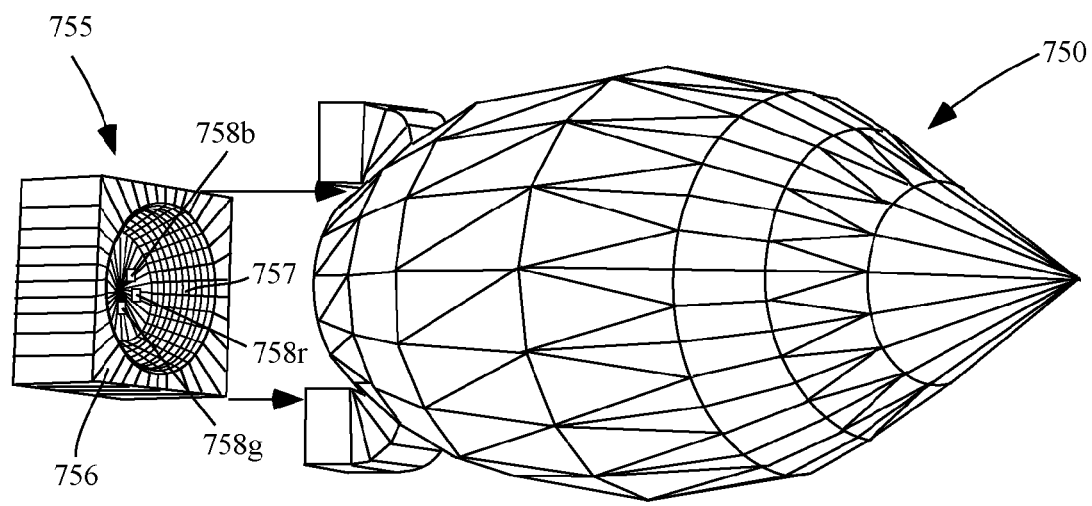

FIG. 49b is an exploded-part perspective view showing rectangular LED package 755 as removed from virtual filament 750. Within reflector cup 757 are red chip 758r, green chip 758g, and blue chip 758b. Cup 757 is filled with transparent epoxy (not shown) up to top 756 of package 755. Top 756 is optically bonded to the bottom of faceted virtual filament 750. This three-chip configuration is an example of the present invention incorporating multiple light sources. The three chips shown could also be amber, red, and infrared, suitable for illuminators compatible with night-vision devices, and other combinations.

Typically the base of a mixing virtual filament is larger than the emitting surface of the RGB LED illuminating it. In one preferred embodiment the inner diameter of the sixteen-sided polygonal shaped base of the mixing optic 750 is 20% larger than the diameter of the circular exit aperture of the RGB LED 755. In the case where the RGB LED 755 has a non-circular exit aperture, the base of the virtual filament is made sufficiently large to completely cover the exit aperture of the LED.

Figure 50:
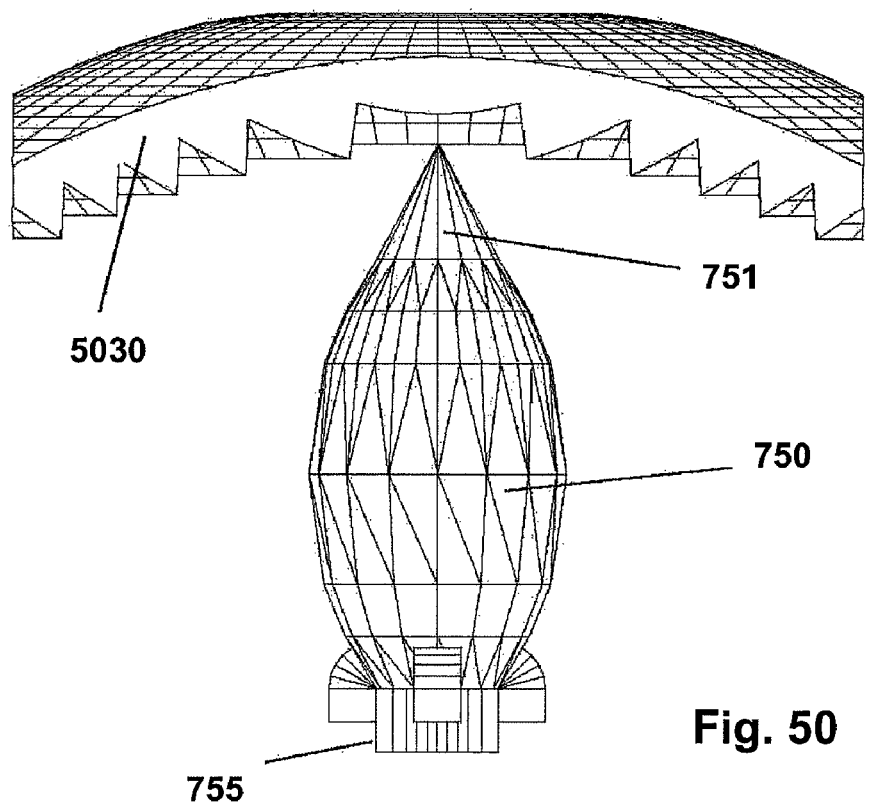
FIG. 50 depicts a side view of the faceted virtual filament of FIGS. 49a and 49b and a rectangularly cut collimating totally internally reflecting (TIR) lens focused on its output section.

FIG. 50 is a side view showing TIR lens 5030 with its focus at output section 751 of faceted virtual filament 750.

Figure 51:
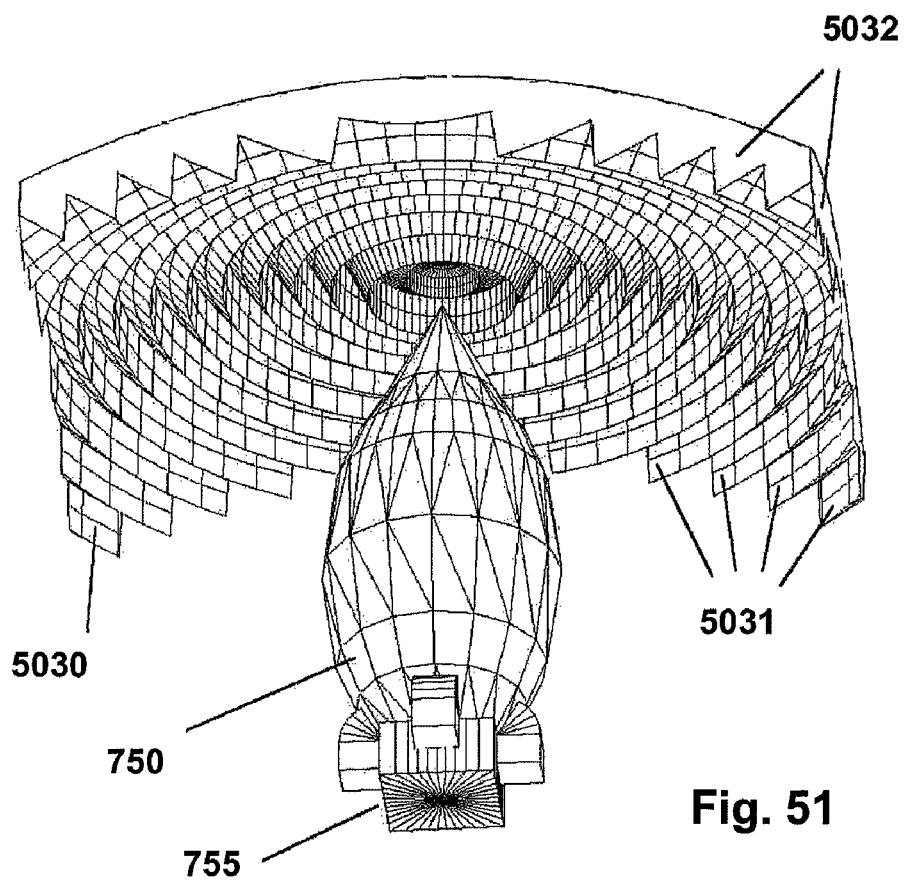
FIGS. 51-53 depicts perspective views of the faceted virtual filament and the rectangularly cut collimating TIR lens of FIG. 50 as seen from three different angles.

FIG. 51 is a view from below also showing faceted virtual filament 750, LED package 755, and TIR lens 5030, the latter comprising facets 5031 and flat cut-out planes 5032.

Figure 52:
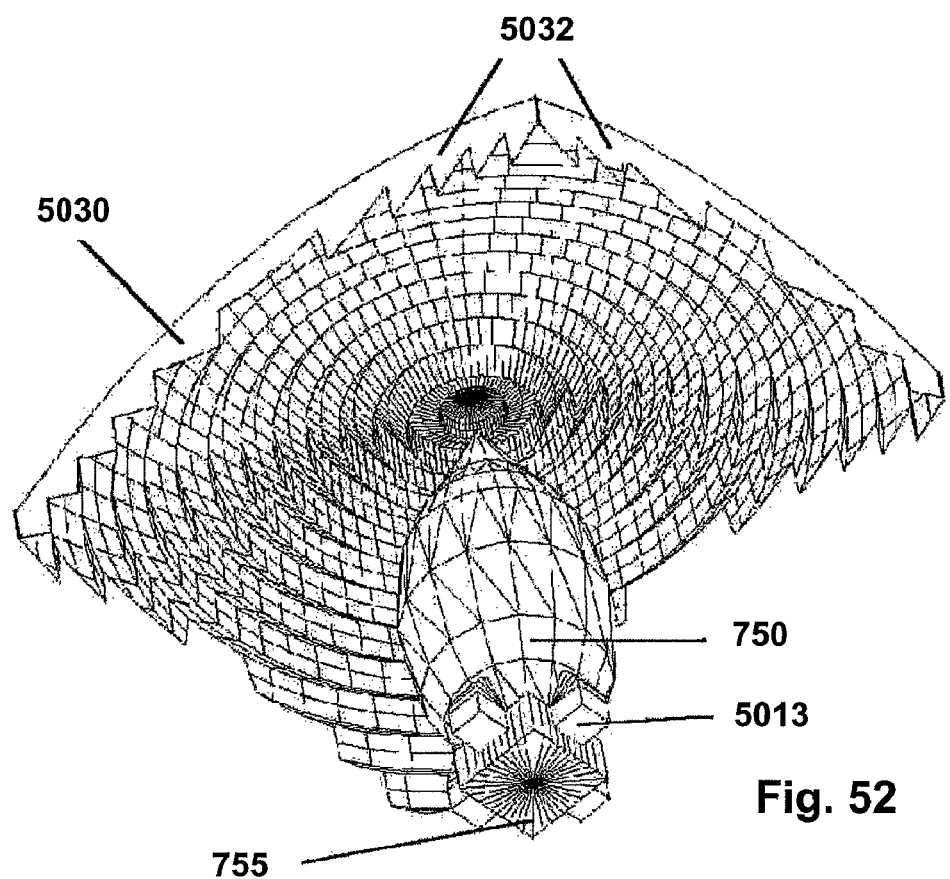

FIG. 52 shows the rectangular shape of TIR lens 5030, positioned above faceted virtual filament 750. Also shown is LED package 755 coupled to the bottom of virtual filament 750. There are four mounting feet 5013, somewhat smaller than the two shown in FIG. 49A, so as not to leak a greater amount of light from LED 755.

Figure 53:
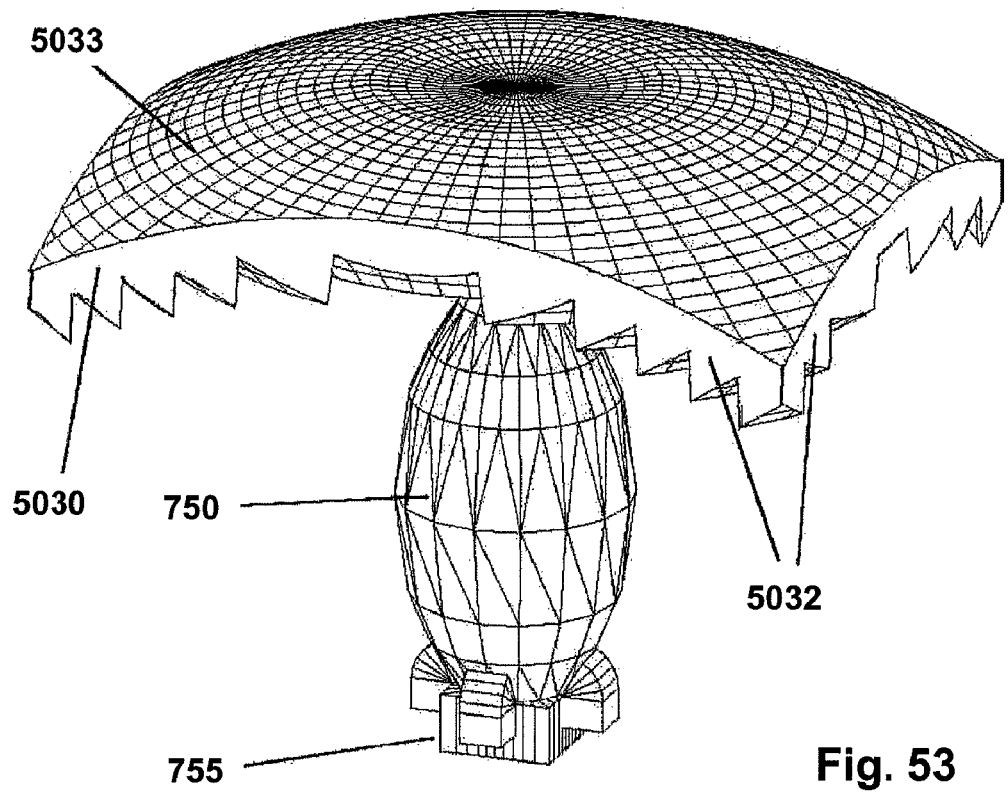

FIG. 53 is a perspective view from above showing virtual filament 750 and LED package 755. Rectangularly cut TIR lens 5030 has planar side walls 5032 and slightly indented upper surface 5033.

Figure 54:
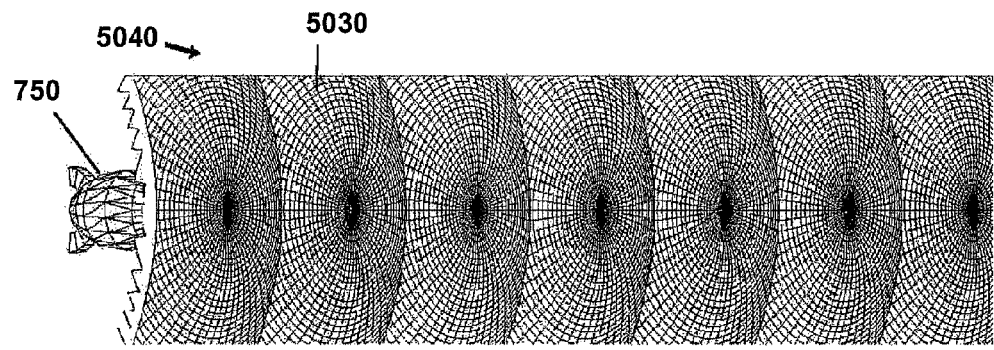
FIG. 54 shows a perspective view of a plurality of the faceted virtual filament and collimating TIR lenses of FIG. 50 cooperated in a row.

FIG. 54 shows lens 5040 comprising a row of rectangular TIR lenses 5030, and endmost virtual filament 750.

Figure 55:
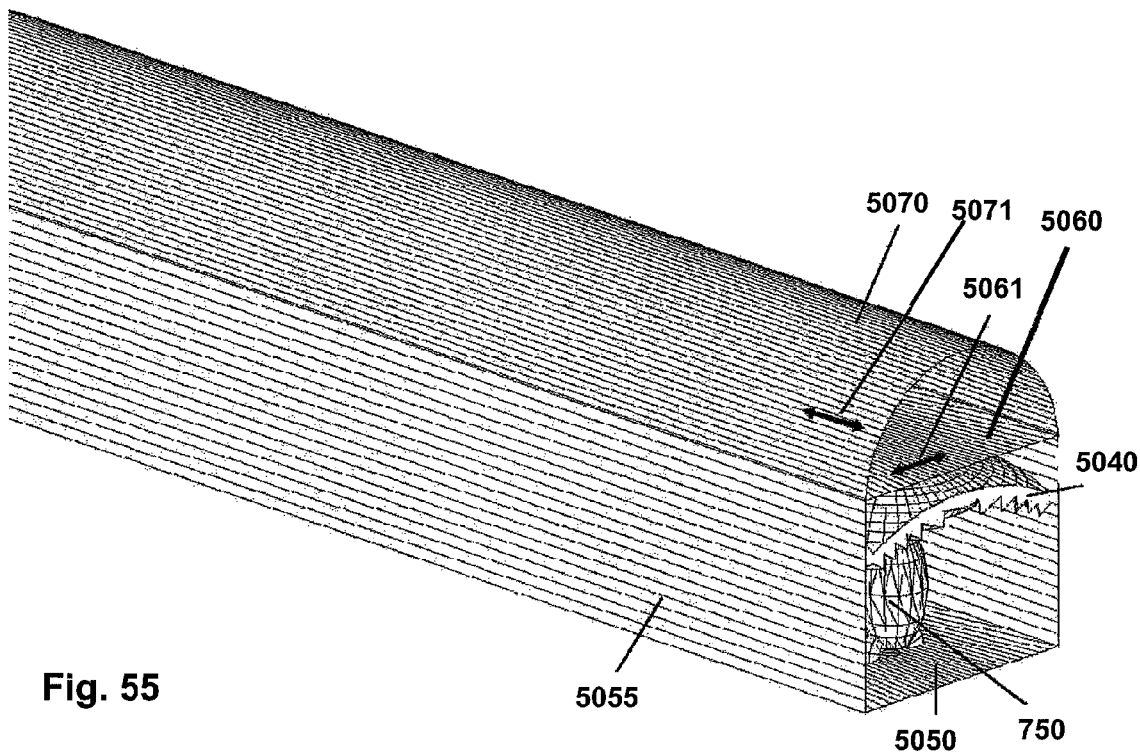
FIG. 55 shows a luminaire for a row shown in FIG. 54.

FIG. 55 shows endmost virtual filament 750 and circuit board 5050 upon which it is mounted. Sidewalls 5055 hold row lens 5040, flat holographic diffuser 5060 just above it, and outer cover 5070, which is optionally a holographic diffuser. Transverse arrow 5061 shows the long axis of the elliptical pattern of holographic diffuser 5060. Longitudinal arrow 5071 shows the long axis of the elliptical pattern of a holographic diffuser deployed on cover 5070. These diffusers cause a distant viewer to see a narrow line of light on cover 5070. It will have the color of the metameric resultant of the component colors mixed by faceted virtual filament 750.

Figure 56:
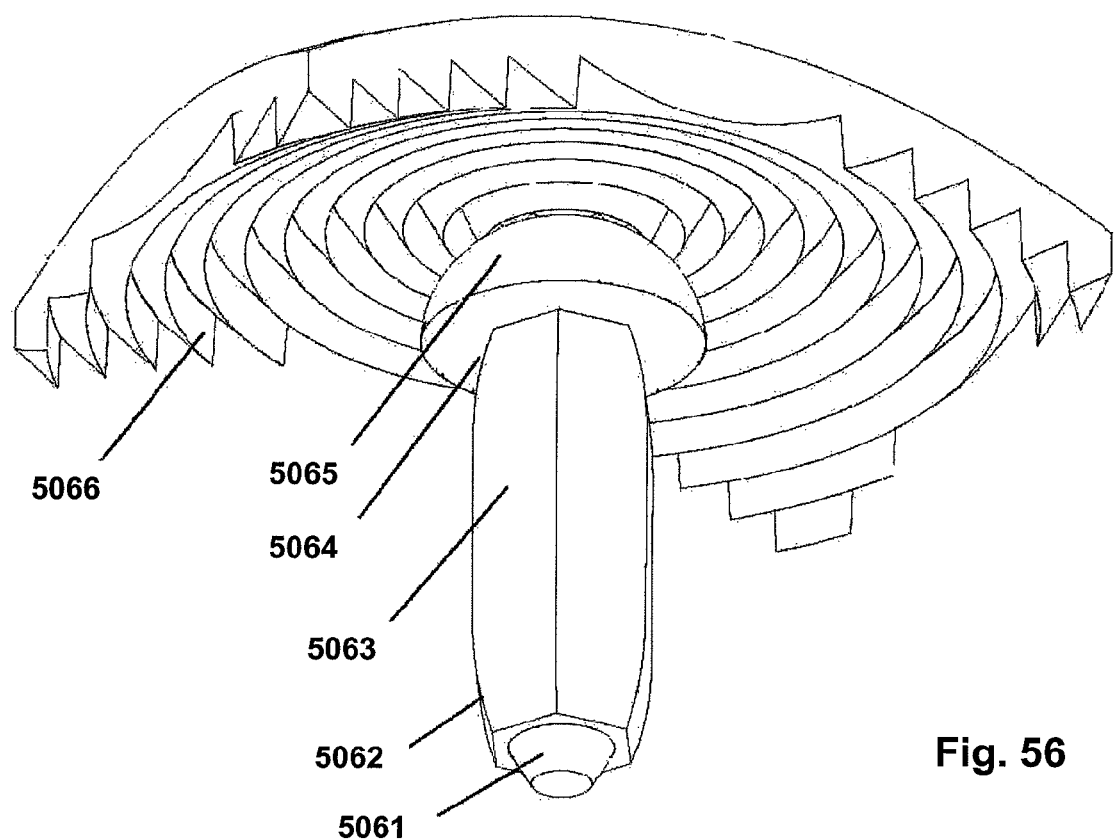
FIG. 56 shows an alternative virtual filament cooperated with a TIR lens.

FIG. 56 shows an alternative virtual filament configuration. Reflector cup 5061 is analogous to reflector cup 21 of FIG. 49B, in that it contains the system's light-emitting chips. Six-fold compound parabolic concentrator (CPC) section 5062 widens to hexagonal rod 5063. This CPC section can alternatively be a combination of an equiangular and a parabolic curve, hereinafter referred to as an equiangular-spiral concentrator, to avoid leakage. At the top of rod 5063, another parabolic (or equiangular spiral) section 5064 narrows the rod again. This widens the angular swath of light from the range of guided angles, about ±48°, to about the full ±90° of LED package 755. Other even-polygon cross sections for the rod can also be used. Connected to rod 5063 is hemispheric lens 5065, positioned just under rectangular TIR lens 5066 and delivering light thereinto. Sections 5062, 5063, 5064 and 5065 can, in some embodiments, be formed all of one piece of transparent plastic, such as acrylic or polycarbonate. Light received into section 5062 is mixed by section 5063 and emitted out section 5065 into collimating lens 5066.

At least some of the above described embodiments, when used with multiple LEDs, can well-mix different colors into a single calorimetric resultant. In other embodiments, however, a phosphor-conversion white LED could be used, or an array thereof. Still other embodiments include a generally spherical ejector section extending form a transfer section. A base of the transfer section can be optically bonded to an array of LEDs, such as an array of blue LEDs, in a cup reflector, rather than a multi-colored array. Additionally, the upper generally spherical ejector section, positioned distant from the array of LEDs, can be coated with a photostimulative component, such as a photostimulative phosphor, which in some embodiments can be similar in composition to that already in use in conventional white LEDs.

Figure 57A:
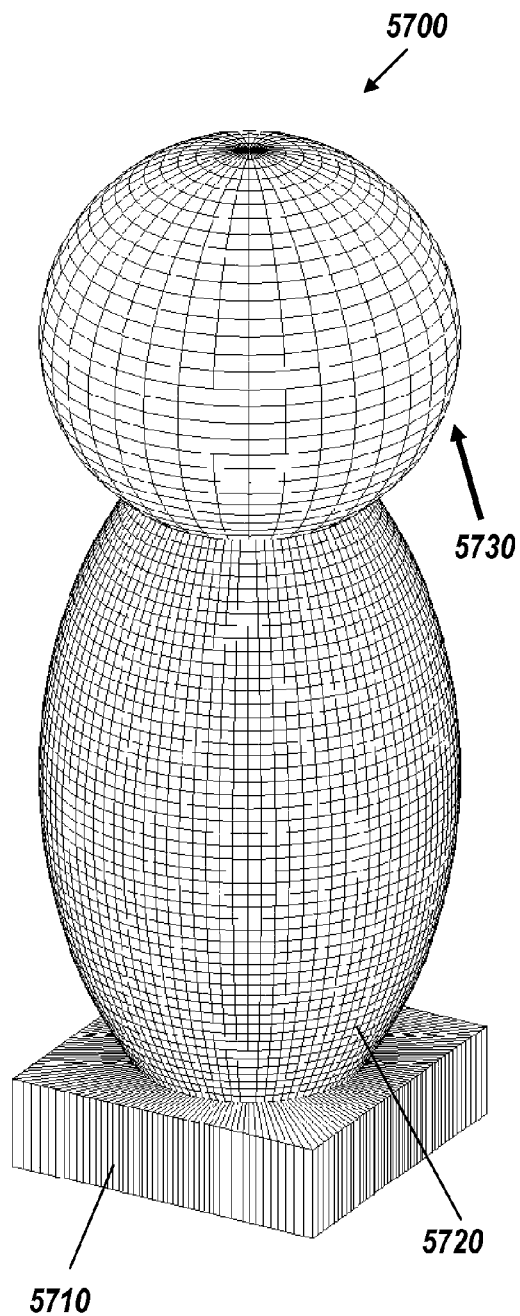
FIG. 57A show a virtual filament light source with a phosphor ball.

FIG. 57A shows an external perspective view of light source 5700 according to some embodiments, comprising LED package 5710, compound elliptical concentrator 5720, and upper ejector section that comprises a sphere or portion of a sphere 5730.

Figure 57B:
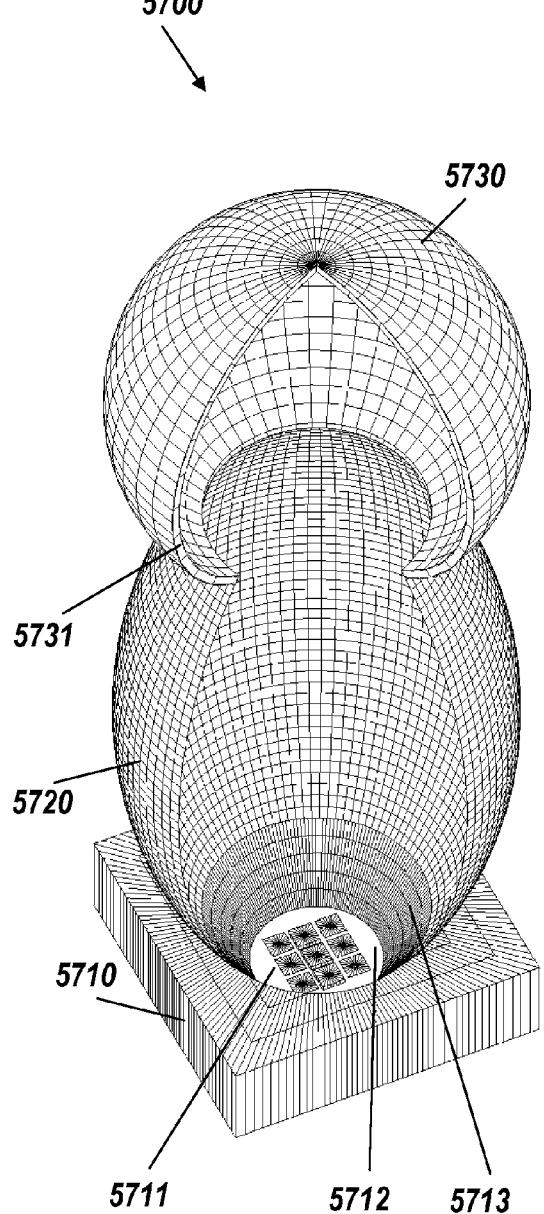
FIG. 57B shows a partially cut-away view of the virtual filament light source with the phosphor ball of FIG. 57A.

FIG. 57B shows a cutaway perspective view of the light source 5700 of FIG. 57A, further showing that LED package 5710 comprises an array of blue LEDs 5711, reflective surface 5712 surrounding the LEDs 5711, and conical reflector 5713. The top of reflector 5713 is generally even, in some implementations, with the transparent top surface (not shown) of package 5710, to which the bottom surface (not shown) of concentrator 5720 is optically bonded, and in some instances optically bonded to eliminate air gaps. Blue light from LEDs 5711 shines into concentrator 5720, where it is maintained through total internal reflection and transferred to spherical portion 5730. The blue light proceeds into sphere 5730, striking an external surface of the sphere 5730, upon which is placed phosphor coating 5731. Light source 5700 can thus be classified as a remote phosphor system.

With the phosphor incorporated on an exterior surface of the spherical or other ejector section the heat generated, due at least to Stokes losses, does not exceed the operating temperature of the ejector section, including ejector sections constructed of plastic and glass. In some instances, as demonstrated through actual testing, light having more than 5 Watts directed into an ejector section having an exterior layer of phosphor generates heat; however, this heat only results in a maximum temperature in the material of the operating device of less than 70° C., which is well below the operating temperature of plastics, including PMMA. Additionally, even higher Wattages can be handled by increasing the size and/or surface area of the ejector section.

Figure 58:
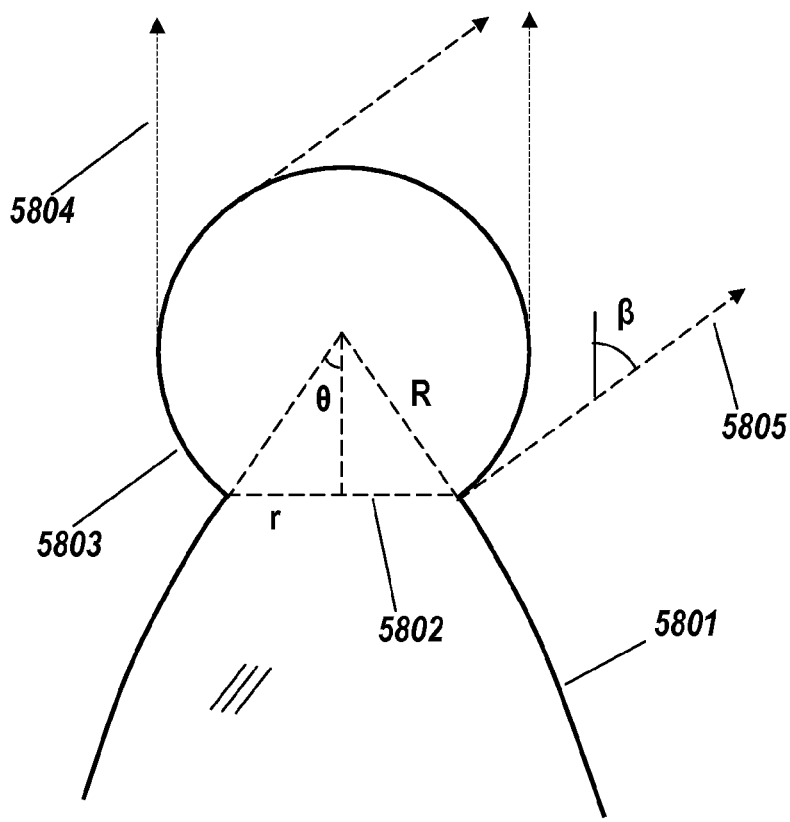
FIG. 58 shows a simplified block diagram depiction of a geometry of a phosphor ball.

The spherical deployment of the remote phosphor material increases its area relative to that of the exit aperture of concentrator 5720. FIG. 58 shows a simplified close-up diagram of a generic spherical phosphor configuration according to some embodiments, with the lower part of the profile of concentrator 5801 terminating at aperture 5802, of radius r. Radius r subtends the angle θ from the center of spherical surface 5803, of radius R, so that r=R sin θ, and the output area of the concentrator is $A_O = \pi r^2$. The remote phosphor (actually too thin to be visibly depicted in FIG. 58) coats the outside of spherical surface 5803, and thereby receives the light that concentrator 5801 sends through aperture 5802. One of the properties of the sphere, in accordance with at least some embodiments, is that an elemental Lambertian radiator on its inside surface will generate uniform irradiance on the rest of the inside surface, because the change in the viewing angle exactly compensates for the distance to the radiator from any viewpoint. Therefore if concentrator 5801 produces uniform illumination upon aperture 5802 then spherical surface 5803 will be uniformly illuminated as well. Reinforcing this uniformity is the fact that both the blue light scattered by the phosphor and the yellow light stimulated by its absorption will divide between outwards emission and return emission back into the concentrator. The ratio of this outward white emission to the blue light delivered by the concentrator is termed $P_T$. The fraction returned to concentrator 5801 is $(1-P_T)$. Much of this will be recovered by reflection off of the LEDs themselves (5711 in FIG. 57), as well as the material surrounding them (5712 in FIG. 57). The spherical phosphor acts to greatly increase $P_T$.

A flat remote phosphor across exit aperture 5802 will typically send somewhat more back into concentrator 5801 than outwards. A phosphor on the outside of spherical surface 5802 has strong back emission as well, but most of it shines elsewhere on the phosphor, acting as a kind of recycling. The fraction of this that goes back into aperture 5802 equals the ratio of exit area $A_O$ to phosphor sphere area $A_S$, as given by $$\frac{A_O}{A_P} = \frac{\sin^2 \vartheta}{2(1 + \cos \vartheta)^2}$$

In FIG. 58, this fraction is only about 11%, considerably less than the 50% of a hemisphere. Further, the increased area of surface 5803 over exit aperture 5802 causes the phosphor luminance to be reduced by this amount as well, but at least some of the benefits provide better spherical emission and increased efficiency.

FIG. 58 shows that a glowing phosphor on surface 5803 will have substantially the same intensity from the on-axis direction represented by rays 5804 to the off-axis angle β=90−θ, represented by rays 5805. At greater off-axis angles intensity falls off slowly, and only until nearly downward angles does it go under half. This is substantially similar to the nearly spherical emission of a conventional light bulb, enabling at least reasonable functional substitution. The small amount of radiation from the outside of surface 5803 that is re-entering concentrator 5801 from the outside will mostly pass through it, merely adding a gleam to its appearance.

The deployment of a remote phosphor on a spherical surface will also increase its emission efficiency $P_T$ over that of a flat one deployed on the concentrator exit plane. The $P_T$ of a flat remote phosphor is a complicated function of its thickness and the scattering coefficient of the phosphor layer, as well as the absorptivity, quantum efficiency, and Stokes' shift of the phosphor's photoluminescent component. The absorptivity is proportional to the concentration of the photoluminescent component and can thus be slightly altered, while the last two factors are generally fixed for given phosphor formulations.

This leaves layer thickness and scattering coefficient that can be tailored to a specific situation, but they too are constrained by the color-balance requirement that about one quarter of the output light be blue, with the rest converted to yellow. An additional parameter for at least some remote phosphor systems, according to some embodiments, is the fraction $P_T$ of the blue input that is output, as blue or yellow light, without recycling. For a typical flat remote phosphor that produces white light, this fraction is typically between about 0.15 and 0.3, which in most applications is impractically low. The phosphor ball can greatly increase this output fraction.

The light output of the phosphor ball is:

$$P_{TB} = \frac{P_T}{1 - \left(1 - \frac{A_O}{A_P}\right)(1 - P_T)} = \frac{A_P P_T}{A_O(1 - P_T) + A_P P_T}.$$

The light returned to the optic by the phosphor ball is:

$$P_{OB} = \frac{\frac{A_O}{A_P}(1 - P_T)}{1 - \left(1 - \frac{A_O}{A_P}\right)(1 - P_T)} = \frac{A_O(1 - P_T)}{A_O(1 - P_T) + A_P P_T}.$$

Figure 59:
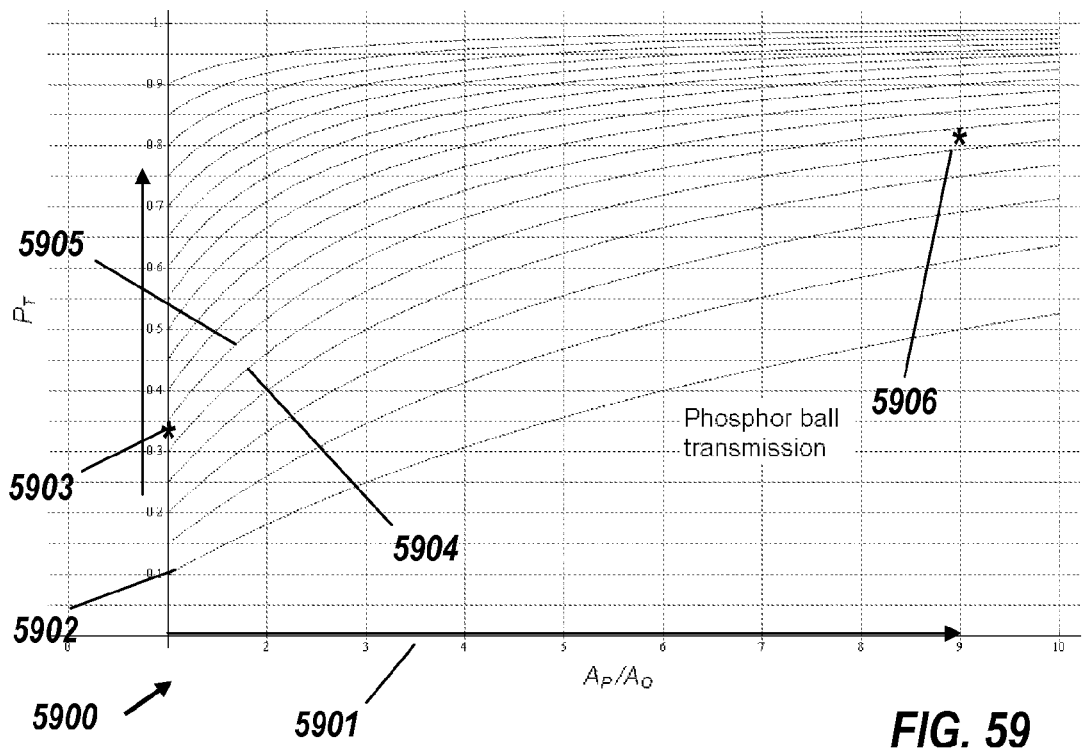
FIG. 59 is a graphical representation of the performance improvement due to the use of a phosphor ball, such as a phosphor ball of FIGS. 57A and/or 58B.

FIG. 59 shows graph 5900 with abscissa 5901 for the ratio of area $A_S$ over a flat one of area $A_P$, and ordinate 5902 for the $P_{TB}$ of the spherical remote phosphor given the $P_T$ value a flat phosphor would have across the exit aperture, with the same phosphor material and thickness. Operating point 5903 is at the ⅓ point, lying between curve 5904 for $P_T$=0.3 and 5905 for $P_T$=0.35. At an abscissa of 9, corresponding to the configuration of FIGS. 57A-B, moves the system to operating point 5906, for about $P_T$=80%. Of the 20% that is sent back down into the concentrator, generally over 70% will be returned by the LEDs and surrounding surfaces, making overall efficiency relatively high.

Numerous phosphor formulations can be utilized with the subject embodiments to achieve the yellow light emittance. For example, phosphors from the Internatix Corporation, with headquarters located in Fremont, Calif., produces a variety of families of phosphors for different LED lighting applications that can be utilized. For example, the SY phosphors from the Internatix Corporation can be used, at least in some applications, for general illumination, with the SY450-B phosphor formulation being applicable, at least, in targeting high-CRI applications. The EY4254 phosphors can used, in some implementations, for high brightness general illumination, and the OG450-30 phosphors can be used to target, at least, warm (i.e., lower) color temperature applications.

Mixtures of at least the above identified phosphors were applied and tested in the prototype development of the spherical remote phosphor light sources. In at least some of these implementations, the phosphors were each mixed with a clear UV-curable epoxy, UV15-7 from Master Bond, Inc., which has an index of refraction of 1.55. Each of the phosphors were mixed using a phosphor-to-epoxy, weight-to-weight ratio of about 15:100. The spheres were coated with the UV-curable slurry, with repeated very thin applications to control thickness. The various phosphor materials were tested for both color temperature and color-rendering index.

A further consideration in the selection of one or more phosphor materials and thicknesses, which goes beyond the usual specification of color temperature, is that the longest visual wavelengths (red) are the least efficient for a phosphor to generate, which is due to the Stokes loss in the photonic conversion of blue to the less energetic red, with the difference becoming heat. This Stokes loss is generally less for green light, which also has advantageously high efficacy. Although a phosphor with a greenish spectrum, such as EY4254, would by itself typically have inadequate color rendering, its light can be supplemented by that of a red LED, which can be included in the array 5712 of FIGS. 57A-B. Further, some embodiments provide for redundancy, mixing at least in the spherical portion or other extraction feature providing an output that is substantially uniform, and in some instances allows different thinning of the LEDs and allows changing color temperature by varying LEDs. Still further, the redundancy and/or mixing additionally allows one or more of the LEDs and/or one or more arrays of LEDs to operate as needed, to achieve a desired output illumination and still achieve high uniformity. Similarly, LEDs can be adjusted and/or ratios of LEDs can be adjusted to provide different color temperatures. For example, different colored LEDs can be activated in various cooperations to achieve a desired output, including for example having blue LEDs of varying wavelengths to achieve a desired output having differing wavelengths. Additionally, one or more LEDs can be operated independently or arrays of LEDs can be operated independently to allow varying intensities of the output, which in some applications allows for at least the appearance of dimming of a light source. The control of the intensity can be achieved, for example, by incorporating multiple dies that are activated independently, and/or varying current supplied to independent LEDs or banks of LEDs.

Figure 60A:
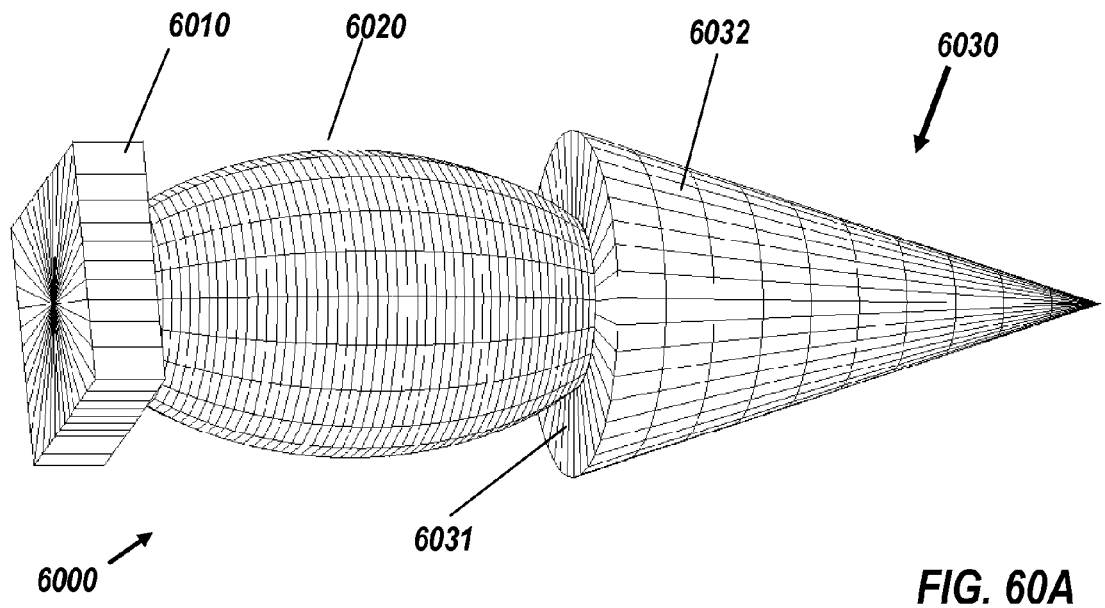
FIG. 60A is a perspective view of a virtual filament light source.

The generally spherical geometry of the surface to be phosphor-coated may exclude, in some instances, or make difficult some methods of applying the coating. For example, a particularly low-cost phosphor-coating application method can include a thin film, such as silicon or other suitable materials, with the phosphor embedded within the film and/or on the film, and the film is readily cut into pieces able to be adhered to a developable surface. Some alternative embodiments, however, can employ the thin film coated with a phosphor formulation. FIG. 60A, for example, discloses light source 6000, comprising basal LED package 6010, with an immersed array of blue LEDs (not shown, but can be similar to the array of LEDs 5711 as described above with reference to FIG. 57B), intermediate transfer section 6020 in the shape, for example, of a totally internally reflecting compound elliptical concentrator optically coupled to the LED package, and upper conical ejector section 6030 receiving blue light from the transfer section.

Conical ejector section 6030 is a solid body with an external surface comprising bottom surface 6031 and an external lateral surface 6032. Bottom surface, which in some implementations is generally planar, is positioned adjacent an exit surface of transfer section 6020, and lateral surface 6032 extends from a perimeter of the bottom surface 6031 to an apex of conical ejector section 6030. The conical ejector section 6030 has a height that is about n times its basal radius $R_B$ (here shown twice the radius of the exit surface of transfer section 6020), making its triangular laterally-projected area about equal to its circularly-axial projected area $\pi R_B^2$. This provides isotropic intensity over substantially an entire forward hemisphere of directions, when as the luminance of the conical surface is uniform. This uniform luminance in turn is assured by the relatively small area $A_e$ of the exit aperture of transfer section 6020 when compared to the lateral surface area $A_c$ of conical ejector section 6030. As much as half of the phosphor emission may be directed back into conical ejector section 6030, but little of that escapes into the transfer section 6020 (which escaped light does, however, have a 70% or more chance of being returned). As this light 'rattles around' inside conical ejector section 6030, it can aid in smoothing out illumination artifacts that section 6020 may have produced, for example, due to imperfections therein or in the light output of the LED array. In some embodiments, planar annular reflector 6033 is glued to the otherwise exposed planar bottom 6031 of ejector section 6030, with a highly reflective film for reflecting light back inside the conical ejector section 6030.

Figure 60B:
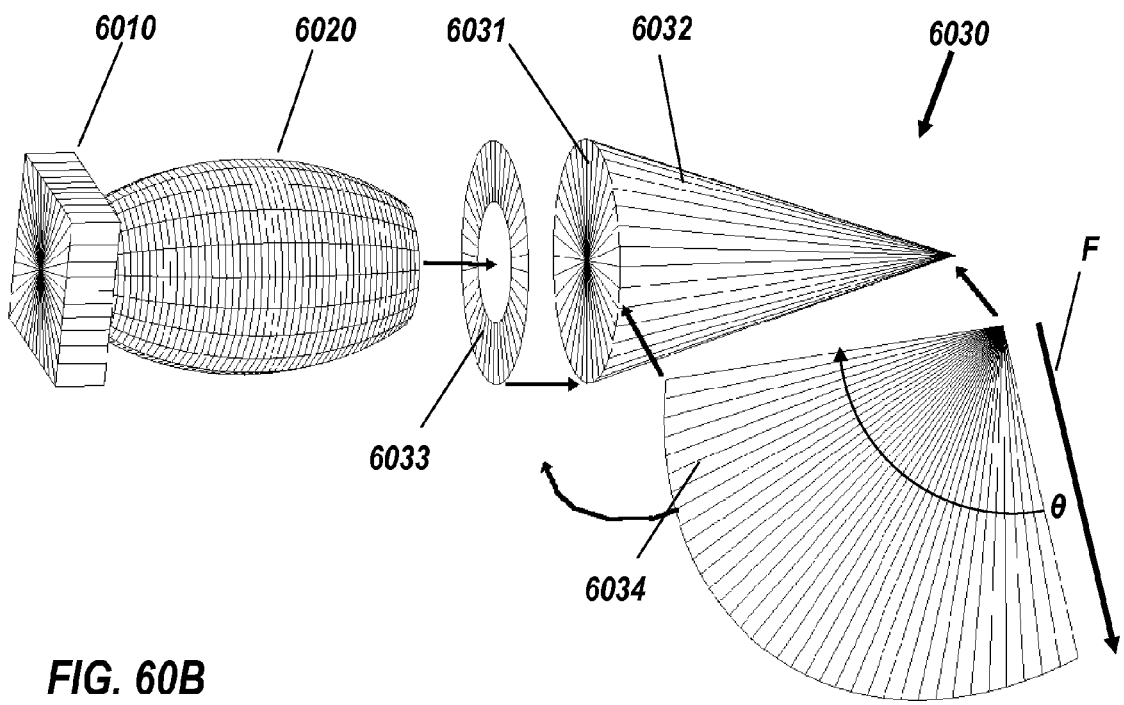
FIG. 60B is an exploded view of the virtual filament light source of FIG. 60A.

FIG. 60B is an exploded view of light source 6000 of FIG. 60A, showing LED package 6010 already optically cooperated, for example glued, with transfer section 6020. In turn the transfer section 6020 is optically cooperated, for example glued, to basal surface 6031 of ejector 6030. Annular reflector 6033 is secured, for example glued, with the basel surface 6031 around the transfer section 6020 at the interface with the basel surface 6031. Upon lateral conic surface 6032 is secured, for example glued, a flat phosphor-coated thin film 6034, shown cut out into the requisite portion of a circle, of radius $$F = R_B \sqrt{(1+\pi^2)} = 3.297 R_B.$$

Thin film 6034 wraps around the circumference $2\pi R_B$ of basal surface 6031. The interior angle of this in radians is then $$\theta = 2\pi/\sqrt{(1+\pi^2)} = 109.2°$$

as shown in FIG. 60B. Since this is less than a third of a circle, three such pieces can be cut out of a square, minimizing waste. In some embodiments, the film includes an adhesive-backed carrier that bears the phosphor.

The projected cross section of this shape of cone is substantially constant from 0 to 90°, then declines to zero at 162.35°. Thus the intensity will follow the same dependence upon angle.

Figure 61:
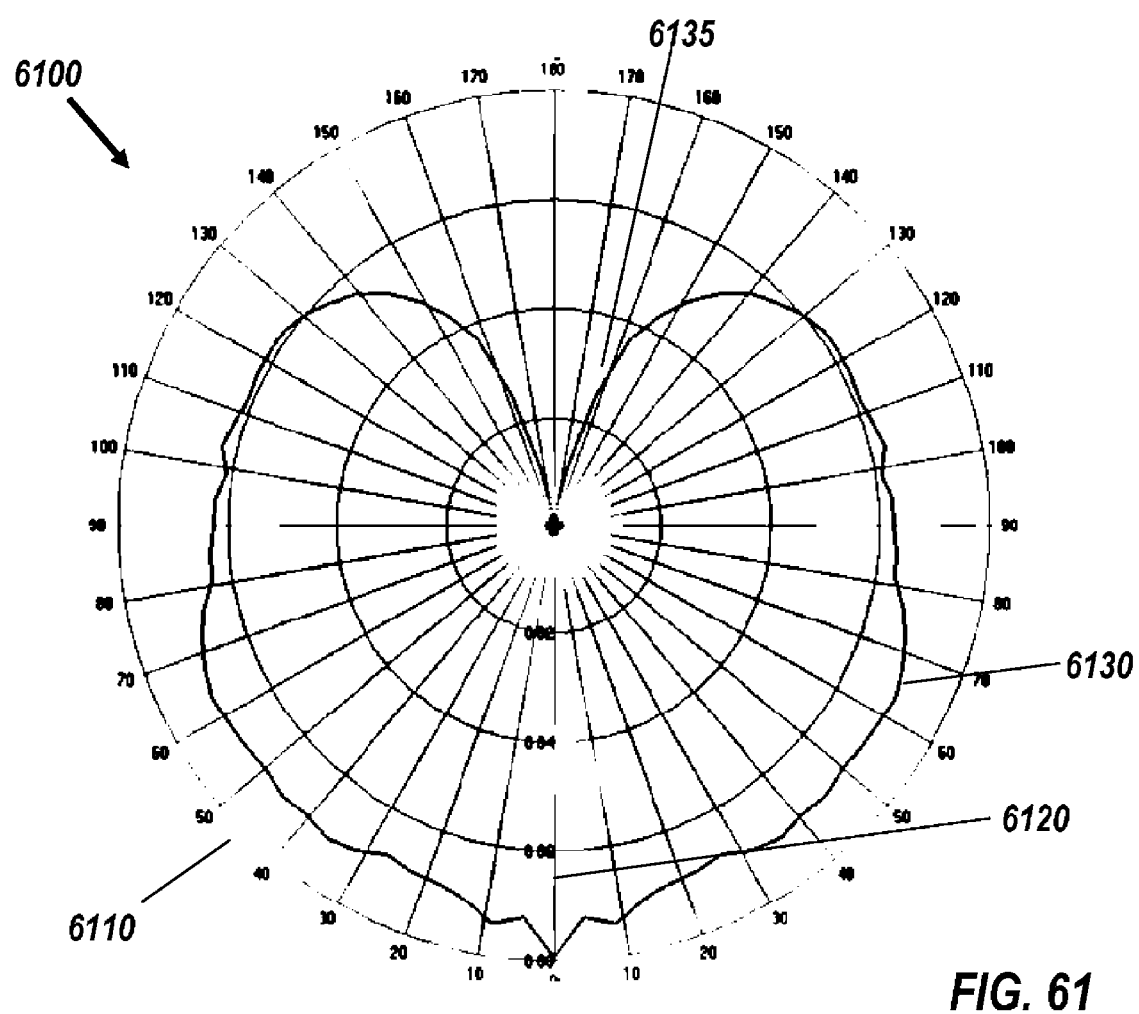
FIG. 61 is a graph of far-field intensity provided through the virtual filament light source of FIG. 60A.

Both the spherical and the conical versions of the remote-phosphor ejector section produce quite similar far-field intensity patterns, as illustrated by FIG. 61, showing radial plot 6100, comprising azimuthal off-axis angle scale 6110 and radial scale 6120. Relative intensity graph 6130 shows substantial uniformity all the way to shadow region 6135.

While the invention herein disclosed has been described by means of specific embodiments and applications thereof, numerous modifications and variations could be made thereto by those skilled in the art without departing from the scope of the invention as set forth in the claims.

What is claimed is:

1. An optical device for use in distributing radiant emissions, the optical device comprising:
    lower transfer section comprising an expanding portion and an contracting section, wherein the expanding portion expands with a progressively decreasing angle of expansion in a direction from an inlet end towards the contracting section, and the contracting section contracts with a progressively increasing angle of contraction in a direction from the expanding portion towards an outlet end; and
    an upper ejector section optically cooperated with the outlet end of the contracting section of the lower transfer section, said lower transfer section operable for placement of the inlet end upon a light emitter and operable to transfer radiant emission to said upper ejector section, said upper ejector section comprising a diffusive layer on the ejector section.

2. The optical device of claim 1, wherein the diffusive layer comprises a phosphor layer.

3. The optical device of claim 2, wherein said ejector section comprises a portion of a sphere.

4. The optical device of claim 3, further comprising:
a light emitter comprising a source of photostimulative blue light; and
wherein the photostimulative layer of said ejector section further comprises an external coating of a photostimulative phosphor.

5. The optical device of claim 4, wherein said light emitter further comprises a source of red light, and wherein said phosphor has a greenish spectrum deficient in red light.

6. The optical device of claim 3, further comprising:
a light source comprising one or more light emitting diodes (LED);
a power source coupled with the LED; and
a controller to control power supplied from the power source to the LEDs.

7. The optical device of claim 6, wherein the one or more LEDs comprise one or more blue LEDs.

8. The optical device of claim 7, wherein the one or more LEDs comprise one or more color LEDs other than blue.

9. The optical device of claim 1, wherein an external surface of the lower transfer section varies progressively in slope from an inlet end of the expanding portion operable for placement upon the light emitter to an outlet end of the contracting section connecting with the upper ejector section.

10. The optical device of claim 9, wherein said progressively varying external slope of the lower transfer section is formed by a curve convex from said inlet end to said outlet end.

11. The optical device of claim 9, wherein said ejector section comprises a portion of a sphere and said lower transfer section is shaped so that when a Lambertian illumination enters said inlet end, said lower transfer section produces a Lambertian illumination at a chordal plane of said sphere, which plane defines said outlet end of said contracting section.

12. The optical device of claim 9, wherein the lower transfer section is a solid, transparent body and is operable to transfer radiant emission from said light emitter to said upper ejector section through total internal reflection.

13. An optical device for use in distributing radiant emission, the optical device comprising:
a transfer section first portion optically configured to receive radiant emission at an inlet end and expanding from the inlet end to an outlet end;
a transfer section second portion optically configured to receive the radiant emission from the outlet end of the transfer section first portion at an inlet end and contracting from the inlet end to an outlet end;
wherein the transfer section is configured to produce a Lambertian light distribution at the transfer section second portion outlet end from a Lambertian light distribution at the transfer section first portion inlet end; and
an ejector section situated adjacent and optically coupled with the transfer section second portion outlet end, said transfer section configured to transfer the radiant emission to said ejector section, said ejector section comprising a spherical portion.

14. An optical device for use in distributing radiant emission, the optical device comprising:
a transfer section first portion optically configured to receive radiant emission at an inlet end and expanding from the inlet end to an outlet end;
a transfer section second portion optically configured to receive the radiant emission from the outlet end of the transfer section first portion at an inlet end and contracting from the inlet end to an outlet end;
wherein the transfer section is configured to produce a Lambertian light distribution at the transfer section second portion outlet end from a Lambertian light distribution at the transfer section first portion inlet end; and
an ejector section situated adjacent and optically coupled with the transfer section second portion outlet end, said transfer section configured to transfer the radiant emission to said ejector section, said ejector section comprising a cone extending from an interface of the transfer section and the ejector section.

15. An optical device for use in distributing radiant emissions, the optical device comprising:
a lower transfer section comprising an inlet end operable for placement upon a light emitter, an expanding portion expanding away from said inlet end and a contracting section contracting away from said expanding portion to an outlet end; and
an upper ejector section extending upward from said outlet end of said contracting portion and optically cooperated with the expanding portion of the lower transfer section, said lower transfer section operable to transfer radiant emission from said light emitter to said upper ejector section, said upper ejector section comprising a diffusive layer extending about the ejector section.

16. The optical device of claim 15, wherein said ejector section comprises a portion of a sphere.

17. The optical device of claim 15, further comprising:
a light source comprising one or more light emitting diodes (LED);
a power source coupled with the LED; and
a controller to control power supplied from the power source to the LEDs.

18. The optical device of claim 17, wherein the one or more LEDs comprise one or more blue LEDs.

19. The optical device of claim 18, wherein the one or more LEDs comprise one or more color LEDs other than blue.

20. The optical device of claim 15, wherein said ejector section comprises a conical ejector section comprising a convex external lateral surface.

* * * * *